US012242192B2

(12) United States Patent
Yamamoto et al.

(10) Patent No.: US 12,242,192 B2
(45) **Date of Patent: *Mar. 4, 2025**

(54) PHOTOSENSITIVE RESIN COMPOSITION, METHOD FOR PRODUCING THE SAME, RESIST FILM, PATTERN FORMING METHOD, AND METHOD FOR MANUFACTURING ELECTRONIC DEVICE

(71) Applicant: FUJIFILM Corporation, Tokyo (JP)

(72) Inventors: Kei Yamamoto, Shizuoka (JP); Yasufumi Oishi, Shizuoka (JP); Naohiro Tango, Shizuoka (JP); Hidenori Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 804 days.

This patent is subject to a terminal disclaimer.

(21) Appl. No.: 17/031,067

(22) Filed: Sep. 24, 2020

(65) Prior Publication Data

US 2021/0011378 A1 Jan. 14, 2021

Related U.S. Application Data

(63) Continuation of application No. PCT/JP2019/011492, filed on Mar. 19, 2019.

(30) Foreign Application Priority Data

Mar. 26, 2018 (JP) ................................ 2018-058907

(51) Int. Cl.

| | |
|---|---|
| ***G03F 7/027*** | (2006.01) |
| ***C08L 33/06*** | (2006.01) |
| ***C08L 33/14*** | (2006.01) |
| ***G03F 7/004*** | (2006.01) |
| ***G03F 7/32*** | (2006.01) |
| *G03F 7/20* | (2006.01) |

(52) U.S. Cl.

CPC ............ *G03F 7/027* (2013.01); *C08L 33/066* (2013.01); *C08L 33/14* (2013.01); *G03F 7/0045* (2013.01); *G03F 7/2004* (2013.01); *G03F 7/32* (2013.01)

(58) Field of Classification Search

None

See application file for complete search history.

(56) References Cited

U.S. PATENT DOCUMENTS

| | | | | | |
|---|---|---|---|---|---|
| 5,525,315 | A | 6/1996 | Burke | | |
| 5,962,183 | A | 10/1999 | Rahman et al. | | |
| 2005/0100815 | A1 | 5/2005 | Watanabe et al. | | |
| 2007/0026343 | A1* | 2/2007 | Tarutani | G03F 7/0382 | 430/270.1 |
| 2007/0134588 | A1* | 6/2007 | Kanda | G03F 7/0758 | 430/270.1 |
| 2007/0172761 | A1* | 7/2007 | Takahashi | G03F 7/38 | 430/270.1 |
| 2008/0305429 | A1* | 12/2008 | Saegusa | G03F 7/0397 | 430/322 |
| 2011/0236828 | A1* | 9/2011 | Hirano | C08F 24/00 | 430/325 |
| 2013/0136900 | A1* | 5/2013 | Shibuya | G03F 7/2041 | 428/174 |
| 2014/0023968 | A1* | 1/2014 | Nakashima | G03F 7/2041 | 430/325 |
| 2014/0287363 | A1* | 9/2014 | Shibuya | G03F 7/20 | 430/285.1 |
| 2015/0140482 | A1* | 5/2015 | Yamanaka | G03F 7/70466 | 430/312 |
| 2015/0147696 | A1* | 5/2015 | Eguchi | C08F 22/04 | 526/257 |
| 2015/0248054 | A1* | 9/2015 | Matsuda | G03F 7/325 | 430/311 |
| 2016/0011517 | A1 | 1/2016 | Takizawa et al. | | |
| 2016/0033869 | A1* | 2/2016 | Hustad | G03F 7/38 | 438/761 |
| 2017/0090293 | A1* | 3/2017 | Nakata | B01D 71/40 | |
| 2017/0123318 | A1* | 5/2017 | Kanda | G03F 7/30 | |
| 2018/0017865 | A1 | 1/2018 | Mochizuki et al. | | |
| 2018/0267404 | A1 | 9/2018 | Kaneko et al. | | |
| 2021/0271162 | A1* | 9/2021 | Ou | C08F 220/1818 | |

FOREIGN PATENT DOCUMENTS

| | | | |
|---|---|---|---|
| CN | 1202913 | A | 12/1998 |
| EP | 0 863 925 | A1 | 9/1998 |
| JP | 2006-030603 | A | 2/2006 |

(Continued)

OTHER PUBLICATIONS

Office Action dated Aug. 24, 2022 from the Taiwanese Intellectual Property Office in TW Application No. 108109940.

Communication dated May 25, 2021, issued by the Japanese Patent Office in application No. 2020-510747.

International Search Report dated Jun. 4, 2019 from the International Searching Authority in International Application No. PCT/JP2019/011492.

Written Opinion dated Jun. 4, 2019 from the International Bureau in International Application No. PCT/JP2019/011492.

(Continued)

*Primary Examiner* — Martin J Angebranndt

(74) *Attorney, Agent, or Firm* — Sughrue Mion, PLLC

(57) ABSTRACT

A photosensitive resin composition including an ethylenically unsaturated compound, a resin having a polarity that increases by the action of an acid, and metal atoms, in which a total content of the metal atoms is from 1 ppt to 30 ppb with respect to a total mass of the photosensitive resin composition, and a content of the ethylenically unsaturated compound is from 0.0001% by mass to 1% by mass with respect to the total mass of the photosensitive resin composition, and a method for producing the same; and a resist film, a pattern forming method, and a method for manufacturing an electronic device, each of which uses the photosensitive resin composition.

13 Claims, No Drawings

(56) References Cited

FOREIGN PATENT DOCUMENTS

| | | | | | |
|---|---|---|---|---|---|
| JP | 2006-137829 | A | | 6/2006 | |
| JP | 2010-013531 | A | | 1/2010 | |
| JP | 2010-237313 | A | | 10/2010 | |
| JP | 2012-088574 | A | | 5/2012 | |
| JP | 2017-119881 | A | | 7/2017 | |
| JP | 2018064093 | A | * | 4/2018 | ............ B24B 37/00 |
| JP | 2018189731 | A | * | 11/2018 | |
| KR | 10-2004-0097240 | A | | 11/2004 | |
| KR | 2016124864 | A | * | 10/2016 | .......... G03F 7/0397 |
| TW | 200307176 | A | | 12/2003 | |
| TW | 201409167 | A | * | 3/2014 | |
| TW | 201445256 | A | | 12/2014 | |
| TW | 201509918 | A | | 3/2015 | |
| WO | 97/19969 | A1 | | 6/1997 | |
| WO | 2003/082933 | A1 | | 10/2003 | |
| WO | WO-2015151765 | A1 | * | 10/2015 | .......... G03F 7/0397 |
| WO | WO-2016181753 | A1 | * | 11/2016 | ............ C11D 7/265 |
| WO | 2017/115629 | A1 | | 7/2017 | |
| WO | WO-2018062470 | A1 | * | 4/2018 | ............ B24B 37/00 |
| WO | WO-2019064961 | A1 | * | 4/2019 | .......... C07D 263/56 |
| WO | WO-2019064976 | A1 | * | 4/2019 | ........... C08F 120/24 |
| WO | WO-2019216118 | A1 | * | 11/2019 | ............ G03F 7/004 |

OTHER PUBLICATIONS

International Preliminary Report on Patentability dated Sep. 29, 2020 from the International Bureau in International Application No. PCT/JP2019/011492.

Office Action issued Dec. 19, 2022 in Korean Application No. 10-2020-7026793.

The Extended European Search Report dated Mar. 11, 2021, issued by the European Patent Office in application No. 19774214.1.

Communication dated Jun. 15, 2022 from the Korean Patent Office in Korean Application No. 10-2020-7026793.

Office Action dated Mar. 5, 2023 from the Chinese Patent Office in Application No. 201980021461.8.

Office Action dated Apr. 7, 2023 from the Korean Patent Office in Application No. 10-2020-7026793.

Chinese Office Action issued Aug. 8, 2023 in Application No. 201980021461.8.

Office Action issued Oct. 31, 2023 in Chinese Application No. 201980021461.8.

Japanese Office Action issued Jan. 30, 2024 in Application No. 2022-187734.

Office Action issued Jul. 2, 2024 in Japanese Application No. 2022-187734.

Communication issued Jul. 16, 2024 in European Application No. 19 774 214.1.

* cited by examiner

PHOTOSENSITIVE RESIN COMPOSITION, METHOD FOR PRODUCING THE SAME, RESIST FILM, PATTERN FORMING METHOD, AND METHOD FOR MANUFACTURING ELECTRONIC DEVICE

CROSS-REFERENCE TO RELATED APPLICATIONS

This application is a continuation application of International Application No. PCT/JP2019/011492, filed Mar. 19, 2019, the disclosure of which is incorporated herein by reference in its entirety. Further, this application claims priority from Japanese Patent Application No. 2018-058907, filed Mar. 26, 2018, the disclosure of which is incorporated herein by reference in its entirety.

BACKGROUND OF THE INVENTION

1. Field of the Invention

The present disclosure relates to a photosensitive resin composition, a method for producing the same, a resist film, a pattern forming method, and a method for manufacturing an electronic device.

2. Description of the Related Art

Since the advent of a resist for a KrF excimer laser (248 nm), a pattern forming method utilizing chemical amplification has been used in order to compensate for sensitivity reduction due to light absorption. For example, in a positive tone chemical amplification method, first, a photoacid generator included in the exposed area decomposes upon irradiation with light to generate an acid. Then, in a post-exposure bake (PEB) process and the like, an alkali-insoluble group included in a photosensitive composition is changed into an alkali-soluble group by the catalytic action of an acid thus generated. Thereafter, development is performed using, for example, an alkaline solution. As a result, the exposed area is removed to obtain a desired pattern.

In the method, as an alkaline developer, various types of alkaline developers have been proposed. For example, as the alkaline developer, a 2.38%-by-mass aqueous alkaline developer of tetramethylammonium hydroxide (aqueous TMAH solution) is generally used.

Miniaturization of a semiconductor device has lead to a progress in shortening the wavelength of an exposure light source and increasing the numerical aperture (higher NA) of a projection lens, and an exposure machine using an ArF excimer laser having a wavelength of 193 nm as the light source is currently developed. Examples of a technique to further increase the resolution include a method in which a space between a projection lens and a sample is filled with a high-refractive-index liquid (hereinafter sometimes referred to as an "immersion liquid") (that is, a liquid immersion method).

In addition, as a photosensitive resin composition in the related art and a resin used in the photosensitive resin composition, for example, those described in JP2010-013531A, JP2006-137829A, JP2006-030603A, and JP2012-088574A are known.

JP2010-013531A describes a method for purifying a resin for a photoresist, in which purification of a resin for a photoresist in a resin solution containing the resin for a photoresist and a solvent is performed by column chromatography.

JP2006-137829A describes a method for producing a polymer compound for a photoresist, in which in the production of a polymer compound for a photoresist having at least a structure that decomposes by an acid to be alkali-soluble and has an alicyclic hydrocarbon group containing a polar group having adhesiveness to a semiconductor substrate, monomers are polymerized with a polymerization initiator, the polymerization solution is added to a poor solvent, and a filtration operation is not used for precipitates of a polymer compound thus produced, and unreacted monomers are removed by decantation.

JP2006-030603A describes a composition for forming a protective film for liquid immersion exposure, which contains (A) a water-insoluble and alkali-soluble resin and (B) a solvent, and has a content of metal impurities of 100 ppb or less.

JP2012-088574A describes a radiation-sensitive resin composition which contains [A] a fluorine-containing polymer having a structural unit (f) including a base-dissociable group and has a total metal content of 30 mass ppb or less.

SUMMARY OF THE INVENTION

An object to be accomplished by an embodiment of the present disclosure is to provide a photosensitive resin composition which has excellent linearity of a pattern thus obtained even in a case where the photosensitive resin composition is used after the lapse of time since the preparation thereof.

An object to be accomplished by another embodiment of the present disclosure is to provide a method for producing a photosensitive resin composition which has excellent linearity of a pattern thus obtained even in a case where the photosensitive resin composition is used after the lapse of time since the preparation thereof.

An object to be accomplished by yet another embodiment of the present invention is to provide a resist film, a pattern forming method, and a method for manufacturing an electronic device, each of which uses the photosensitive resin composition.

Examples of a means for accomplishing the objects include the following aspects.

<1> A photosensitive resin composition comprising:

an ethylenically unsaturated compound;

a resin having a polarity that increases by the action of an acid; and a metal atom, in which a total content of the metal atoms is from 1 ppt to 30 ppb with respect to a total mass of the photosensitive resin composition, and a content of the ethylenically unsaturated compound is from 0.0001% by mass to 1% by mass with respect to the total mass of the photosensitive resin composition.

<2> The photosensitive resin composition as described in <1>, in which the content of the metal atoms is from 1 ppt to 10 ppb.

<3> The photosensitive resin composition as described in <1> or <2>, in which the content of the metal atoms is from 1 ppt to 1,000 ppt.

<4> The photosensitive resin composition as described in any one of <1> to <3>, in which the content of the ethylenically unsaturated compound is from 0.0001% by mass to 0.5% by mass with respect to the total mass of the photosensitive resin composition.

<5> The photosensitive resin composition as described in any one of <1> to <4>, in which the content of the ethylenically unsaturated compound is from 0.0001% by mass to 0.1% by mass with respect to the total mass of the photosensitive resin composition.

<6> The photosensitive resin composition as described in any one of <1> to <5>, further comprising an organic solvent.

<7> The photosensitive resin composition as described in any one of <1> to <6>, further comprising a photoacid generator.

<8> The photosensitive resin composition as described in any one of <1> to <7>, further comprising an acid diffusion control agent.

<9> A method for producing the photosensitive resin composition as described in any one of <1> to <8>, the method comprising a step of mixing a resin having a polarity that increases by the action of an acid, in which a total content of the metal atoms of the resin is from 1 ppt to 30 ppb with respect to the total mass of the resin, and a content of the ethylenically unsaturated compound is from 0.001% by mass to 10% by mass with respect to a total mass of the resin.

<10> The method for producing the photosensitive resin composition as described in <9>, in which the mixing step is a step of mixing at least the resin and an organic solvent having the total content of the metal atoms from 1 ppt to 30 ppb.

<11> The method for producing the photosensitive resin composition as described in <9> or <10>, in which the mixing step is a step of mixing at least the resin and a photoacid generator having the total content of the metal atoms from 1 ppt to 1,000 ppb.

<12> The method for producing the photosensitive resin composition as described in any one of <9> to <11>, in which the mixing step is a step of mixing at least the resin and an acid diffusion control agent having the total content of the metal atoms from 1 ppt to 1,000 ppb.

<13> A resist film which is a solidified product of the photosensitive resin composition as described in any one of <1> to <8>.

<14> A pattern forming method comprising:

a step of exposing the resist film as described in <13>; and a step of developing the exposed resist film.

<15> A method for manufacturing an electronic device, the method comprising the pattern forming method as described in <14>.

According to an embodiment of the present disclosure, it is possible to provide a photosensitive resin composition which has excellent linearity of a pattern thus obtained, even in a case where the photosensitive resin composition is used after the lapse of time since the preparation thereof.

According to another embodiment of the present disclosure, it is possible to provide a method for producing a photosensitive resin composition which has excellent linearity of a pattern thus obtained, even in a case where the photosensitive resin composition is used after the lapse of time since the preparation thereof.

In addition, according to yet another embodiment of the present invention, it is possible to provide a resist film using the photosensitive resin composition, a pattern forming method, and a method for manufacturing an electronic device.

DESCRIPTION OF THE PREFERRED EMBODIMENTS

Hereinbelow, the content of the present disclosure will be described in detail. Description of configuration requirements described below may be made on the basis of representative embodiments of the present disclosure in some cases, but the present disclosure is not limited to such embodiments.

In citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

"Actinic rays" or "radiation" in the present specification means, for example, a bright line spectrum of a mercury lamp, far ultraviolet rays typified by an excimer laser, extreme ultraviolet rays (EUV light), X-rays, electron beams (EB), or the like. "Light" in the present specification means actinic rays or radiation unless otherwise specified.

"Exposure" in the present specification encompasses, unless otherwise specified, not only exposure with a bright line spectrum of a mercury lamp, far ultraviolet rays typified by an excimer laser, extreme ultraviolet rays, X-rays, EUV light, or the like but also exposure with particle rays such as electron beams and ion beams.

In the present specification, "(value) to (value)" is used to indicate a range that includes the preceding and succeeding numerical values of "to" as the lower limit value and the upper limit value, respectively.

In the present specification, (meth)acrylate represents acrylate and methacrylate, and (meth)acryl represents acryl and methacryl.

In the present specification, the weight-average molecular weight (Mw), the number-average molecular weight (Mn), and the dispersity (also referred to as a molecular weight distribution) (Mw/Mn) of a resin component are defined as values in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

In the present specification, in a case where a plurality of substances corresponding to each of components in a composition are present, the amount of each of components in the composition means the total amount of the plurality of the corresponding substances present in the composition unless otherwise specified.

In the present specification, the term "step" includes not only an independent step but also a step in which the anticipated effect of this step is achieved, even if the step cannot be clearly differentiated from the other steps.

In the present specification, a "total solid content" refers to the total mass of components excluding a solvent from the total composition of a composition. Further, a "solid content" is a component excluding a solvent as described above, and may be, for example, either a solid or a liquid at 25° C.

In the present specification, "% by mass" and "% by weight" have the same definitions and "parts by mass" and "parts by weight" have the same definitions.

Furthermore, in the present specification, a combination of two or more of preferred aspects is a more preferred aspect.

(Photosensitive Resin Composition)

The photosensitive resin composition according to the present disclosure includes an ethylenically unsaturated compound, a resin having a polarity that increases by the action of an acid, and a metal atom, in which a total content of the metal atoms is from 1 ppt to 30 ppb with respect to a total mass of the photosensitive resin composition, and a content of the ethylenically unsaturated compound is from 0.0001% by mass to 1% by mass with respect to the total mass of the photosensitive resin composition.

The present inventors have conducted intensive studies, and as a result, they have found that it is possible to provide a photosensitive resin composition having excellent linearity of a pattern thus obtained after the lapse of time by adopting the configuration.

An action mechanism of the excellent effect caused by the configuration is not clear, but is presumed to be as follows.

It is presumed that in a case where the metal atoms are present at a high concentration in each material in the manufacture of a photosensitive resin composition, an ethylenically unsaturated compound included in a resin is associated with the metal atom or a compound having a metal atom over time to form particles having small particle diameters that cannot be completely removed by filtration or the like. It is difficult to remove the particles from the photosensitive resin composition due to the small size of the particles, and it is presumed that in a case where the photosensitive resin composition is applied and exposed to form a pattern, the linearity of a pattern thus obtained is poor.

In the photosensitive resin composition according to the present disclosure, it is presumed that by setting the total content of the metal atoms to be from 1 ppt to 30 ppb with respect to the total mass of the photosensitive resin composition and setting the content of the ethylenically unsaturated compound to be from 0.0001% by mass to 1% by mass with respect to the total mass of the photosensitive resin composition, the generation of the particles is suppressed even after the photosensitive resin composition is manufactured and aged, resulting in excellent linearity of a pattern thus obtained.

Furthermore, the present inventors have found that in a case where the amount of the metal atoms or the ethylenically unsaturated compound in the photosensitive resin composition is small, the acid diffusivity during heating after exposure is not sufficient, resulting in poor linearity of a pattern thus obtained. With regard to this phenomenon, in the photosensitive resin composition according to the present disclosure, by setting the total content of the metal atoms to 1 ppt or more with respect to the total mass of the photosensitive resin composition and setting the content of the ethylenically unsaturated compound to 0.0001% by mass or more with respect to the total mass of the photosensitive resin composition, the production amount of the particles contributes and the particles are present in an appropriate amount, whereby appropriate acid diffusivity in the photosensitive resin composition is induced, and the linearity of a pattern thus obtained is excellent.

The photosensitive resin composition according to the present disclosure is preferably a resist composition, and may be either a positive tone resist composition or a negative tone resist composition. In addition, the composition may be either a resist composition for alkali development or a resist composition for organic solvent development.

The photosensitive resin composition according to the present disclosure is preferably a chemically amplified photosensitive resin composition.

Hereinafter, details of the respective components included in the photosensitive resin composition according to the present disclosure (also simply referred to as a "composition") will be described in detail.

<Content of Metal Atoms>

The photosensitive resin composition according to the present disclosure has a total content of the metal atoms (also simply referred to as a "metal content from 1 ppt to 30 ppb with respect to the total mass of the photosensitive resin composition.

The "metal atom" in the present disclosure is Li, Na, Mg, Al, K, Ca, Sc, Ti, V, Cr, Mn, Fe, Co, Ni, Cu, Zn, Ga, Ge, As, Rb, Sr, Y, Zr, Nb, Mo, Ru, Rh, Pd, Ag, Cd, In, Sn, Sb, Cs, Ba, Hf, Ta, W, Re, Os, Ir, Pt, Au, Hg, Tl, Pb, or Bi.

These metal atoms are metal atoms which can be included in the photosensitive resin composition in an ordinary operation.

Furthermore, the total content of the metal atoms is a total content of these metals.

In addition, the metal atom in the photosensitive resin composition according to the present disclosure is not particularly limited in terms of a form of the metal atom as included, and may be contained in the state of a compound such as a salt, the state of a simple substance, or the state of an ion.

From the viewpoint of the linearity of a pattern thus obtained after the lapse of time, the total content of the metal atoms in the photosensitive resin composition according to the present disclosure is preferably from 1 ppt to 10 ppb, more preferably from 1 ppt to 5 ppb, still more preferably from 1 ppt to 1,000 ppt, and particularly preferably from 5 ppt to 100 ppt, with respect to the total mass of the photosensitive resin composition.

The content of the metal atoms in the photosensitive resin composition, the resin, and the like in the present disclosure shall be measured by a method shown below.

Furthermore, the content of the metal atoms in the photosensitive resin composition can be measured using, for example, inductively coupled plasma mass spectrometry (ICP-MS).

The metal atoms may be added to the photosensitive resin composition or may be unintentionally mixed in the photosensitive resin composition in a step of producing the photosensitive resin composition. Examples of the case where the metal atoms are unintentionally mixed in the step of producing the photosensitive resin composition include a case where metal atoms are contained in a raw material (for example, an organic solvent) used in the production of a photosensitive resin composition, and a case where metal atoms are mixed in the step of producing a photosensitive resin composition, but are not limited thereto.

<Ethylenically Unsaturated Compound and Resin Having Polarity that Increases by Action of Acid>

The photosensitive resin composition according to the present disclosure includes an ethylenically unsaturated compound and a resin (hereinafter also referred to as a "resin (A)") having a polarity that increases by the action of an acid, and the content of the ethylenically unsaturated compound is from 0.0001% by mass to 1% by mass with respect to the total mass of the photosensitive resin composition.

It is presumed that by setting the content of the ethylenically unsaturated compound in the range in the photosensitive resin composition according to the present disclosure, the metal atom and a compound having the metal atom is suppressed from being associated with the ethylenically unsaturated compound to form particles having small particle diameters that cannot be completely removed by filtration or the like, resulting in excellent linearity of a pattern thus obtained after the lapse of time.

The ethylenically unsaturated compound in the photosensitive resin composition according to the present disclosure preferably includes the ethylenically unsaturated compound used in the polymerization of the resin, and the content of the ethylenically unsaturated compound used in the polymerization of the resin is preferably 50% by mass or more, more preferably 80% by mass or more, still more preferably 90% by mass or more, and particularly preferably 100% by mass, with respect to the total mass of the ethylenically unsaturated compound included in the photosensitive resin composition.

Whether or not it corresponds to the ethylenically unsaturated compound, structural analysis of the resin is performed to determine whether or not the resin corresponds to the ethylenically unsaturated compound by a structural unit such as a monomer unit, and thus, to determine whether or not it corresponds to the ethylenically unsaturated compound used in the polymerization of the resin.

The ethylenically unsaturated compound preferably has one to four ethylenically unsaturated bonds, and more preferably has one ethylenically unsaturated bond. Further, the ethylenically unsaturated compound is preferably a monomer.

In addition, the molecular weight of the ethylenically unsaturated compound is preferably 28 to 1,000, more preferably 50 to 800, and particularly preferably 100 to 600.

As the ethylenically unsaturated compound, those other than the ethylenically unsaturated compound used in the polymerization of the resin may be used, and for example, a known ethylenically unsaturated compound may be used.

The content of the ethylenically unsaturated compound is from 0.0001% by mass to 1% by mass with respect to the total mass of the photosensitive resin composition, and from the viewpoint of the linearity of a pattern thus obtained after the lapse of time, the content is preferably from 0.0001% by mass to 0.5% by mass, more preferably from 0.0001% by mass to 0.4% by mass, still more preferably from 0.0001% by mass to 0.2% by mass, particularly preferably from 0.0001% by mass to 0.1% by mass, and most preferably from 0.0001% by mass to 0.08% by mass.

The content of the ethylenically unsaturated compound in the photosensitive resin composition according to the present disclosure shall be measured by a method shown below.

The content of the ethylenically unsaturated compound can be measured using gas chromatography mass spectrometry (GCMS).

The ethylenically unsaturated compound may be added to the photosensitive resin composition or may be unintentionally mixed in the photosensitive resin composition in a step of producing the photosensitive resin composition. Examples of a case where the metal atoms are unintentionally mixed in the step of producing the photosensitive resin composition include a case where the metal atoms are contained in a raw material (for example, monomers in the production of a resin) used in the production of the photosensitive resin composition, and a case where the metal atoms are mixed in the step of producing the photosensitive resin composition, but are not limited thereto.

The resin (resin (A)) having a polarity that increases by the action of an acid is preferably a resin obtained by polymerizing at least an ethylenically unsaturated compound.

Further, the resin having a polarity that increases by the action of an acid preferably has an acid-decomposable group, and is more preferably a resin having a structural unit having an acid-decomposable group.

In this case, in the pattern forming method according to the present disclosure which will be described later, in the case where an alkali developer is employed as the developer, a positive tone pattern is suitably formed, and in the case where an organic developer is employed as the developer, a negative tone pattern is suitably formed.

[Structural Unit Having Acid-Decomposable Group]

The resin (A) preferably has a structural unit having an acid-decomposable group.

As the resin (A), a known resin can be appropriately used. For example, the known resins disclosed in paragraphs 0055 to 0191 of US2016/0274458A, paragraphs 0035 to 0085 of US2015/0004544A, or paragraphs 0045 to 0090 of US2016/0147150A can be suitably used as the resin (A).

The acid-decomposable group preferably has a structure in which a polar group is protected with a group (leaving group) that leaves through decomposition by the action of an acid.

Examples of the polar group include an acidic group (a group that dissociates in a 2.38%-by-mass aqueous tetramethylammonium hydroxide solution) such as a carboxyl group, a phenolic hydroxyl group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and an alcoholic hydroxyl group.

Moreover, the alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol group (for example, a hexafluoroisopropanol group) having the α-position substituted with an electron-withdrawing group such as a fluorine atom is excluded as a hydroxyl group. The alcoholic hydroxyl group is preferably a hydroxyl group having an acid dissociation constant (pKa) from 12 to 20.

Preferred examples of the polar group include a carboxyl group, a phenolic hydroxyl group, and a sulfonic acid group.

A group which is preferable as the acid-decomposable group is a group in which a hydrogen atom of the leaving group is substituted with a group (leaving group) that leaves by the action of an acid.

Examples of the group (leaving group) that leaves by the action of an acid include $-C(R^{36})(R^{37})(R^{38})$, $-C(R^{36})(R^{37})(OR^{39})$, and $-C(R^{01})(R^{02})(OR^{39})$.

In the formulae, $R^{36}$ to $R^{39}$ each independently represent an alkyl group, a cycloalkyl group, an aryl group, an aralkyl group, or an alkenyl group. $R^{36}$ and $R^{37}$ may be bonded to each other to form a ring.

$R^{01}$ and $R^{02}$ each independently represent a hydrogen atom, an alkyl group, a cycloalkyl group, an aryl group, an aralkyl group, or an alkenyl group.

As the alkyl group of each of $R^{36}$ to $R^{39}$, $R^{01}$, and $R^{02}$, an alkyl group having 1 to 8 carbon atoms is preferable, and examples thereof include a methyl group, an ethyl group, a propyl group, an n-butyl group, a sec-butyl group, a hexyl group, and an octyl group.

The cycloalkyl group of each of $R^{36}$ to $R^{39}$, $R^{01}$, and $R^{02}$ may be monocyclic or polycyclic. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphonyl group, a dicyclopentyl group, an α-pinel group, a tricyclodecanyl group, a tetracyclododecyl group, and an androstanyl group. Further, at least one carbon atom in the cycloalkyl group may be substituted with a heteroatom such as an oxygen atom.

The aryl group of each of $R^{36}$ to $R^{39}$, $R^{01}$, and $R^{02}$ is preferably an aryl group having 6 to 10 carbon atoms, and examples thereof include a phenyl group, a naphthyl group, and an anthryl group.

The aralkyl group of each of $R^{36}$ to $R^{39}$, $R^{01}$, and $R^{02}$ is preferably an aralkyl group having 7 to 12 carbon atoms, and examples thereof include a benzyl group, a phenethyl group, and a naphthylmethyl group.

The alkenyl group of each of $R^{36}$ to $R^{39}$, $R^{01}$, and $R^{02}$ is preferably an alkenyl group having 2 to 8 carbon atoms, and examples thereof include a vinyl group, an allyl group, a butenyl group, and a cyclohexenyl group.

As the ring formed by the bonding of $R^{36}$ and $R^{37}$, a (monocyclic or polycyclic) cycloalkyl group is preferable. As the cycloalkyl group, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the acid-decomposable group, a cumyl ester group, an enol ester group, an acetal ester group, a tertiary alkyl ester group, or the like is preferable, and an acetal ester group or the tertiary alkyl ester group is more preferable.

From the viewpoint of tolerance of a focal depth and pattern linearity, it is preferable that the resin (A) has a structural unit represented by Formula AI as a structural unit having an acid-decomposable group.

Formula AI

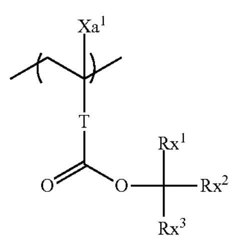

In Formula AI, $Xa^1$ represents a hydrogen atom, a halogen atom other than a fluorine atom, or a monovalent organic group, T represents a single bond or a divalent linking group, $Rx^1$ to $Rx^3$ each independently represent an alkyl group or a cycloalkyl group, and any two of $Rx^1$ to $Rx^3$ may or may not be bonded to each other to form a ring structure.

Examples of the divalent linking group of T include an alkylene group, an arylene group, —COO—Rt-, and —O—Rt-. In the formulae, Rt represents an alkylene group, a cycloalkylene group, or an arylene group.

T is preferably a single bond or —COO—Rt-. Rt is preferably a chained alkylene group having 1 to 5 carbon atoms, and more preferably $—CH_2—$, $—(CH_2)_2—$, or $—(CH_2)_3—$. T is more preferably the single bond.

$Xa^1$ is preferably the hydrogen atom or the alkyl group.

The alkyl group of $Xa^1$ may have a substituent, and examples of the substituent include a hydroxyl group and a halogen atom other than a fluorine atom.

The alkyl group of $Xa^1$ preferably has 1 to 4 carbon atoms, and examples thereof include a methyl group, an ethyl group, a propyl group, and a hydroxymethyl group. The alkyl group of $Xa^1$ is preferably the methyl group.

The alkyl group of each of $Rx^1$, $Rx^2$, and $Rx^3$ may be linear or branched, and preferred examples thereof include a methyl group, an ethyl group, an n-propyl group, an isopropyl group, an n-butyl group, an isobutyl group, and a t-butyl group. The number of the carbon atoms of the alkyl group is preferably 1 to 10, more preferably 1 to 5, and still more preferably 1 to 3. The alkyl group of each of $Rx^1$, $Rx^2$, and $Rx^3$ may have some of carbon-carbon bonds that are double-bonded.

As the cycloalkyl group of each of $Rx^1$, $Rx^2$, and $Rx^3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the ring structure formed by the bonding of two of $Rx^1$, $Rx^2$, and $Rx^3$, a monocyclic cycloalkane ring such as a cyclopentyl ring, a cyclohexyl ring, a cycloheptyl ring, and a cyclooctane ring, or a polycyclic cycloalkyl ring such as a norbornane ring, a tetracyclodecane ring, a tetracyclododecane ring, and an adamantane ring is preferable. The cyclopentyl ring, the cyclohexyl ring, or the adamantane ring is more preferable. As the ring structure formed by the bonding of two of $Rx^1$, $Rx^2$, and $Rx^3$, a structure shown below is also preferable.

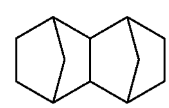 [SMILES: C1CC2CC1C1C3CCC(C3)C21]

Specific examples of a monomer corresponding to the structural unit represented by Formula AI are shown below, but the present disclosure is not limited to these specific examples. The following specific examples correspond to a case where $Xa^1$ in Formula AI is a methyl group, but $Xa^1$ can be optionally substituted with a hydrogen atom, a halogen atom other than a fluorine atom, or a monovalent organic group.

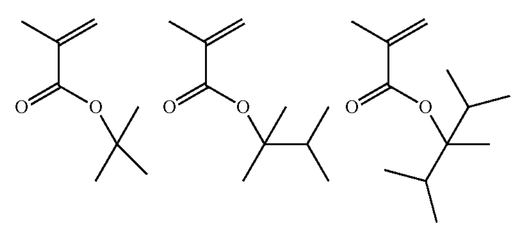

-continued

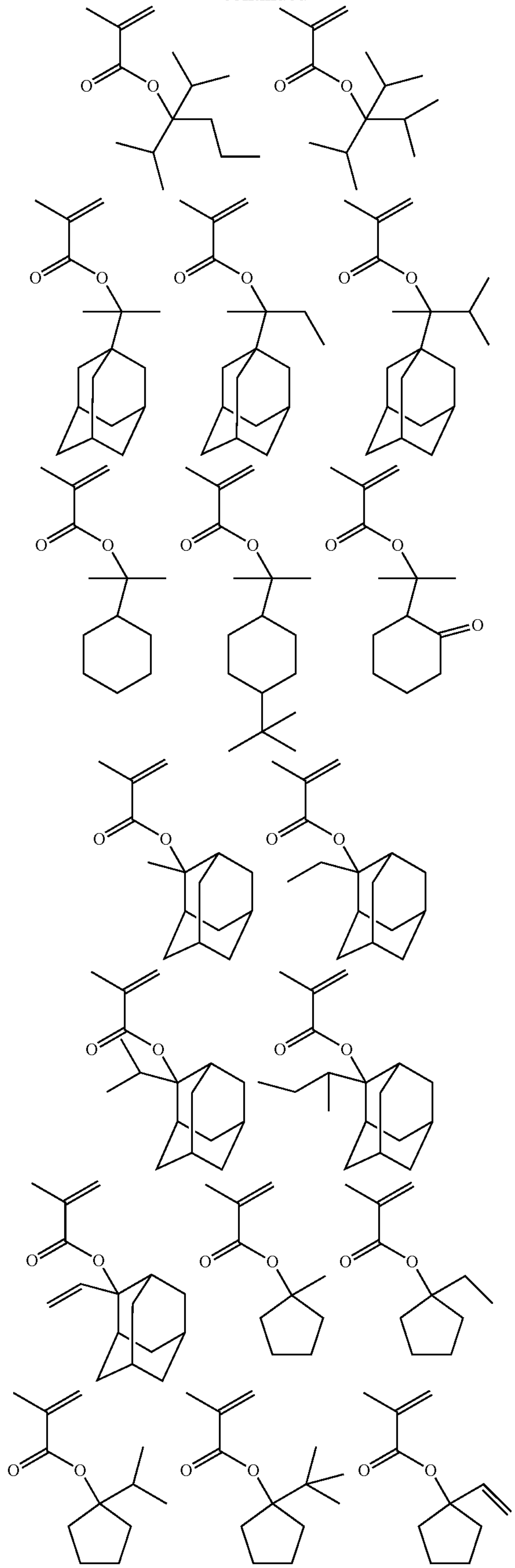

-continued

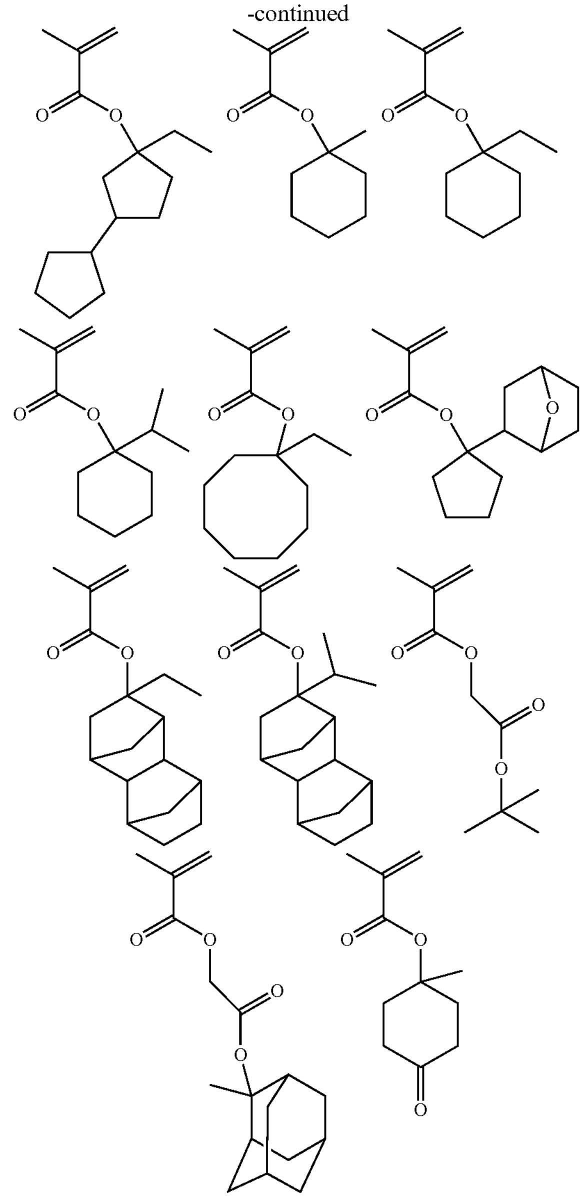

It is also preferable that the resin (A) has the structural unit described in paragraphs 0336 to 0369 of US2016/0070167A1 as the structural unit having an acid-decomposable group.

Moreover, the resin (A) may have a structural unit including a group that generates an alcoholic hydroxyl group through decomposition by the action of an acid, described in paragraphs 0363 and 0364 of US2016/0070167A, as the structural unit having an acid-decomposable group.

The resin (A) may include only one kind or two or more kinds of the structural units having an acid-decomposable group.

The content of the structural unit having an acid-decomposable group (the total amount of the structural units having an acid-decomposable group in a case where a plurality of the structural units having an acid-decomposable group are present) included in the resin (A) is preferably 10% by mole to 90% by mole, more preferably 20% by mole to 80% by mole, and still more preferably 30% by mole to 70% by mole, with respect to all the structural units of the resin (A).

Furthermore, in the present disclosure, in a case where the content of the "structural units" is defined by a molar ratio, the "structural unit" has the same definition as that of the "monomer unit". Incidentally, in the present disclosure, the "monomer unit" may be modified after polymerization by a polymer reaction or the like. The same applies to the following.

[Structural Unit Having at Least One Selected from Group Consisting of Lactone Structure, Sultone Structure, and Carbonate Structure]

The resin (A) preferably has a structural unit having at least one selected from the group consisting of a lactone structure, a sultone structure, and a carbonate structure.

As the lactone structure or the sultone structure, any structure is available as long as it has a lactone structure or a sultone structure, but the structure is preferably a 5- to 7-membered ring lactone structure or a 5- to 7-membered ring sultone structure and more preferably a 5- to 7-membered ring lactone structure to which another ring structure is fused in the form of forming a bicyclo structure or a spiro structure or a 5- to 7-membered ring sultone structure to which another ring structure is fused in the form of forming a bicyclo structure or a spiro structure. The resin (A) still more preferably has a structural unit having a lactone structure represented by any one of Formulae LC1-1 to LC1-21 or a sultone structure represented by any one of Formulae SL1-1 to SL1-3. Further, the lactone structure or the sultone structure may be bonded directly to the main chain. Preferred examples of the structure include LC1-1, LC1-4, LC1-5, LC1-8, LC1-16, LC1-21, and SL1-1.

LC1-1

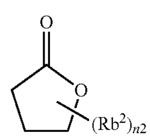

LC1-2

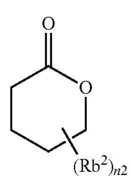

LC1-3

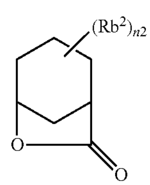

LC1-4

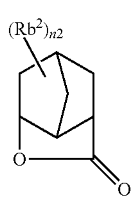

-continued

LC1-5

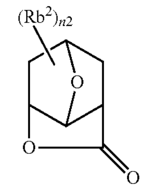

LC1-6

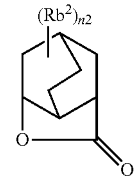

LC1-7

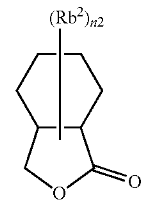

LC1-8

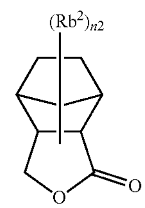

LC1-9

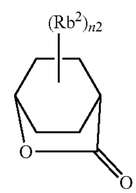

LC1-10

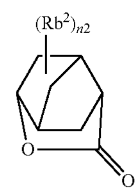

LC1-11

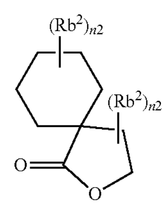

LC1-12

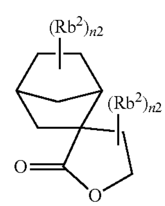

-continued

LC1-13

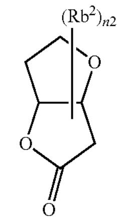

LC1-14

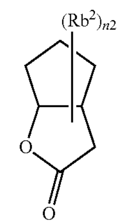

LC1-15

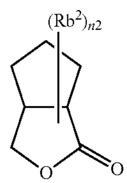

LC1-16

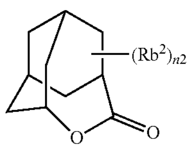

LC1-17

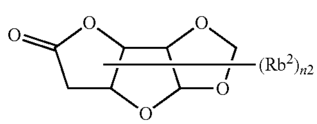

LC1-18

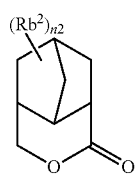

LC1-19

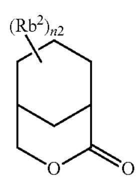

LC1-20

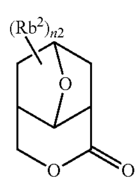

-continued

LC1-21

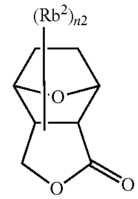

SL1-1

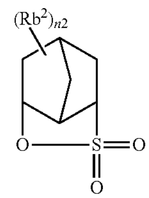

SL1-2

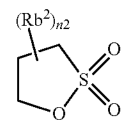

SL1-3

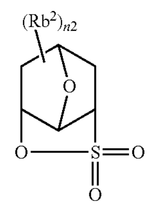

The lactone structural moiety or the sultone structural moiety may or may not have a substituent ($Rb^2$). Preferred examples of the substituent ($Rb^2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom other than a fluorine atom, a hydroxyl group, a cyano group, and an acid-decomposable group is preferable. The substituent is more preferably the alkyl group having 1 to 4 carbon atoms, the cyano group, or the acid-decomposable group. n2 represents an integer of 0 to 4. In a case where n2 is 2 or more, the substituents ($Rb^2$) which are present in plural number may be the same as or different from each other. Further, the substituents ($Rb^2$) which are present in plural number may be bonded to each other to form a ring.

The structural unit having a lactone structure or a sultone structure is preferably a structural unit represented by Formula III from the viewpoint of tolerance of a focal depth and pattern linearity.

In addition, the resin having a structural unit having an acid-decomposable group preferably includes a structural unit represented by Formula III from the viewpoint of tolerance of a focal depth and pattern linearity.

Formula III

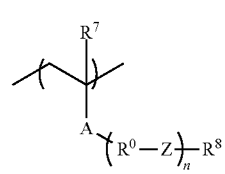

In Formula III,

A represents an ester bond (a group represented by —COO—) or an amide bond (a group represented by —CONH—).

n is the repetition number of the structure represented by —$R^0$—Z—, represents an integer of 0 to 5, and is preferably 0 or 1, and more preferably 0. In a case where n is 0, —$R^0$—Z— is not present, and A and $R^8$ are bonded to each other through a single bond.

$R^0$ represents an alkylene group, a cycloalkylene group, or a combination thereof. In a case where a plurality of $R^0$'s are present, $R^0$'s each independently represent an alkylene group, a cycloalkylene group, or a combination thereof.

Z represents a single bond, an ether bond, an ester bond, an amide bond, a urethane bond, or a urea bond. In a case where a plurality of Z's are present, Z's each independently represent a single bond, an ether bond, an ester bond, an amide bond, a urethane bond, or a urea bond.

$R^8$ represents a monovalent organic group having a lactone structure or a sultone structure.

$R^7$ represents a hydrogen atom, a halogen atom other than a fluorine atom, or a monovalent organic group (preferably a methyl group).

The alkylene group or the cycloalkylene group of $R^0$ may have a substituent.

Z is preferably an ether bond or an ester bond, and more preferably the ester bond.

Specific examples of a monomer corresponding to the structural unit represented by Formula III and a monomer corresponding to the structural unit represented by Formula A-1 which will be described later are shown below, but the present disclosure is not particularly limited to these specific examples. The following specific examples correspond to a case where $R^7$ in Formula III and $R_A^1$ in Formula A-1 which will be described later are each a methyl group, but $R^7$ and $R_A^1$ can be optionally substituted with a hydrogen atom, a halogen atom other than a fluorine atom, or a monovalent organic group.

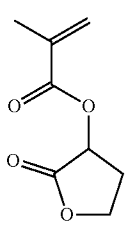
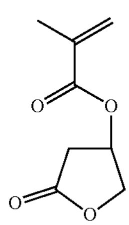
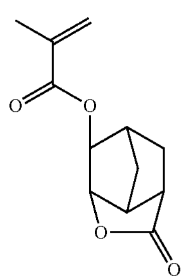
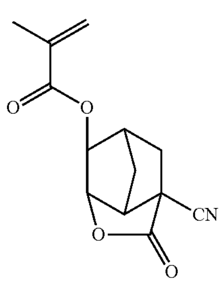
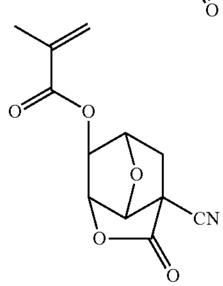

-continued

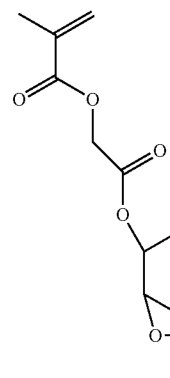
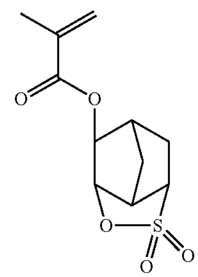
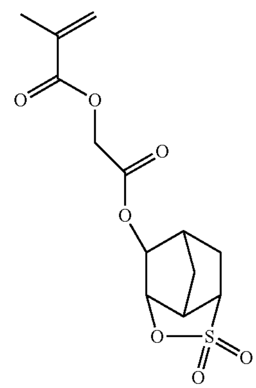
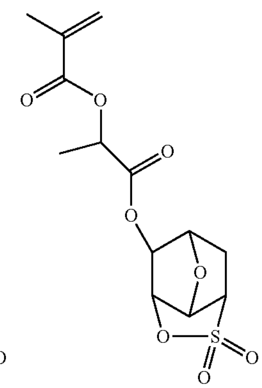
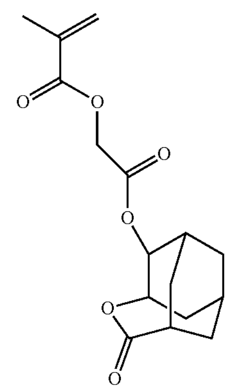
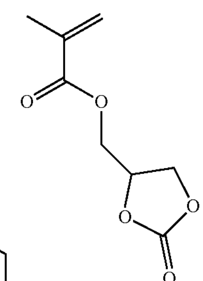
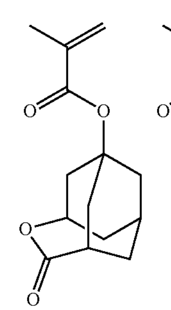
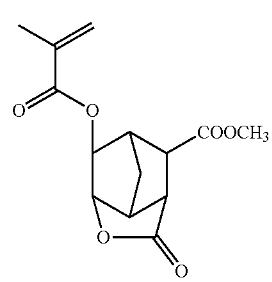

-continued

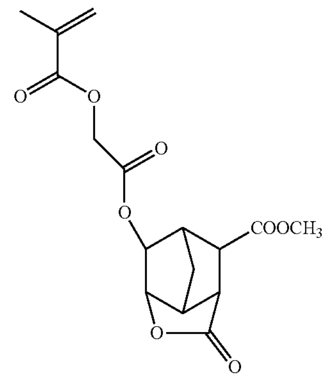

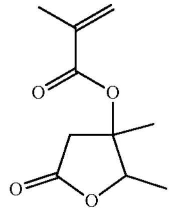

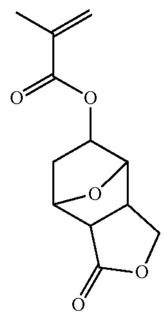

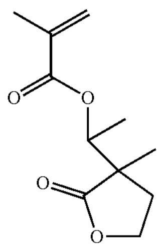

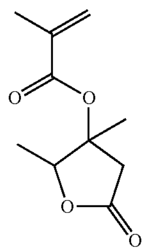

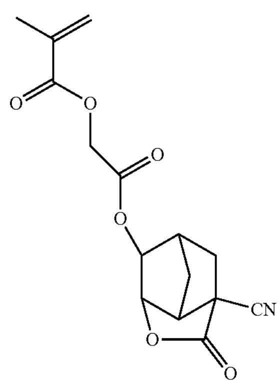 [SMILES: C=C(C)C(=O)OCC(=O)OC1C2CC3C1OC(=O)C3(C#N)C2]

In addition to the monomers, monomers shown below are also suitably used as a raw material of the resin (A).

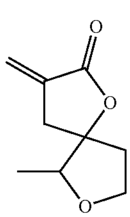

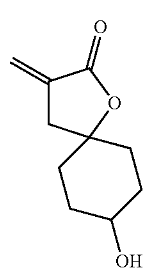

The resin (A) may have a structural unit having a carbonate structure. The carbonate structure is preferably a cyclic carbonic acid ester structure.

The structural unit having a cyclic carbonic acid ester structure is preferably a structural unit represented by Formula A-1.

Formula A-1

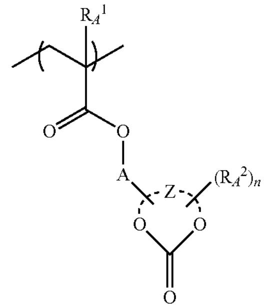

In Formula A-1, $R_A^1$ represents a hydrogen atom, a halogen atom other than a fluorine atom, or a monovalent organic group (preferably a methyl group), n represents an integer of 0 or more, and $R_A^2$ represents a substituent. In a case where n is 2 or more, $R_A^2$'s each independently represent a substituent, A represents a single bond or a divalent linking group, and Z represents an atomic group which forms a monocyclic structure or a polycyclic structure together with a group represented by —O—C(═O)—O— in the formula.

It is also preferable that the resin (A) has the structural unit described in paragraphs 0370 to 0414 of US2016/0070167A1 as the structural unit having at least one selected from the group consisting of a lactone structure, a sultone structure, and a carbonate structure.

The resin (A) preferably has at least two structural units (a) (hereinafter also referred to as "structural units (a)") having lactone structures.

The at least two lactone structures may be, for example, a structure in which at least two lactone structures are fused or may be a structure in which at least two lactone structures are linked through a single bond or a linking group.

The lactone structure contained in the structural unit (a) is not particularly limited, but is preferably a 5- to 7-membered ring lactone structure, and preferably the 5- to 7-membered ring lactone structure to which another ring structure is fused so as to form a bicyclo structure or a spiro structure.

Preferred examples of the lactone structure include a lactone structure represented by any of LC1-1 to LC1-21 as described above.

The structural unit (hereinafter also referred to as "structural unit (a)") having at least two lactone structures is preferably a structural unit represented by Formula L-1.

Formula L-1

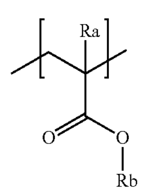

In Formula L-1, Ra represents a hydrogen atom or an alkyl group, and Rb represents a partial structure having two or more lactone structures.

The alkyl group of Ra is preferably an alkyl group having 1 to 4 carbon atoms, more preferably a methyl group or an ethyl group, and particularly preferably the methyl group.

The alkyl group of Ra may be substituted. Examples of the substituent include a halogen atom such as a fluorine atom, a chlorine atom, and a bromine atom, a mercapto group, a hydroxy group, a methoxy group, an ethoxy group, an isopropoxy group, an alkoxy group such as a t-butoxy group and a benzyloxy group, and an acyl group such as an acetyl group and a propionyl group. Ra is preferably a hydrogen atom, a methyl group, a trifluoromethyl group, or a hydroxymethyl group.

Examples of the lactone structure contained in the Rb partial structure include the above-mentioned lactone structure.

The partial structure of Rb having two or more lactone structures is preferably, for example, a structure in which at least two lactone structures are linked through a single bond or a linking group, and a structure in which at least two lactone structures are fused.

The structural unit (a1) having a structure in which at least two lactone structures are fused and the structural unit (a2) having a structure in which at least two lactone structures are linked through a single bond or a linking group will each be described below.

—Structural Unit (a1) Having Structure in which at Least Two Lactone Structures are Fused—

The structure in which at least two lactone structures are fused is preferably a structure in which two or three lactone structures are fused, and is more preferably a structure in which two lactone structures are fused.

Examples of the structural unit (hereinafter also referred to as a "structural unit (a1)") having a structure in which at least two lactone structures are fused include a structural unit represented by Formula L-2.

Formula L-2

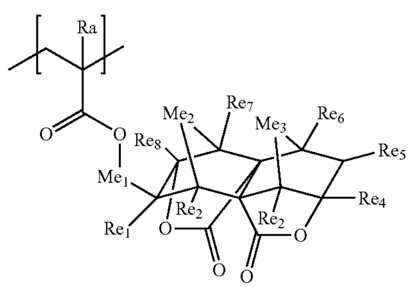

In Formula L-2, Ra has the same definition as Ra in Formula L-1, $Re_1$ to $Re_8$ each independently represent a hydrogen atom or an alkyl group, $Me_1$ represents a single bond or a divalent linking group, and $Me_2$ and $Me_3$ each independently represent a divalent linking group.

The alkyl group of each of $Re_1$ to $Re_8$ preferably has, for example, 5 or less carbon atoms, and more preferably has 1 carbon atom.

Examples of the alkyl group having 5 or less carbon atoms of each of $Re_1$ to $Re_8$ include a methyl group, an ethyl group, an n-propyl group, an isopropyl group, an n-butyl group, an isobutyl group, a t-butyl group, an n-pentyl group, an isopentyl group, an s-pentyl group, and a t-pentyl group.

Among those, $Re_1$ to $Re_8$ are each preferably a hydrogen atom.

Examples of the divalent linking group of $Me_1$ include an alkylene group, a cycloalkylene group, —O—, —CO—, —COO—, —OCO—, and a group in which two or more of these groups are combined.

The alkylene group of $Me_1$ preferably has, for example, 1 to 10 carbon atoms. Moreover, the alkylene group more preferably has 1 or 2 carbon atoms, and as the alkylene group having 1 or 2 carbon atoms, for example, a methylene group or an ethylene group is preferable.

The alkylene group of $Me_1$ may be linear or branched, and examples thereof include a methylene group, an ethane-1,1-diyl group, an ethane-1,2-diyl group, a propane-1,1-diyl group, a propane-1,3-diyl group, a propane-2,2-diyl group, a pentane-1,5-diyl group, and a hexane-1,6-diyl group.

The cycloalkylene group of $Me_1$ preferably has, for example, 5 to 10 carbon atoms, and more preferably has 5 or 6 carbon atoms.

Examples of the cycloalkylene group of $Me_1$ include a cyclopentylene group, a cyclohexylene group, a cycloheptylene group, a cyclooctylene group, and a cyclodecylene group.

The group in which two or more groups are combined as the divalent linking group of $Me_1$ is preferably, for example, a group in which an alkylene group and —COO— are combined or a group in which —OCO— and an alkylene group are combined. Further, the group in which two or more groups are combined is more preferably a group in which a methylene group and a —COO— group are combined or a group in which a —COO— group and a methylene group are combined.

Examples of the divalent linking group of $Me_2$ and $Me_3$ include an alkylene group and —O—. The divalent linking group of each of $Me_2$ and $Me_3$ is preferably a methylene group, an ethylene group, or —O—, and more preferably —O—.

The monomer corresponding to the structural unit (a1) can be synthesized by, for example, the method described in JP2015-160836A.

Specific examples of the structural unit (a1) are shown below, but the present disclosure is not limited thereto. In each of the following formulae, $R_9$ represents a hydrogen atom, a methyl group, a trifluoromethyl group, or a hydroxymethyl group, and * represents a bonding position with another structural unit.

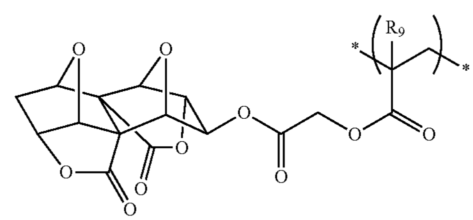

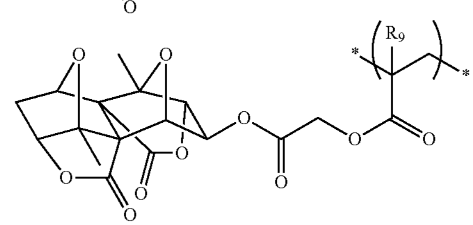

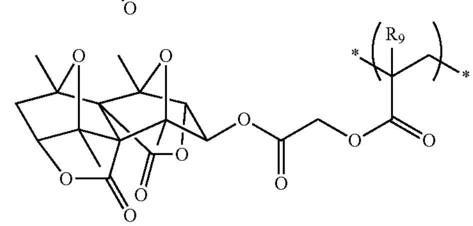

-continued
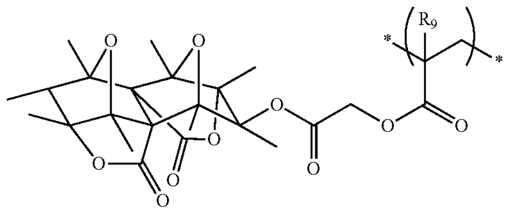
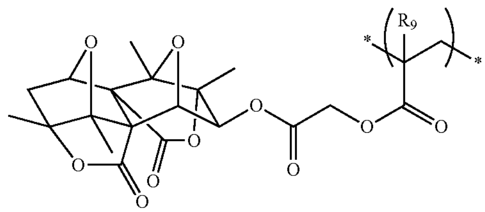
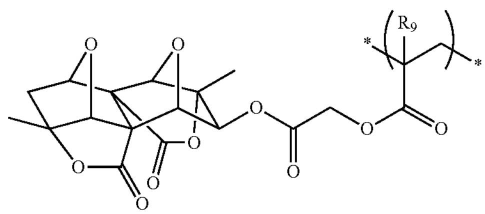
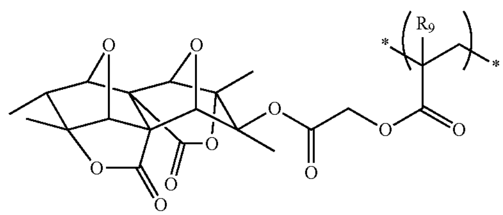
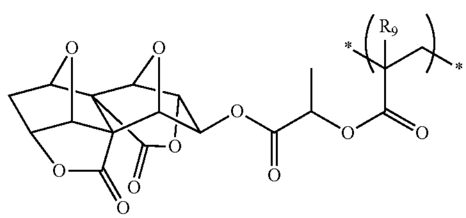
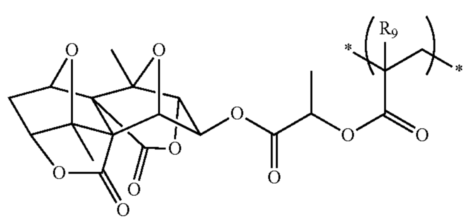
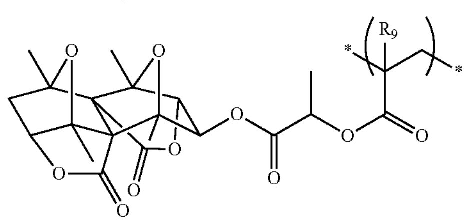
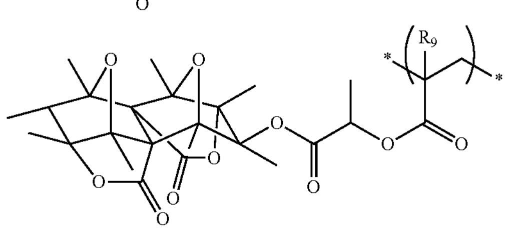
-continued
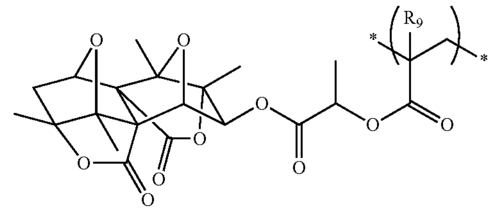
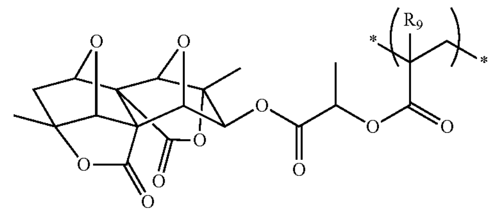
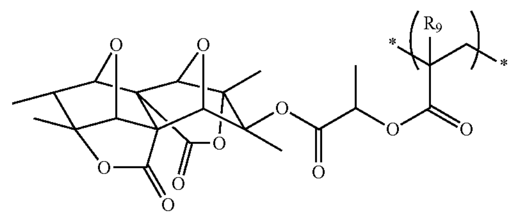
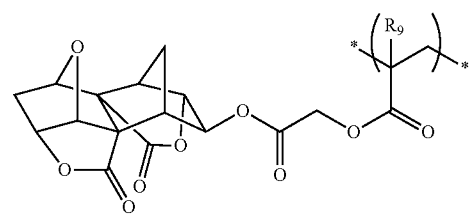
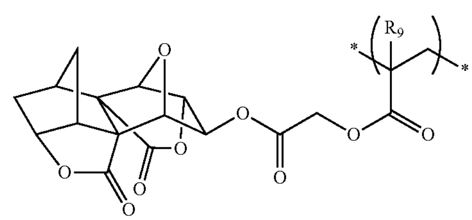
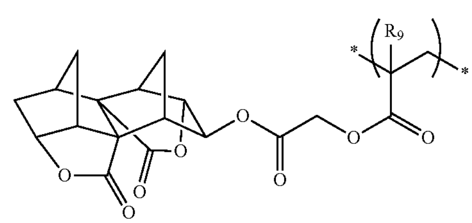
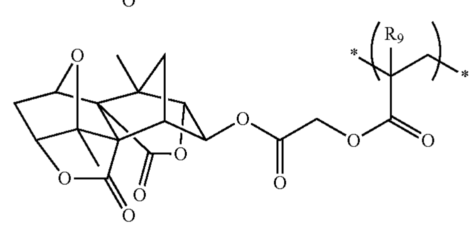
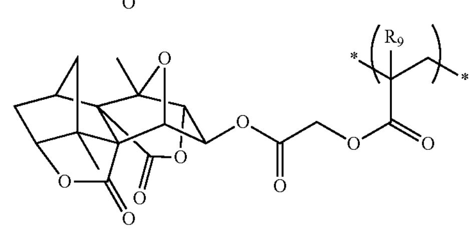

-continued
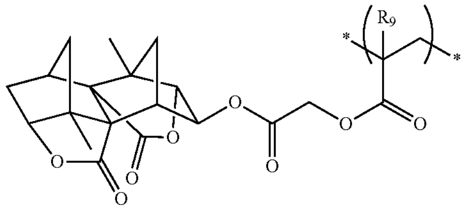
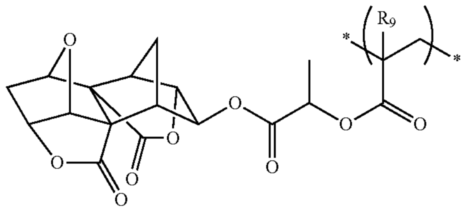
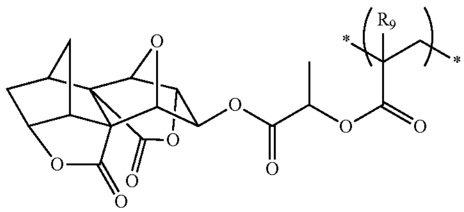
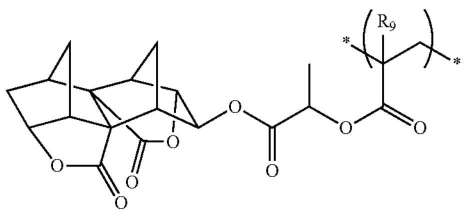
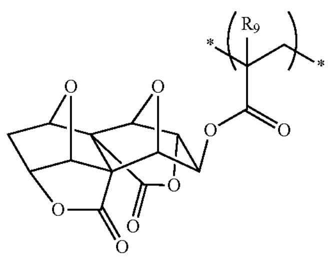
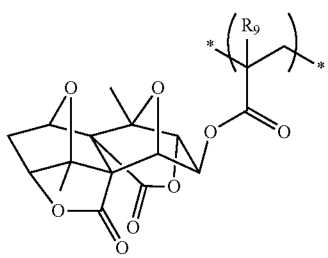
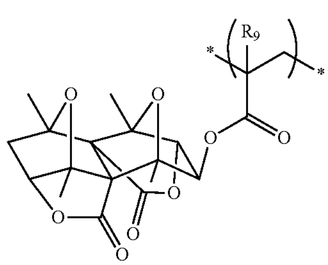
-continued
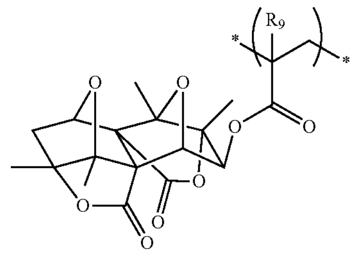
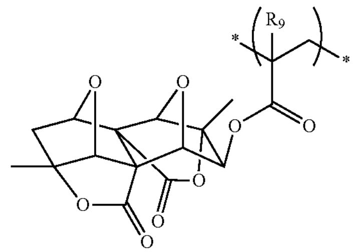
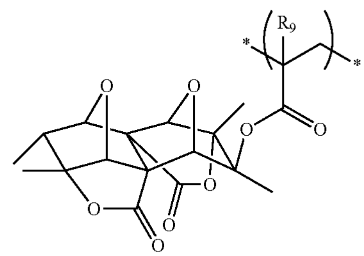
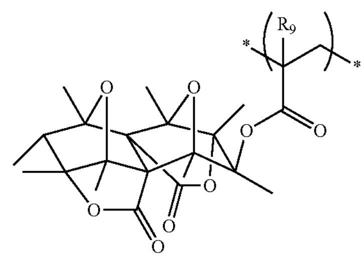
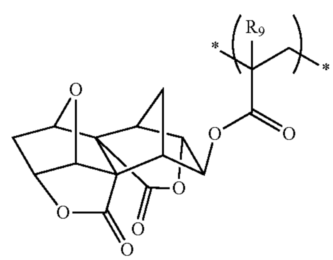
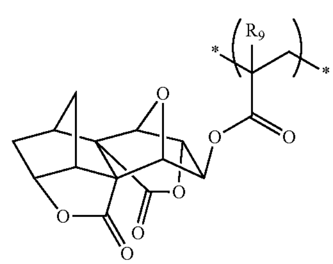

-continued

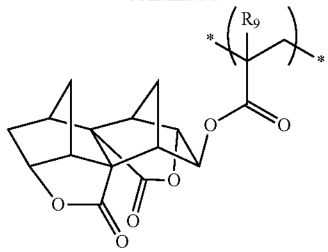

—Structural Unit (a2) Having Structure in which at Least Two Lactone Structures are Linked through Single Bond or Linking Group—

The structure in which at least two lactone structures are linked through a single bond or a linking group is preferably a structure in which two to four lactone structures are linked through a single bond or a linking group, and more preferably a structure in which two lactone structures are linked through a single bond or a linking group.

Examples of the linking group include the same groups as those mentioned as the linking group of $M_2$ in Formula L-3 which will be described later.

The structural unit (hereinafter also referred to as a "structural unit (a2)") having a structure in which two or more lactone structures are linked through a single bond or a linking group has, for example, a structural unit represented by Formula L-3.

Formula L-3

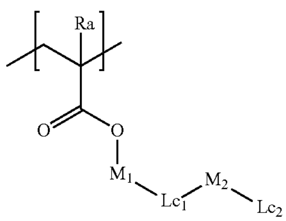

In Formula L-3, Ra has the same definition as Ra in Formula L-1, $M_1$ and $M_2$ each independently represent a single bond or a linking group, and $Lc_1$ and $Lc_2$ each independently represent a group having a lactone structure.

Examples of the linking group of $M_1$ include an alkylene group, a cycloalkylene group, —O—, —CO—, —COO—, —OCO—, and a group in which two or more of these groups are combined.

The alkylene group of $M_1$ preferably has, for example, 1 to 10 carbon atoms.

The alkylene group for $M_1$ may be linear or branched and example thereof include a methylene group, an ethane-1,1-diyl group, an ethane-1,2-diyl group, a propane-1,1-diyl group, a propane-1,3-diyl group, a propane-2,2-diyl group, a pentane-1,5-diyl group, and a hexane-1,6-diyl group.

The cycloalkylene group of $M_1$ preferably has, for example, 5 to 10 carbon atoms.

Examples of the cycloalkylene group of $M_1$ include a cyclopentylene group, a cyclohexylene group, a cycloheptylene group, a cyclooctylene group, and a cyclodecylene group.

The group in which two or more groups are combined as the linking group of $M_1$ is preferably, for example, a group in which an alkylene group and —COO— are combined or a group in which —OCO— and an alkylene group are combined. Further, the group in which two or more groups are combined is more preferably a group in which a methylene group and a —COO— group are combined or a group in which a —COO— group and a methylene group are combined.

Examples of the linking group for $M_2$ include the same groups as those mentioned for the linking group for $M_1$.

The lactone structure contained in $Lc_1$ is, for example, preferably a 5- to 7-membered lactone structure, and preferably the 5- to 7-membered lactone structure to which another ring structure is fused in the form of forming a bicyclo structure or a spiro structure. The lactone structure is more preferably a lactone structure represented by any of LC-1 to LC1-21. More preferred examples of the lactone structure include LC-1, LC-4, LC-5, LC-6, LC1-13, LC1-14, and LC1-17.

The lactone structure contained in $Lc_1$ may include a substituent. Examples of the substituent which may be included in the lactone structure contained in $Lc_1$ include the same substituent as the above-mentioned substituent ($Rb^2$) having a lactone structure.

Examples of the lactone structure contained in $Lc_2$ include the same substituent as the lactone structure mentioned as the lactone structure contained in $Lc_1$.

The structural unit (a2) is preferably a structural unit represented by Formula L-4 as the structural unit represented by Formula L-3.

Formula L-4

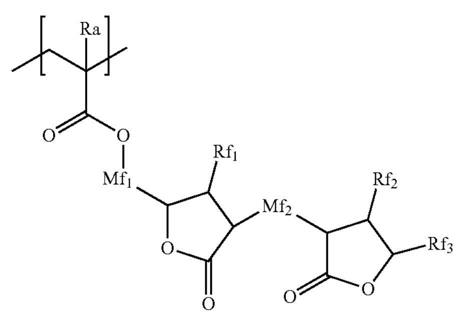

In Formula L-4, Ra has the same definition as Ra in Formula L-1, $Mf_1$ and $Mf_2$ each independently represent a single bond or a linking group, and $Rf_1$, $Rf_2$, and $Rf_3$ each independently represent a hydrogen atom or an alkyl group, $Mf_1$ and $Rf_1$ may be bonded to each other to form a ring, and $Mf_2$ and each of $Rf_2$ or $Rf_3$ may be bonded to each other to form a ring.

The linking group for $Mf_1$ has the same definition as the linking group for $M_1$ in Formula L-3.

The linking group for $Mf_2$ has the same definition as the linking group for $M_2$ in Formula L-3.

Examples of the alkyl group of $Rf_1$ include an alkyl group having 1 to 4 carbon atoms. The alkyl group having 1 to 4 carbon atoms of $Rf_1$ is preferably a methyl group or an ethyl group, and more preferably the methyl group. The alkyl group of $Rf_1$ may have a substituent. Examples of the substituent which may be contained in the alkyl group of $Rf_1$ include a hydroxy group, an alkoxy group such as a methoxy group and an ethoxy group, a cyano group, and a halogen atom such as a fluorine atom.

The alkyl group of each of $Rf_2$ and $Rf_3$ has the same definition as the alkyl group of $Rf_1$.

$Mf_1$ and $Rf_1$ may be bonded to each other to form a ring. Examples of the structure in which $Mf_1$ and $Rf_1$ are bonded to each other to form a ring include the lactone structure represented by LC1-13, LC1-14, or LC1-17 in the above-mentioned lactone structure.

$Mf_2$ and each of $Rf_2$ or $Rf_3$ may be bonded to each other to form a ring.

Examples of the structure in which $Mf_2$ and $Rf_2$ are bonded to each other to form a ring include the above-mentioned lactone structure represented by LC-7, LC-8, or LC1-15 in the above-mentioned lactone structure.

Examples of the structure in which $Mf_2$ and $Rf_3$ are bonded to each other to form a ring include the above-mentioned lactone structure represented by any of LC1-3 to LC1-6 in the above-mentioned lactone structure.

Specific examples of the structural unit (a2) are shown below, but the present disclosure is not limited thereto. * represents a bonding position with another structural unit.

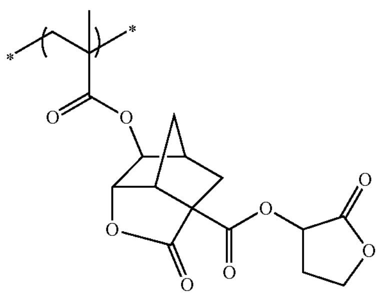

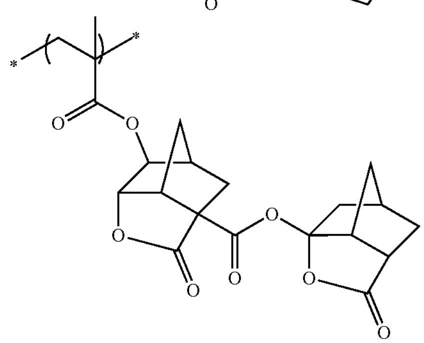

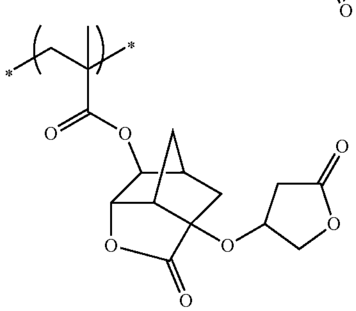

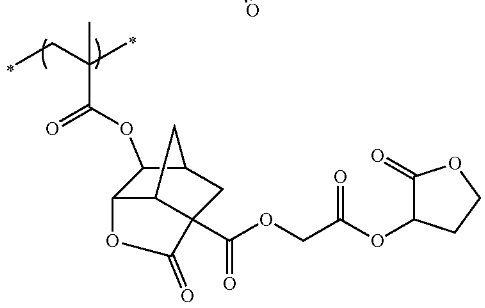

-continued

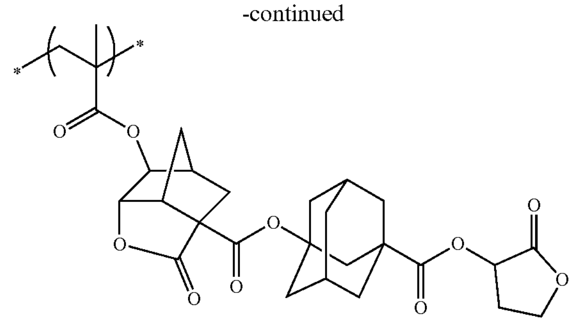

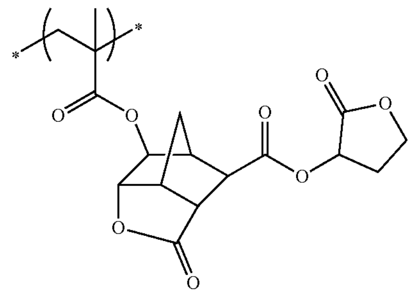

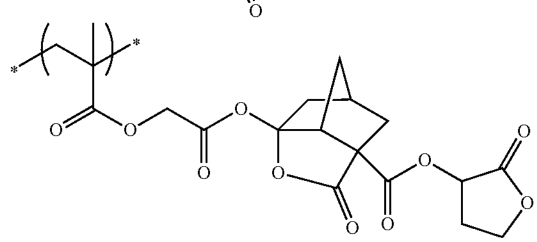

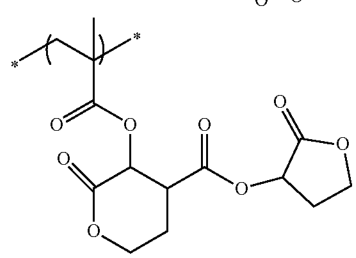

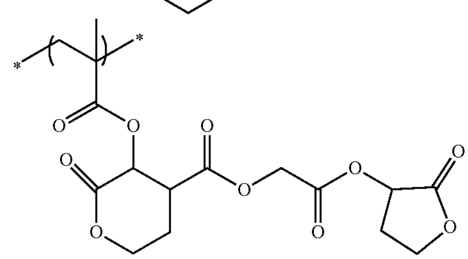

In the structural unit having at least two lactone structures, optical isomers are typically present, but any of the optical isomers may be used. In addition, one optical isomer may be used alone or a mixture of a plurality of the optical isomers may be used. In a case where one optical isomer is mainly used, an optical purity (ee) thereof is preferably 90% or more, and more preferably 95% or more.

The content of the structural units having at least two lactone structures is preferably 10% by mole to 60% by mole, more preferably 20% by mole to 50% by mole, and still more preferably 30% by mole to 50% by mole, with respect to all the structural units in the resin (A).

In order to enhance the effect in the present disclosure, it is possible to use two or more kinds of structural units having at least two lactone structures in combination. In a case where two or more kinds of repeating units having at least two lactone structures are contained, it is preferable that a total content of the structural units having at least two lactone structures is within the range.

The resin (A) may have only one kind or a combination of two or more kinds of the structural units having at least one selected from the group consisting of a lactone structure, a sultone structure, and a carbonate structure.

The content of the structural unit having at least one selected from the group consisting of a lactone structure, a sultone structure, and a carbonate structure (the total amount of the structural units having at least one selected from the group consisting of a lactone structure, a sultone structure, and a carbonate structure in a case where a plurality of the structural units having at least one selected from the group consisting of a lactone structure, a sultone structure, and a carbonate structure are present) included in the resin (A) is preferably 5% by mole to 70% by mole, more preferably 10% by mole to 65% by mole, and still more preferably 20% by mole to 60% by mole, with respect to all the structural units of the resin (A).

[Structural Unit Having Polar Group]

The resin (A) preferably has a structural unit having a polar group.

Examples of the polar group include a hydroxyl group, a cyano group, and a carboxyl group.

The structural unit having a polar group is preferably a structural unit having an alicyclic hydrocarbon structure substituted with a polar group. Further, it is preferable that the structural unit having a polar group has no acid-decomposable group. As the alicyclic hydrocarbon structure in the alicyclic hydrocarbon structure substituted with a polar group, an adamantyl group or a norbornyl group is preferable.

Specific examples of a monomer corresponding to the structural unit having a polar group are shown below, but the present disclosure is not particularly limited to these specific examples. Further, the following specific examples are described as a methacrylic acid ester compound, but may be acrylic acid ester compounds.

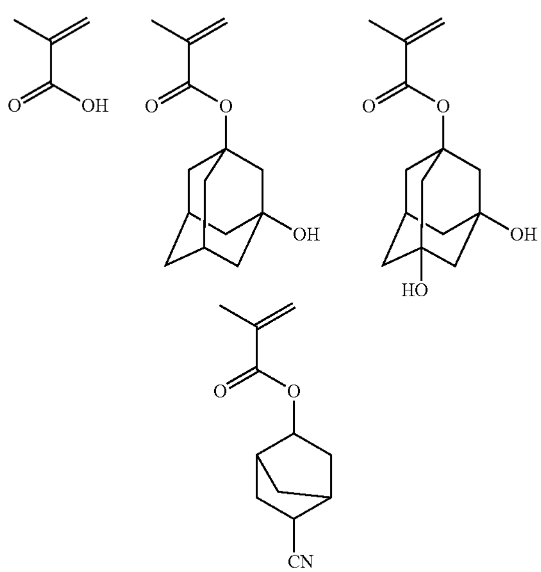

In addition, specific examples of the structural unit having a polar group include the structural units disclosed in paragraphs 0415 to 0433 of US2016/0070167A.

The resin (A) may include only one kind or a combination of two or more kinds of the structural unit having a polar group.

The content of the structural unit having a polar group is preferably 5% by mole to 40% by mole, more preferably 5% to 30% by mole, and still more preferably 10% by mole to 25% by mole, with respect to all the structural units in the resin (A).

[Structural Unit Having Neither Acid-Decomposable Group Nor Polar Group]

The resin (A) can further have a structural unit having neither an acid-decomposable group nor a polar group. The structural unit having neither an acid-decomposable group nor a polar group preferably has an alicyclic hydrocarbon structure. Examples of the structural unit having neither an acid-decomposable group nor a polar group include the structural units described in paragraphs 0236 and 0237 of US2016/0026083A. Preferred examples of a monomer corresponding to the structural unit having neither an acid-decomposable group nor a polar group are shown below.

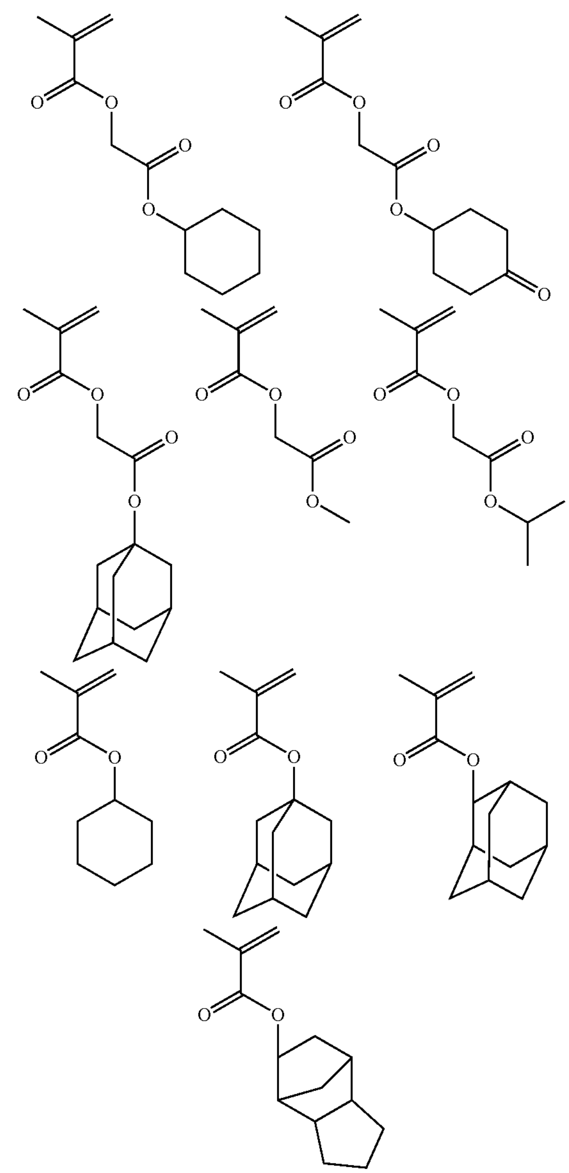

In addition, specific examples of the structural unit having neither an acid-decomposable group nor a polar group include the structural units disclosed in paragraph 0433 of US2016/0070167A.

The resin (A) may include only one kind or a combination of two or more kinds of the structural units having neither an acid-decomposable group nor a polar group.

The content of the structural unit having neither an acid-decomposable group nor a polar group is preferably 5% to 40% by mole, more preferably 5% to 30% by mole, and still more preferably 5% to 25% by mole, with respect to all the structural units in the resin (A).

The resin (A) may further have various structural units, in addition to the structural units, for the purpose of controlling dry etching resistance, suitability for a standard developer, adhesiveness to a substrate, a resist profile, or resolving power, heat resistance, sensitivity, and the like which are general characteristics required for a resist. Examples of such a structural unit include structural units corresponding to the other monomers, but are not particularly limited thereto.

Examples of such the other monomers include a compound having one addition-polymerizable unsaturated bond, which is selected from acrylic acid esters, methacrylic acid esters, acrylamides, methacrylamides, allyl compounds, vinyl ethers, vinyl esters, and the like.

In addition to these, an addition-polymerizable unsaturated compound that is copolymerizable with the monomers corresponding to various structural units as described above may be copolymerized.

In the resin (A), the molar ratio of each repeating structural unit contained is appropriately set in order to control various types of performance.

In a case where the photosensitive resin composition according to the present disclosure is for exposure with an argon fluoride (ArF) laser, from the viewpoint of transmittance of ArF light, it is preferable that the resin (A) does not substantially have an aromatic group. More specifically, the content of the structural unit having an aromatic group in all the structural units of the resin (A) is preferably 5% by mole or less, more preferably 3% by mole or less, and still more preferably ideally 0% by mole, that is, has no structural unit having an aromatic group. Further, the resin (A) preferably has a monocyclic or polycyclic alicyclic hydrocarbon structure.

It is preferable that all the structural units in the resin (A) are constituted with (meth)acrylate-based structural units. In this case, any of a resin in which all of the structural units are methacrylate-based structural units, a resin in which all of the structural units are acrylate-based structural units, and a resin in which all of the structural units are methacrylate-based structural units and acrylate-based structural units can be used, but it is preferable that the content of the acrylate-based structural units is 50% by mole or less with respect to all the structural units of the resin (A).

In a case where the photosensitive resin composition according to the present disclosure is for exposure with krypton fluoride (KrF), for exposure with electron beams (EB), or for exposure with extreme ultraviolet rays (EUV), it is preferable that the resin (A) includes a structural unit having an aromatic hydrocarbon group. It is more preferable that the resin (A) includes a structural unit having a phenolic hydroxyl group.

Examples of the structural unit having a phenolic hydroxyl group include a structural unit derived from hydroxystyrene and a structural unit derived from hydroxystyrene (meth)acrylate.

In a case where the photosensitive resin composition according to the present disclosure is for exposure with KrF, for exposure with EB, or for exposure with EUV, it is preferable that the resin (A) has a structure in which a hydrogen atom in a phenolic hydroxyl group is protected with a group (leaving group) that leaves through decomposition by the action of an acid.

The content of the structural unit having an aromatic hydrocarbon group included in the resin (A) is preferably 30% by mole to 100% by mole, more preferably 40% by mole to 100% by mole, and still more preferably 50% by mole to 100% by mole, with respect to all the structural units in the resin (A).

The weight-average molecular weight of the resin (A) is preferably 1,000 to 200,000, more preferably 2,000 to 20,000, still more preferably 3,000 to 15,000, and particularly preferably 3,000 to 11,000.

The dispersity (Mw/Mn) is preferably 1.0 to 3.0, more preferably 1.0 to 2.6, still more preferably 1.0 to 2.0, and particularly preferably 1.1 to 2.0.

Specific examples of the resin (A) include, but are not limited to, the resins A-1 to A-14 and A-21 to A-43 used in Examples.

The resin (A) may be used singly or in combination of two or more kinds thereof.

The content of the resin having a structural unit having an acid-decomposable group is preferably 20% by mass or more, more preferably 40% by mass or more, still more preferably 60% by mass or more, and particularly preferably 80% by mass or more, with respect to a total solid content of the photosensitive resin composition according to the present disclosure. An upper limit thereof is not particularly limited, but is preferably 99.5% by mass or less, more preferably 99% by mass or less, and still more preferably 97% by mass or less.

[Alkali-Soluble Resin Having Phenolic Hydroxyl Group]

In a case where the photosensitive resin composition according to the present disclosure contains a crosslinking agent (G) which will be described later, it is also preferable that the photosensitive resin composition according to the present disclosure is an alkali-soluble resin (hereinafter also referred to as a "resin (C)") having a phenolic hydroxyl group. It is preferable that the resin (C) has a structural unit having a phenolic hydroxyl group.

In this case, a negative tone pattern is suitably formed.

The crosslinking agent (G) may be in the form of being carried in the resin (C).

Furthermore, among the resins (C), those corresponding to a resin having a polarity that increases by the action of an acid are treated as a resin having a polarity that increases by the action of an acid. Further, in that case, the photosensitive resin composition according to the present disclosure preferably includes at least a resin (C) other than a resin having a polarity that increases by the action of an acid, and a resin having a polarity that increases by the action of an acid.

The resin (C) may contain the above-mentioned acid-decomposable group.

The structural unit having a phenolic hydroxyl group contained in the resin (C) is not particularly limited, and is preferably a structural unit represented by Formula (II).

(II)

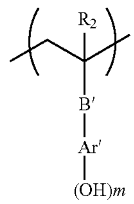

In Formula (II), $R_2$ represents a hydrogen atom, an alkyl group (preferably a methyl group) which may have a substituent, or a halogen atom (preferably a fluorine atom), B' represents a single bond or a divalent linking group, Ar' represents an aromatic ring group, and m represents an integer of 1 or more.

The resin (C) may be used singly or in combination of two or more kinds thereof.

The content of the resin (C) in the total solid content of the photosensitive resin composition according to the present disclosure is preferably 30% by mass or more, more preferably 40% by mass or more, and still more preferably 50% by mass or more. The upper limit is not particularly limited, but is preferably 99% by mass or less, more preferably 90% by mass or less, and still more preferably 85% by mass or less.

As the resin (C), a resin disclosed in paragraphs 0142 to 0347 of US2016/0282720A can be suitably used.

[Hydrophobic Resin]

The photosensitive resin composition according to the present disclosure preferably contains a hydrophobic resin (also referred to as a "hydrophobic resin (E)").

The photosensitive resin composition according to the present disclosure preferably includes at least a hydrophobic resin (E) other than the resin having a polarity that increases by the action of an acid, and a resin having a polarity that increases by the action of an acid.

By incorporating the hydrophobic resin (E) into the photosensitive resin composition according to the present disclosure, it is possible to control the static/dynamic contact angle at a surface of an actinic ray-sensitive or radiation-sensitive film. Thus, it becomes possible to improve development characteristics, suppress generation of out gas, improve immersion liquid tracking properties upon liquid immersion exposure, and reduce liquid immersion defects, for example.

It is preferable that the hydrophobic resin (E) is designed to be unevenly distributed on a surface of a resist film, but unlike the surfactant, the hydrophobic resin (E) does not necessarily have a hydrophilic group in a molecule thereof and does not necessarily contribute to uniform mixing of polar/non-polar materials.

In addition, in the present disclosure, a resin having a fluorine atom shall be treated as a hydrophobic resin and a fluorine-containing resin which will be described later. Further, it is preferable that the resin having a structural unit having an acid-decomposable group has no fluorine atom.

The hydrophobic resin (E) is preferably a resin including a structural unit having at least one selected from the group consisting of a "fluorine atom", a "silicon atom", and a "$CH_3$ partial structure which is contained in a side chain moiety of a resin" from the viewpoint of uneven distribution on a film surface layer.

In a case where the hydrophobic resin (E) includes a fluorine atom or a silicon atom, the fluorine atom or the silicon atom described above in the hydrophobic resin (E) may be included in the main chain of a resin or may be included in a side chain.

It is preferable that the hydrophobic resin (E) has at least one group selected from the following group of (x) to (z):

(x) an acid group, (y) a group that decomposes by the action of an alkali developer to increase a solubility in the alkali developer (hereinafter also referred to as a polarity converting group), and (z) a group that decomposes by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

As the acid group, the fluorinated alcohol group (preferably hexafluoroisopropanol group), the sulfonimido group, or the bis(alkylcarbonyl)methylene group is preferable.

Examples of the group (y) that decomposes by the action of an alkali developer to increase a solubility in the alkali developer include a lactone group, a carboxylic acid ester group (—COO—), an acid anhydride group (—C(O)OC(O)—), an acid imido group (—NHCONH—), a carboxylic acid thioester group (—COS—), a carbonic acid ester group (—OC(O)O—), a sulfuric acid ester group (—$OSO_2O$—), and a sulfonic acid ester group (—$SO_2O$—), and the lactone group or the carboxylic acid ester group (—COO—) is preferable.

Examples of the structural units including these groups include a structural unit in which the group is directly bonded to the main chain of a resin, such as a structural unit with an acrylic acid ester or a methacrylic acid ester. In this structural unit, the group may be bonded to the main chain of the resin through a linking group. Alternatively, the structural unit may also be incorporated into a terminal of the resin by using a polymerization initiator or chain transfer agent having the group during polymerization.

Examples of the structural unit having a lactone group include the same ones as the structural unit having a lactone structure as described earlier in the section of the resin (A).

The content of the structural unit having a group (y) that decomposes by the action of an alkali developer to increase a solubility in the alkali developer is preferably 1% to 100% by mole, more preferably 3% to 98% by mole, and still more preferably 5% to 95% by mole, with respect to all the structural units in the hydrophobic resin (E).

With respect to the hydrophobic resin (E), examples of the structural unit having a group (z) that decomposes by the action of an acid include the same ones as the structural units having an acid-decomposable group, as mentioned in the resin (A). The structural unit having a group (z) that decomposes by the action of an acid may have at least one of a fluorine atom or a silicon atom. The content of the structural units having a group (z) that decomposes by the action of an acid is preferably 1% by mole to 80% by mole, more preferably 10% by mole to 80% by mole, and still more preferably 20% by mole to 60% by mole, with respect to all the structural units in the resin (E).

The hydrophobic resin (E) may further have a structural unit which is different from the above-mentioned structural units.

The content of the structural units including a fluorine atom is preferably 10% by mole to 100% by mole, and more preferably 30% by mole to 100% by mole, with respect to all the structural units included in the hydrophobic resin (E). Further, the content of the structural units including a silicon atom is preferably 10% by mole to 100% by mole, and more preferably 20% by mole to 100% by mole, with respect to all the structural units included in the hydrophobic resin (E).

On the other hand, in a case where the hydrophobic resin (E) includes a $CH_3$ partial structure in the side chain moiety thereof, it is also preferable that the hydrophobic resin (E) has a form not having substantially any one of a fluorine atom and a silicon atom. Further, it is preferable that the hydrophobic resin (E) is substantially constituted with only structural units, which are composed of only atoms selected from a carbon atom, an oxygen atom, a hydrogen atom, a nitrogen atom, and a sulfur atom.

The weight-average molecular weight of the hydrophobic resin (E) in terms of standard polystyrene is preferably 1,000 to 100,000, and more preferably 1,000 to 50,000.

The total content of residual monomers and oligomer components included in the hydrophobic resin (E) is preferably 0.01% by mass to 5% by mass, and more preferably 0.01% by mass to 3% by mass. Further, the dispersity (Mw/Mn) is preferably in the range of 1 to 5, and more preferably in the range of 1 to 3.

As the hydrophobic resin (E), known resins can be appropriately selected and used singly or as a mixture. For example, the known resins disclosed in paragraphs 0451 to 0704 of US2015/0168830A1 and paragraphs 0340 to 0356 of US2016/0274458A1 can be suitably used as the hydrophobic resin (E). Further, the structural units disclosed in paragraphs 0177 to 0258 of US2016/0237190A1 are also preferable as a structural unit constituting the hydrophobic resin (E).

—Fluorine-Containing Resin—

The hydrophobic resin (E) is preferably a resin including a fluorine atom (also referred to as a "fluorine-containing resin").

In a case where the hydrophobic resin (E) includes a fluorine atom, it is preferable that the hydrophobic resin (E) is a resin having an alkyl group having a fluorine atom, a cycloalkyl group having a fluorine atom, or an aryl group having a fluorine atom as a partial structure having a fluorine atom.

The alkyl group having a fluorine atom is a linear or branched alkyl group, in which at least one hydrogen atom is substituted with a fluorine atom, preferably has 1 to 10 carbon atoms, and more preferably has 1 to 4 carbon atoms.

The cycloalkyl group having a fluorine atom is a monocyclic or polycyclic cycloalkyl group in which at least one hydrogen atom is substituted with a fluorine atom.

The aryl group having a fluorine atom is an aryl group such as a phenyl group and a naphthyl group, in which at least one hydrogen atom is substituted with a fluorine atom.

As each of the alkyl group having a fluorine atom, the cycloalkyl group having a fluorine atom, and the aryl group having a fluorine atom, groups represented by Formulae F2 to F4 are preferable.

Formula F2

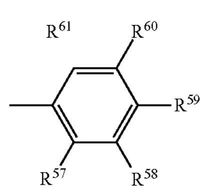

-continued

Formula F3

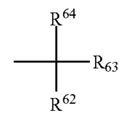

Formula F4

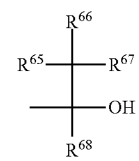

In Formulae F2 to F4, $R^{57}$ to $R^{68}$ each independently represent a hydrogen atom, a fluorine atom, or an (linear or branched) alkyl group. It should be noted that at least one of $R^{57}$, . . . , or $R^{61}$, at least one of $R^{62}$, . . . , or $R^{64}$, and at least one of $R^{65}$, . . . , or $R^{68}$ each independently represent a fluorine atom or an alkyl group in which at least one hydrogen atom is substituted with a fluorine atom.

It is preferable that all of $R^{57}$ to $R^{61}$ and $R^{65}$ to $R^{67}$ are fluorine atoms. $R^{62}$, $R^{63}$, and $R^{68}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R^{62}$ and $R^{63}$ may be linked to each other to form a ring.

Among those, from the viewpoint that the effects according to the present disclosure are more excellent, it is preferable that the fluorine-containing resin has alkali decomposability.

The expression, the fluorine-containing resin having alkali decomposability, means that after 10 minutes from adding 100 mg of a fluorine-containing resin to a mixed liquid of 2 mL of a buffer solution at pH 10 and 8 mL of THF and leaving the mixture to stand at 40° C., 30% by mole or more of the total amount of the decomposable groups in the fluorine-containing resin is hydrolyzed. Further, the decomposition rate can be calculated from a ratio of the raw materials to the decomposed products by means of NMR analysis.

From the viewpoints of tolerance of a focal depth, pattern linearity, improvement of development characteristics, suppression of outgas, improvement of immersion liquid followability in liquid immersion exposure, and reduction of immersion defects, it is preferable that the fluorine-containing resin has a structural unit represented by Formula X.

In addition, from the viewpoints of tolerance of a focal depth, pattern linearity, improvement of development characteristics, suppression of outgas, improvement of immersion liquid followability in liquid immersion exposure, and reduction of immersion defects, it is preferable that the photosensitive resin composition according to the present disclosure further includes a fluorine-containing resin having a structural unit represented by Formula X.

Formula X

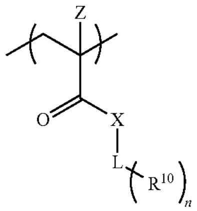

In Formula X, Z represents a halogen atom, a group represented by $R^{11}OCH_2$—, or a group represented by $R^{12}OC(=O)CH_2$—, $R^{11}$ and $R^{12}$ each independently represent a substituent, and X represents an oxygen atom or a sulfur atom. L represents an (n+1)-valent linking group, $R^{10}$ represents a group having a group that decomposes by the action of the aqueous alkali solution to increase a solubility of the fluorine-containing resin in the aqueous alkali solution, n represents a positive integer, and in a case where n is 2 or more, a plurality of $R^{10}$'s may be the same as or different from each other.

Examples of the halogen atom of Z include a fluorine atom, a chlorine atom, a bromine atom, and an iodine atom, and the fluorine atom is preferable.

Examples of the substituent as each of the $R^{11}$ and $R^{12}$ include an alkyl group (preferably having 1 to 4 carbon atoms), a cycloalkyl group (preferably having 6 to 10 carbon atoms), and an aryl group (preferably having 6 to 10 carbon atoms). Further, the substituent as each of $R^{11}$ and $R^{12}$ may further have a substituent, and examples of such additional substituent include an alkyl group (preferably having 1 to 4 carbon atoms), a halogen atom, a hydroxyl group, an alkoxy group (preferably having 1 to 4 carbon atoms), and a carboxyl group.

The linking group as L is preferably a divalent or trivalent linking group (in other words, n is preferably 1 or 2), and more preferably the divalent linking group (in other words, n is preferably 1). The linking group as L is preferably a linking group selected from the group consisting of an aliphatic group, an aromatic group, and a combination thereof.

For example, in a case where n is 1 and the linking group as L is a divalent linking group, examples of the divalent aliphatic group include an alkylene group, an alkenylene group, an alkynylene group, and a polyalkyleneoxy group. Among those, the alkylene group or the alkenylene group is preferable, and the alkylene group is more preferable.

The divalent aliphatic group may have either a chained structure or a cyclic structure, but preferably has the chained structure rather than the cyclic structure, and preferably has a linear structure rather than the branch-chained structure. The divalent aliphatic group may have a substituent and examples of the substituent include a halogen atom (a fluorine atom, a chlorine atom, a bromine atom, or an iodine atom), a hydroxyl group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, an arylamino group, and a diarylamino group.

Examples of the divalent aromatic group include arylene groups. Among those, the phenylene group and the naphthylene group are preferable.

The divalent aromatic group may have a substituent, and examples of the substituent include an alkyl group, in addition to the examples of the substituent with regard to the divalent aliphatic group.

In addition, L may be a divalent group formed by removing two hydrogen atoms at any position from the structure represented by each of Formula LC1-1 to Formula LC1-21 or Formula SL1-1 to Formula SL-3 as described above.

In a case where n is 2 or more, specific examples of the (n+1)-valent linking group include groups formed by removing any (n-1) hydrogen atoms from the specific examples of the divalent linking group as described above.

Specific examples of L include the following linking groups.

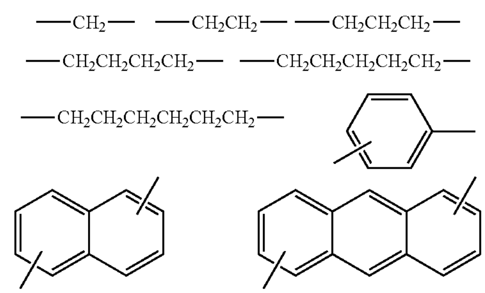

Moreover, these linking groups may further have a substituent as described above.

As $R^{10}$, a group represented by Formula W is preferable.

$$—Y—R^{20}$$ Formula W

In Formula W, Y represents a group that decomposes by the action of an aqueous alkali solution to increase a solubility in the aqueous alkali solution. $R^{20}$ represents an electron-withdrawing group.

Examples of Y include a carboxylic acid ester group (—COO— or OCO—), an acid anhydride group (—C(O)OC(O)—), an acid imido group (—NHCONH—), a carboxylic acid thioester group (—COS—), a carbonic acid ester group (—OC(O)O—), a sulfuric acid ester group (—$OSO_2O$—), and a sulfonic acid ester group (—$SO_2O$—), and the carboxylic acid ester group is preferable.

As the electron-withdrawing group, a partial structure represented by Formula EW is preferable. * in Formula EW represents the number of bonds directly linked to a group Y in Formula W.

Formula EW

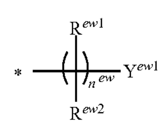

In Formula EW, $n^{ew}$ is a repetition number of the linking groups represented by —$C(R^{ew1})(R^{ew2})$— and represents an integer of 0 or 1. A case where $n^{ew}$ is 0 indicates that the bonding is formed by a single bond and $Y^{ew1}$ is directly bonded.

Examples of $Y^{ew1}$ include a halogen atom, a cyano group, a nitro group, a halo(cyclo)alkyl group or haloaryl group represented by —$C(R^{f1})(R^{f2})$—$R^{f3}$ which will be described later, an oxy group, a carbonyl group, a sulfonyl group, a sulfinyl group, and a combination thereof (It should be noted that in a case where $Y^{ew1}$ is a halogen atom, a cyano group, or a nitro group, $n^{ew}$ is 1.)

$R^{ew1}$ and $R^{ew2}$ each independently represent any group, and examples of the group include a hydrogen atom, an alkyl group (preferably having 1 to 8 carbon atoms), a cycloalkyl group (preferably having 3 to 10 carbon atoms), or an aryl group (preferably having 6 to 10 carbon atoms).

At least two of $R^{ew1}$, $R^{ew2}$, or $Y^{ew1}$ may be linked to each other to form a ring.

In addition, the "halo(cyclo)alkyl group" represents an alkyl group or cycloalkyl group which is at least partially halogenated, and the "haloaryl group" represents an aryl group which is at least partially halogenated.

As $Y^{ew1}$, a halogen atom, a halo(cyclo)alkyl group represented by —$C(R^{f1})(R^{f2})$—$R^{f3}$, or a haloaryl group is preferable.

$R^{f1}$ represents a halogen atom, a perhaloalkyl group, a perhalocycloalkyl group, or a perhaloaryl group, and is preferably a fluorine atom, a perfluoroalkyl group, or a perfluorocycloalkyl group, and more preferably the fluorine atom or a trifluoromethyl group.

$R^{f2}$ and $R^{f3}$ each independently represent a hydrogen atom, a halogen atom, or an organic group, and $R^{f2}$ and $R^{f3}$ may be linked to each other to form a ring. Examples of the organic group include an alkyl group, a cycloalkyl group, and an alkoxy group, and these may be substituted with a halogen atom (preferably a fluorine atom). It is preferable that $R^{f2}$ and $R^{f3}$ are each a (halo)alkyl group or a (halo) cycloalkyl group. It is more preferable that $R^{f2}$ represents the same group as $R^{f1}$ or is linked to $R^{f3}$ to form a ring.

Examples of the ring formed by the linking of $R^{f2}$ and $R^{f3}$ include a (halo)cycloalkyl ring.

The (halo)alkyl group in each of $R^{f1}$ to $R^{f3}$ may be linear or branched, and the linear (halo)alkyl group preferably has 1 to 30 carbon atoms, and more preferably 1 to 20 carbon atoms.

The (halo)cycloalkyl group in each of $R^{f1}$ to $R^{f3}$, or the ring formed by the linking of $R^{f2}$ and $R^{f3}$ may be monocyclic or polycyclic. In a case where the (halo)cycloalkyl group is polycyclic, the (halo)cycloalkyl group may be bridged. That is, in this case, the (halo)cycloalkyl group may have a crosslinked structure.

Examples of these (halo)cycloalkyl groups include those represented by the following formulae, and groups formed by halogenating the groups. Further, some of carbon atoms in the cycloalkyl group may be substituted with heteroatoms such as an oxygen atom.

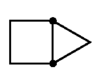
(1)

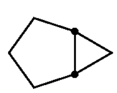
(2)

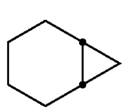
(3)

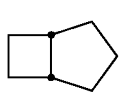
(4)

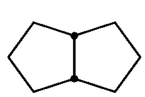
(5)

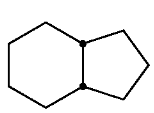
(6)

-continued

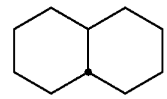
(7)

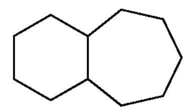
(8)

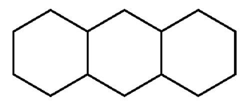
(9)

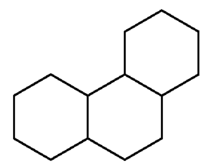
(10)

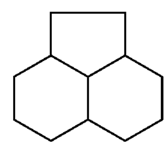
(11)

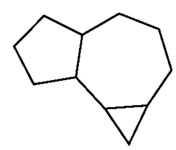
(12)

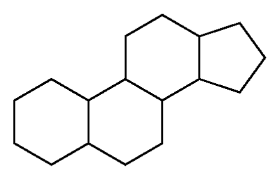
(13)

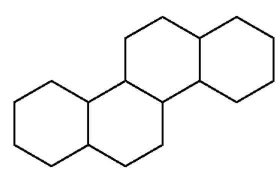
(14)

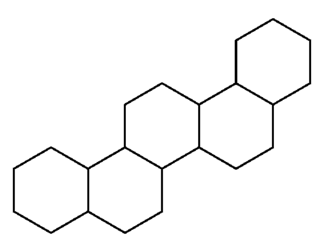
(15)

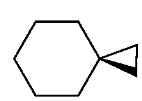
(16)

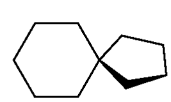
(17)

-continued
(18)
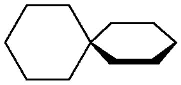
(19)
(20)
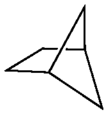
(21)
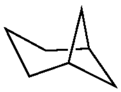
(22)
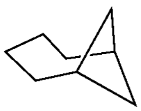
(23)
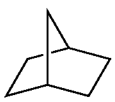
(24)
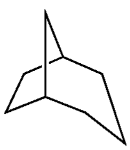
(25)
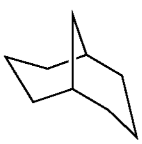
(26)
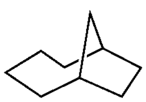
(27)
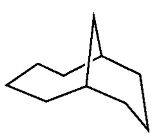
(28)
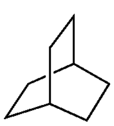
(29)
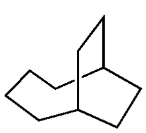
(30)
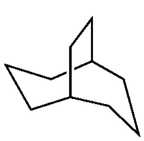
-continued
(31)
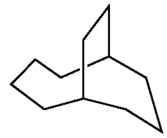
(32)
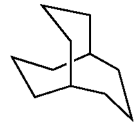
(33)
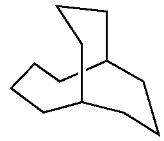
(34)
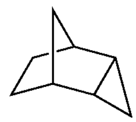
(35)
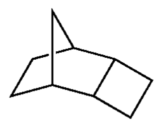
(36)
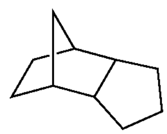
(37)
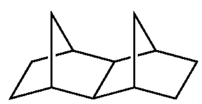
(38)
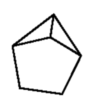
(39)
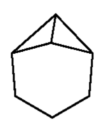
(40)
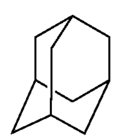
(41)
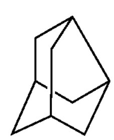
(42)
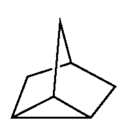

-continued (43)

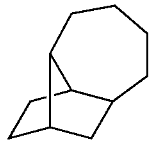

(44)

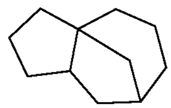

(45)

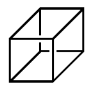

(46)

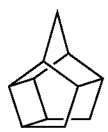

(47)

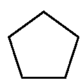

(48)

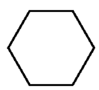

(49)

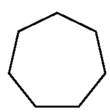

(50)

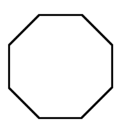

As the (halo)cycloalkyl group in each of $R^{f2}$ and $R^{f3}$, or a ring formed by the linking of $R^{f2}$ and $R^{f3}$, a fluorocycloalkyl group represented by $—C_{(n)}F_{(2n-2)}H$ is preferable. Here, the number of carbon atoms, n, is not particularly limited, but is preferably 5 to 13, and more preferably 6.

Examples of the (per)haloaryl group in $Y^{ew1}$ or $R^{f1}$ include a perfluoroaryl group represented by $—C_{(n)}F_{(n-1)}$. Here, the number of carbon atoms, n, is not particularly limited, but is preferably 5 to 13, and more preferably 6.

As a ring formed by the mutual linking of at least two of $R^{ew1}$, $R^{ew2}$, or $Y^{ew1}$, a cycloalkyl group or a heterocyclic group is preferable.

Each of the groups and the rings constituting the partial structure represented by Formula EW may further have a substituent.

In Formula W, $R^{20}$ is preferably an alkyl group substituted with one or more selected from the group consisting of a halogen atom, a cyano group, and a nitro group, more preferably an alkyl group substituted with a halogen atom (haloalkyl group), and still more preferably a fluoroalkyl group. The alkyl group substituted with one or more selected from the group consisting of a halogen atom, a cyano group, and a nitro group preferably has 1 to 10 carbon atoms, and more preferably 1 to 5 carbon atoms.

More specifically, $R^{20}$ is preferably an atomic group represented by $—C(R'^{1})(R^{f1})(R^{f2})$ or $—C(R'^{1})(R'^{2})(R^{f1})$.

$R'^{1}$ and $R'^{2}$ each independently represent a hydrogen atom or an alkyl group not substituted with an electron-withdrawing group (preferably an unsubstituted alkyl group). $R^{f1}$ and $R^{f2}$ each independently represent a halogen atom, a cyano group, a nitro group, or a perfluoroalkyl group.

The alkyl group as each of $R'^{1}$ and $R'^{2}$ may be linear or branched, and preferably has 1 to 6 carbon atoms.

The perfluoroalkyl group as each of $R^{f1}$ and $R^{f2}$ may be linear or branched, and preferably has 1 to 6 carbon atoms.

Specific preferred examples of $R^{20}$ include $—CF_3$, $—C_2F_5$, $—C_3F_7$, $—C_4F_9$, $—CF(CF_3)_2$, $—CF(CF_3)C_2F_5$, $—CF_2CF(CF_3)_2$, $—C(CF_3)_3$, $—C_5F_{11}$, $—C_6F_{13}$, $—C_7F_{15}$, $—C_8F_{17}$, $—CH_2CF_3$, $—CH_2C_2F_5$, $—CH_2C_3F_7$, $—CH(CF_3)_2$, $—CH(CF_3)C_2F_5$, $—CH_2CF(CF_3)_2$, and $—CH_2CN$. Among those, $—CF_3$, $—C_2F_5$, $—C_3F_7$, $—C_4F_9$, $—CH_2CF_3$, $—CH_2C_2F_5$, $—CH_2C_3F_7$, $—CH(CF_3)_2$, or $—CH_2CN$ is preferable, $—CH_2CF_3$, $—CH_2C_2F_5$, $—CH_2C_3F_7$, $—CH(CF_3)_2$, or $—CH_2CN$ is more preferable, $—CH_2C_2F_5$, $—CH(CF_3)_2$, or $—CH_2CN$ is still more preferable, and $—CH_2C_2F_5$ or $—CH(CF_3)_2$ is particularly preferable.

As the structural unit represented by Formula X, a structural unit represented by Formula X-1 or Formula X-2 is preferable, and the structural unit represented by Formula X-1 is more preferable.

Formula X-1

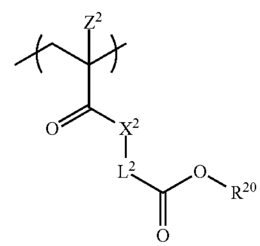

Formula X-2

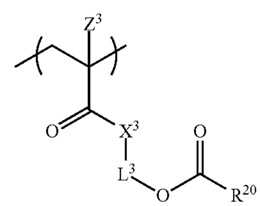

In Formula X-1, $R^{20}$ represents an electron-withdrawing group, $L^2$ represents a divalent linking group, $X^2$ represents an oxygen atom or a sulfur atom, and $Z^2$ represents a halogen atom.

In Formula X-2, $R^{20}$ represents an electron-withdrawing group, $L^3$ represents a divalent linking group, $X^3$ represents an oxygen atom or a sulfur atom, and $Z^3$ represents a halogen atom.

Specific examples and preferred examples of the divalent linking group of each of $L^2$ and $L^3$ include the same ones as described in L as the divalent linking group in Formula X.

The electron-withdrawing group as each of $R^2$ and $R^3$ is preferably the partial structure represented by Formula EW, specific examples and preferred examples thereof are the same as described above, but the halo(cyclo)alkyl group is more preferable.

In Formula X-1, $L^2$ and $R^2$ are not bonded to each other to form a ring in any case, and in Formula X-2, $L^3$ and $R^3$ are not bonded to each other to form a ring in any case.

$X^2$ and $X^3$ are each preferably an oxygen atom.

As each of $Z^2$ and $Z^3$, a fluorine atom or a chlorine atom is preferable, and the fluorine atom is more preferable.

In addition, as the structural unit represented by Formula X, a structural unit represented by Formula X-3 is also preferable.

Formula X-3

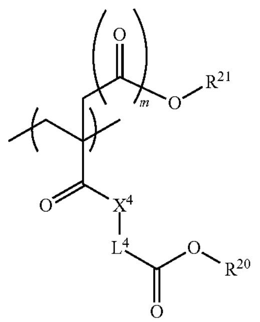

In Formula X-3, $R^{20}$ represents an electron-withdrawing group, $R^{21}$ represents a hydrogen atom, an alkyl group, or an aryl group, $L^4$ represents a divalent linking group, $X^4$ represents an oxygen atom or a sulfur atom, and m represents 0 or 1.

Specific examples and preferred examples of the divalent linking group of $L^4$ include the same ones as described in L as the divalent linking group in Formula X).

The electron-withdrawing group as $R^4$ is preferably the partial structure represented by Formula EW, specific examples and preferred examples thereof are the same as described above, but the halo(cyclo)alkyl group is more preferable.

Furthermore, in Formula X-3, $L^4$ and $R^4$ are not bonded to each other to form a ring in any case.

As $X^4$, an oxygen atom is preferable.

Moreover, as the structural unit represented by Formula X, a structural unit represented by Formula Y-1 or a structural unit represented by Formula Y-2 is also preferable.

Formula Y-1

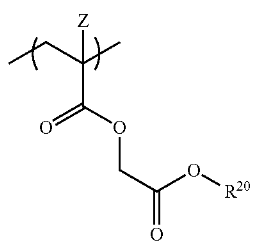

Formula Y-2

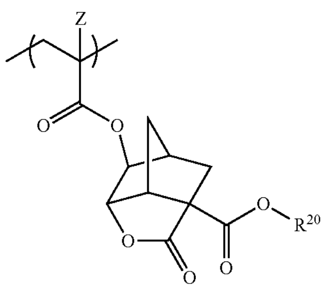

In Formulae Y-1 and Y-2, Z represents a halogen atom, a group represented by $R^{11}OCH_2$—, or a group represented by $R^{12}OC(=O)CH_2$—, $R^{11}$ and $R^{12}$ each independently represent a substituent, and $R^{20}$ represents an electron-withdrawing group.

The electron-withdrawing group as $R^{20}$ is preferably the partial structure represented by Formula EW, specific examples and preferred examples thereof are the same as described above, but the halo(cyclo)alkyl group is more preferable.

Specific examples and preferred examples of the halogen atom, the group represented by $R^{11}OCH_2$—, or the group represented by $R^{12}OC(=O)CH_2$— as Z include the same ones as described in Formula 1.

The content of the structural unit represented by Formula X is preferably 10% by mole to 100% by mole, more preferably 20% by mole to 100% by mole, and still more preferably 30% by mole to 100% by mole, with respect to all the structural units of the fluorine-containing resin.

Preferred examples of the structural unit constituting the hydrophobic resin (E) are shown below.

Preferred examples of the hydrophobic resin (E) include resins formed by optionally combining these structural units or resins E-1 to E-23 used in Examples, but are not limited thereto.

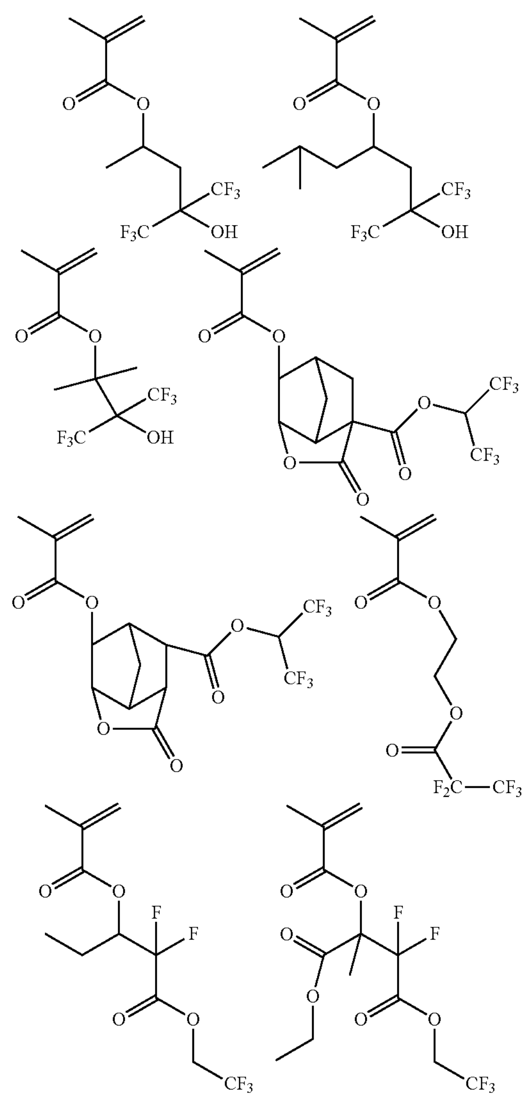

-continued

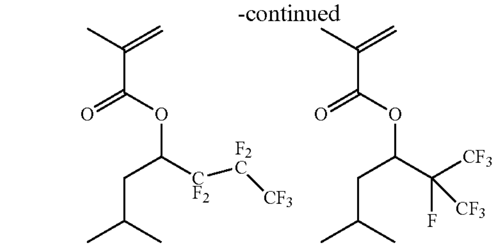

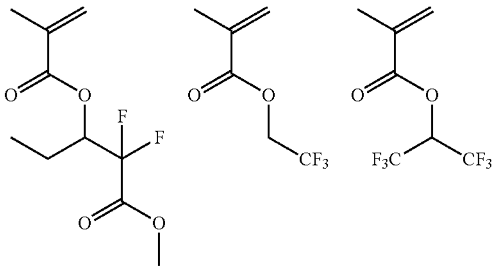

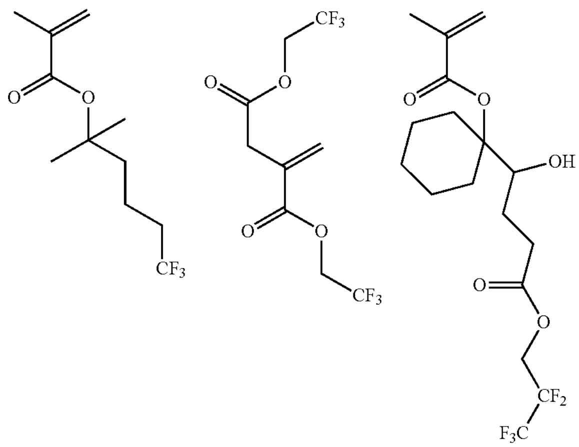

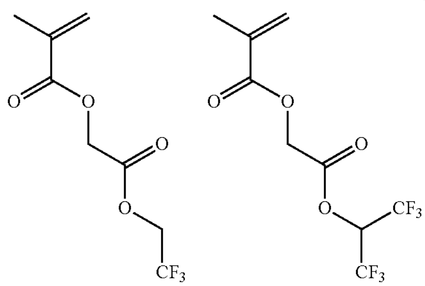

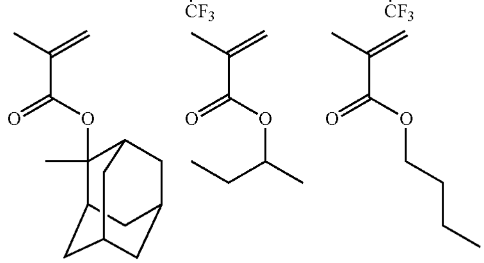

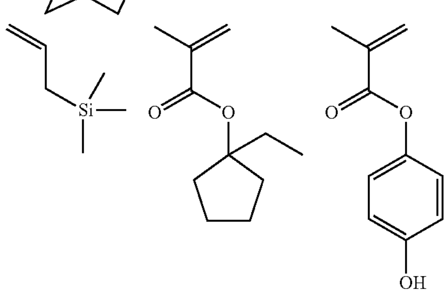

-continued

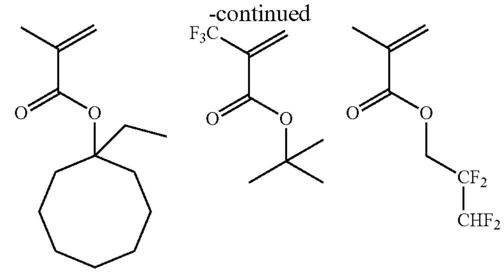

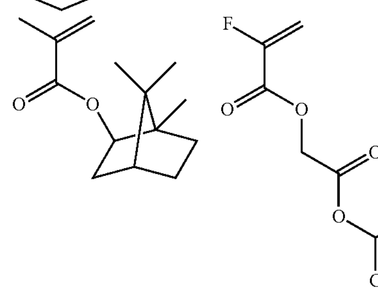

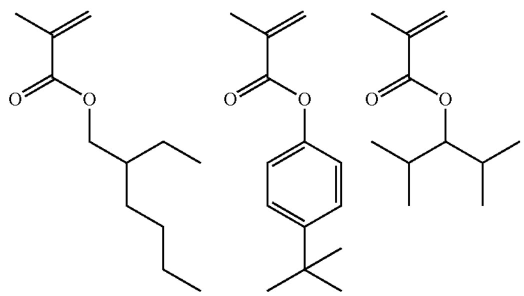

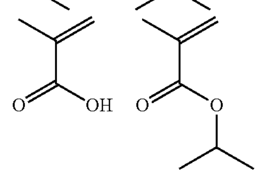

The hydrophobic resins (E) may be used singly or in combination of two or more kinds thereof.

It is preferable to use a mixture of two or more kinds of hydrophobic resins (E) having different levels of surface energy from the viewpoint of satisfying both the immersion liquid tracking properties and the development characteristics upon liquid immersion exposure.

The content of the hydrophobic resin (E) in the composition is preferably 0.01% by mass to 10% by mass, and more preferably 0.05% by mass to 8% by mass, with respect to the total solid content in the photosensitive resin composition according to the present disclosure.

<Photoacid Generator>

The composition according to the present disclosure preferably includes a photoacid generator (hereinafter also referred to as a "photoacid generator (B)").

The photoacid generator is a compound that generates an acid upon irradiation with actinic rays or radiation.

As the photoacid generator, a compound that generates an organic acid upon irradiation with actinic rays or radiation is preferable. Examples thereof include a sulfonium salt compound, an iodonium salt compound, a diazonium salt compound, a phosphonium salt compound, an imide sulfonate compound, an oxime sulfonate compound, a diazodisulfone compound, a disulfone compound, and an o-nitrobenzyl sulfonate compound.

As the photoacid generator, known compounds that generate an acid upon irradiation with actinic rays or radiation can be appropriately selected and used singly or as a mixture thereof. For example, the known compounds disclosed in paragraphs 0125 to 0319 of US2016/0070167A1, paragraphs 0086 to 0094 of US2015/0004544A1, and paragraphs 0323 to 0402 of US2016/0237190A1 can be suitably used as the photoacid generator (B).

[Compounds Represented by Formulae ZI, ZII, and ZIII]

Suitable aspects of the photoacid generator (B) include, for example, compounds represented by Formulae ZI, ZII, and ZIII.

Formula ZI

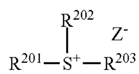

Formula ZII

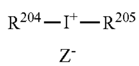

Formula ZIII

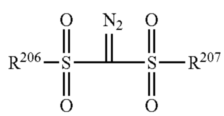

In Formula ZI, $R^{201}$, $R^{202}$, and $R^{203}$ each independently represent an organic group.

The number of carbon atoms of the organic group as each of $R^{201}$, $R^{202}$, and $R^{203}$ is preferably 1 to 30, and more preferably 1 to 20.

In addition, two of $R^{201}$ to $R^{203}$ may be bonded to each other to form a ring structure, and the ring may include an oxygen atom, a sulfur atom, an ester bond, an amide bond, or a carbonyl group. Examples of the group formed by the bonding of two of $R^{201}$ to $R^{203}$ include an alkylene group (for example, a butylene group and a pentylene group) and —$CH_2$—$CH_2$—O—$CH_2$—$CH_2$—.

$Z^-$ represents an anion.

[Cation in Compound Represented by Formula ZI]

Suitable aspects of the cation in Formula ZI include the corresponding groups in compounds (ZI-1), (ZI-2), (ZI-3), and (ZI-4) which will be described later.

In addition, the photoacid generator (C) may be a compound having a plurality of the structures represented by Formula ZI. For example, it may be a compound having a structure in which at least one of $R^{201}$, . . . , or $R^{203}$ in the compound represented by Formula ZI is bonded to at least one of $R^{201}$, . . . , or $R^{203}$ of another compound represented by Formula ZI through a single bond or a linking group.

—Compound ZI-1—

First, the compound (ZI-1) will be described.

The compound (ZI-1) is an arylsulfonium compound in which at least one of $R^{201}$ or $R^{203}$ in Formula ZI is an aryl group, that is, a compound having arylsulfonium as a cation.

In the arylsulfonium compound, all of $R^{201}$ to $R^{203}$ may be aryl groups, or some of $R^{201}$ to $R^{203}$ may be aryl groups and the remainders may be alkyl groups or cycloalkyl groups.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

As the aryl group included in the arylsulfonium compound, a phenyl group or a naphthyl group is preferable, and the phenyl group is more preferable. The aryl group may be an aryl group having a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, these two or more aryl groups may be the same as or different from each other.

The alkyl group or the cycloalkyl group which may be contained, as necessary, in the arylsulfonium compound, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of each of $R^{201}$ to $R^{203}$ may each independently have an alkyl group (for example, an alkyl group having 1 to 15 carbon atoms), a cycloalkyl group (for example, a cycloalkyl group having 3 to 15 carbon atoms), an aryl group (for example, an aryl group having 6 to 14 carbon atoms), an alkoxy group (for example, an alkoxy group having 1 to 15 carbon atoms), a halogen atom, a hydroxyl group, or a phenylthio group as a substituent.

—Compound ZI-2—

Next, the compound (ZI-2) will be described.

The compound (ZI-2) is a compound in which $R^{201}$ to $R^{203}$ in Formula (ZI) are each independently an organic group having no aromatic ring. Here, the aromatic ring also encompasses an aromatic ring containing a heteroatom.

The organic group as each of $R^{201}$ to $R^{203}$, which contains no aromatic ring, preferably has y1 to 30 carbon atoms, and more preferably has 1 to 20 carbon atoms.

$R^{201}$ to $R^{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

Preferred examples of the alkyl group and the cycloalkyl group of each of $R^{201}$ to $R^{203}$ include a linear alkyl group having 1 to 10 carbon atoms or a branched alkyl group having 3 to 10 carbon atoms (for example, a methyl group, an ethyl group, a propyl group, a butyl group, and a pentyl group), and a cycloalkyl group having 3 to 10 carbon atoms (for example, a cyclopentyl group, a cyclohexyl group, and a norbornyl group).

$R^{201}$ to $R^{203}$ may further be substituted with a halogen atom, an alkoxy group (for example, an alkoxy group having 1 to 5 carbon atoms), a hydroxyl group, a cyano group, or a nitro group.

—Compound ZI-3—

Next, the compound (ZI-3) will be described.

The compound (ZI-3) is a compound which is represented by Formula ZI-3 and has a phenacylsulfonium salt structure.

Formula ZI-3

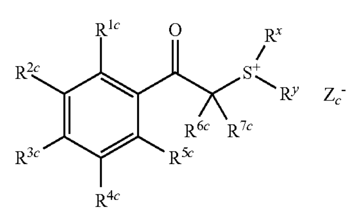

In Formula ZI-3, $R^{1c}$ to $R^{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, $R^{6c}$ and $R^{7c}$ each independently represents a hydrogen atom, an alkyl group, a cycloalkyl group, a halogen atom, a cyano group, or an aryl group, and $R^x$ and $R^y$ each independently represent an alkyl group, a cycloalkyl group, a 2-oxoalkyl group, a 2-oxocycloalkyl group, an alkoxycarbonylalkyl group, an allyl group, or a vinyl group.

Each of any two or more of $R^{1c}$, . . . , or $R^{5c}$, and $R^{5c}$ and $R^{6c}$, $R^{6c}$ and $R^{7c}$, $R^{5c}$ and $R^x$, and $R^x$ and $R^y$ may be bonded to each other to form a ring structure, and this ring structure may each independently include an oxygen atom, a sulfur atom, a ketone group, an ester bond, or an amide bond.

Examples of the ring structure include an aromatic or non-aromatic hydrocarbon ring, an aromatic or non-aromatic heterocycle, or a polycyclic fused ring composed of two or more of these rings. Examples of the ring structure include 3- to 10-membered rings, and the ring structures are preferably 4- to 8-membered ring, and more preferably 5- or 6-membered rings.

Examples of the group formed by the bonding of each of any two or more of $R^{1c}$, . . . , or $R^{5c}$, $R^{6c}$ and $R^{7c}$, and $R^x$ and $R^y$ include a butylene group and a pentylene group.

As groups formed by the bonding of $R^{5c}$ and $R^{6c}$, and $R^{5c}$ and $R^x$, a single bond or an alkylene group is preferable. Examples of the alkylene group include a methylene group and an ethylene group.

$Zc^-$ represents an anion.

—Compound ZI-4—

Next, the compound (ZI-4) will be described.

The compound (ZI-4) is represented by Formula ZI-4.

Formula ZI-4

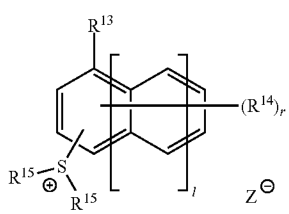

In Formula ZI-4, l represents an integer of 0 to 2, r represents an integer of 0 to 8, $R^{13}$ represents a hydrogen atom, a fluorine atom, a hydroxyl group, an alkyl group, a cycloalkyl group, an alkoxy group, an alkoxycarbonyl group, or a group having a cycloalkyl group, each of which may have a substituent, $R^{14}$'s each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group, each of which may have a substituent, $R^{15}$'s each independently represent an alkyl group, a cycloalkyl group, or a naphthyl group, each of which may have a substituent, and two $R^{15}$'s may be bonded to each other to form a ring.

In a case where two $R^{15}$'s are bonded to each other to form a ring, the ring skeleton may include a heteroatom such as an oxygen atom and a nitrogen atom. In one aspect, it is preferable that two $R^{15}$'s are alkylene groups, and are bonded to each other to form a ring structure.

$Z^-$ represents an anion.

In Formula ZI-4, the alkyl group of each of $R^{13}$, $R^{14}$, and $R^{15}$ is linear or branched, the number of carbon atoms of the alkyl group is preferably 1 to 10, and as the alkyl group, a methyl group, an ethyl group, an n-butyl group, a t-butyl group, or the like is more preferable.

[Cation in Compound Represented by Formula ZII or Formula ZIII]

Next, Formulae ZII and ZIII will be described.

In Formulae ZII and ZIII, $R^{204}$ to $R^{207}$ each independently represent an aryl group, an alkyl group, or a cycloalkyl group.

As the aryl group of each of $R^{204}$ to $R^{207}$, a phenyl group or a naphthyl group is preferable, and the phenyl group is more preferable. The aryl group of each of $R^{204}$ to $R^{207}$ may be an aryl group having a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group of each of $R^{204}$ to $R^{207}$ include a linear alkyl group having 1 to 10 carbon atoms or a branched alkyl group having 3 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group).

The aryl group, the alkyl group, and the cycloalkyl group of each of $R^{204}$ to $R^{207}$ may each independently have a substituent. Examples of the substituent which may be contained in the aryl group, the alkyl group, or the cycloalkyl group of each of $R^{204}$ to $R^{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion.

[Anions in Compounds Represented by Formula ZI to Formula ZIII]

As $Z^-$ in Formula ZI, $Z^-$ in Formula ZII, $Zc^-$ in Formula ZI-3, and $Z^-$ in Formula ZI-4, an anion represented by Formula An-1 is preferable.

Formula An-1

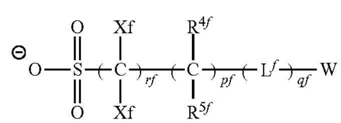

In Formula An-1, pf represents an integer of 0 to 10, qf represents an integer of 0 to 10, rf represents an integer of 1 to 3, Xf's each independently represent a fluorine atom or an alkyl group substituted with at least one fluorine atom, in a case where rf is an integer of 2 or more, a plurality of $—C(Xf)_2$-'s may be the same as or different from each other, $R^{4f}$ and $R^{5f}$ each independently represent a hydrogen atom, a fluorine atom, an alkyl group, or an alkyl group substituted with at least one fluorine atom, in a case where pf is an integer of 2 or more, a plurality of $—CR^{4f}R^{5f}—$'s may be the same as or different from each other, $L^f$ represents a divalent linking group, in a case where qf is an integer of 2 or more, a plurality of $L^f$'s may be the same as or different from each other, and W represents an organic group including a cyclic structure.

Xf represents a fluorine atom or an alkyl group substituted with at least one fluorine atom. The number of carbon atoms of the alkyl group is preferably 1 to 10, and more preferably 1 to 4. Further, the alkyl group substituted with at least one fluorine atom is preferably a perfluoroalkyl group.

Xf is preferably the fluorine atom or the perfluoroalkyl group having 1 to 4 carbon atoms. Xf is more preferably the fluorine atom or $CF_3$. It is particularly preferable that both Xf's are fluorine atoms.

$R^{4f}$ and $R^{5f}$ each independently represent a hydrogen atom, a fluorine atom, an alkyl group, or an alkyl group substituted with at least one fluorine atom. In a case where a plurality of each of $R^{4f}$'s and $R^{5f}$'s are present, $R^{4f}$'s and $R^{5f}$'s may be the same as or different from each other.

The alkyl group represented by each of $R^{4f}$ and $R^{5f}$ may have a substituent, and preferably has 1 to 4 carbon atoms. $R^{4f}$ and $R^{5f}$ are each preferably a hydrogen atom. Specific examples and suitable aspects of the alkyl group substituted with at least one fluorine atom are the same as the specific examples and the suitable aspects of Xf in Formula An-1.

$L^f$ represents a divalent linking group, and in a case where a plurality of $L^f$'s are present, $L^f$'s may be the same as or different from each other.

Examples of the divalent linking group include —COO— (—C(═O)—O—), —OCO—, —CONH—, —NHCO—, —CO—, —O—, —S—, —SO—, —$SO_2$—, an alkylene group (preferably having 1 to 6 carbon atoms), a cycloalkylene group (preferably having 3 to 15 carbon atoms), an alkenylene group (preferably having 2 to 6 carbon atoms), or a divalent linking group formed by combination of these plurality of groups. Among these, —COO—, —OCO—, —CONH—, —NHCO—, —CO—, —O—, —$SO_2$—, —COO-alkylene group-, —OCO-alkylene group-, —CONH-alkylene group-, or —NHCO-alkylene group- is preferable, and —COO—, —OCO—, —CONH—, —$SO_2$—, —COO-alkylene group-, or —OCO-alkylene group- is more preferable.

W represents an organic group including a cyclic structure. Among these, W is preferably a cyclic organic group.

Examples of the cyclic organic group include an alicyclic group, an aryl group, and a heterocyclic group.

The alicyclic group may be monocyclic or polycyclic. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group is preferable.

The aryl group may be monocyclic or polycyclic. Examples of the aryl group include a phenyl group, a naphthyl group, a phenanthryl group, and an anthryl group.

The heterocyclic group may be monocyclic or polycyclic. In a case where it is polycyclic, it is possible to suppress acid diffusion. Further, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle not having aromaticity include a tetrahydropyran ring, a lactone ring, a sultone ring, and a decahydroisoquinoline ring. Examples of the lactone ring and the sultone ring include the above-mentioned lactone structures and sultone structures exemplified in the resin. As the heterocycle in the heterocyclic group, a furan ring, a thiophene ring, a pyridine ring, or a decahydroisoquinoline ring is particularly preferable.

The cyclic organic group may have a substituent. Examples of the substituent include, an alkyl group (which may be linear or branched, and preferably has 1 to 12 carbon atoms), a cycloalkyl group (which may be any one of a monocycle, a polycycle, and a spiro ring, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group. Incidentally, the carbon constituting the cyclic organic group (carbon contributing to ring formation) may be carbonyl carbon.

Preferred examples of the anion represented by Formula An-1 include $SO_3$—$CF_2$—$CH_2$—OCO-($L^f$)q'—W, $SO_3^-$—$CF_2$—CHF—$CH_2$—OCO-($L^f$)q'—W, $SO_3^-$—$CF_2$—COO-($L^f$)q'—W, $SO_3^-$—$CF_2$—$CF_2$—$CH_2$—$CH_2$-$(L^f)_{qf}$-W, and $SO_3^-$—$CF_2$—CH($CF_3$)—OCO-($L^f$)q'—W. Here, $L^f$, qf, and W are each the same as in Formula An-1. q' represents an integer of 0 to 10.

In one aspect, as $Z^-$ in Formula ZI, $Z^-$ in Formula ZII, $Zc^-$ in Formula ZI-3, and $Z^-$ in Formula ZI-4, an anion represented by Formula 4 is also preferable.

Formula 4

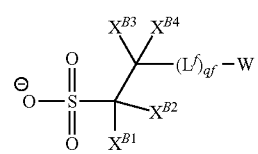

In Formula 4, $X^{B1}$ and $X^{B2}$ each independently represent a hydrogen atom or a monovalent organic group having no fluorine atom. $X^{B1}$ and $X^{B2}$ are each preferably a hydrogen atom.

$X^{B3}$ and $X^{B4}$ each independently represent a hydrogen atom or a monovalent organic group. It is preferable that at least one of $X^{B3}$ or $X^{B4}$ is a fluorine atom or a monovalent organic group having a fluorine atom, and it is more preferable that both of $X^{B3}$ and $X^{B4}$ area fluorine atom or a monovalent organic group having a fluorine atom. It is still more preferable that $X^{B3}$ and $X^{B4}$ are both an alkyl group substituted with a fluorine atom.

$L^f$, qf, and W are the same as those in Formula 3.

As $Z^-$ in Formula ZI, $Z^-$ in Formula ZII, $Zc^-$ in Formula ZI-3, and $Z^-$ in Formula ZI-4, an anion represented by Formula 5 is preferable.

Formula 5

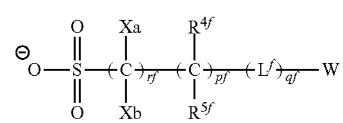

In Formula 5, Xa's each independently represent a fluorine atom or an alkyl group substituted with at least one fluorine atom, and Xb's each independently represent a hydrogen atom or an organic group having no fluorine atom.

The definitions and preferred aspects of rf, pf, qf, $R^{4f}$, $R^{5f}$, $L^f$, and W are each the same as those in Formula 3.

$Z^-$ in Formula ZI, $Z^-$ in Formula ZII, $Zc^-$ in Formula ZI-3, and $Z^-$ in Formula ZI-4 may be a benzenesulfonate anion, and are each preferably a benzenesulfonate anion substituted with a branched alkyl group or a cycloalkyl group.

As $Z^-$ in Formula ZI, $Z^-$ in Formula ZII, $Zc^-$ in Formula ZI-3, and $Z^-$ in Formula ZI-4, an aromatic sulfonate anion represented by Formula SA1 is also preferable.

Formula SA1

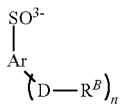

In Formula SA1, Ar represents an aryl group and may further have a substituent other than a sulfonate anion and -(D-$R^B$). Examples of the substituent that may further be contained include a fluorine atom and a hydroxyl group.

n represents an integer of 0 or more. n is preferably 1 to 4, more preferably 2 or 3, and particularly preferably 3.

D represents a single bond or a divalent linking group. Examples of the divalent linking group include an ether group, a thioether group, a carbonyl group, a sulfoxide group, a sulfone group, a sulfonic acid ester group, an ester group, and a group formed by combination of two or more kinds of these groups.

$R^B$ represents a hydrocarbon group.

It is preferable that D is the single bond and $R^B$ is an aliphatic hydrocarbon structure. It is more preferable that $R^B$ is an isopropyl group or a cyclohexyl group.

Preferred examples of the sulfonium cation in Formula ZI and the sulfonium cation or iodonium cation in Formula ZII are shown below.

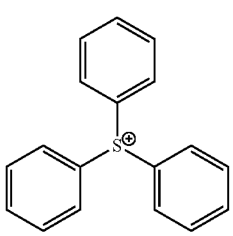

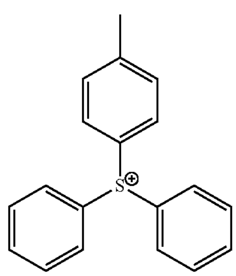

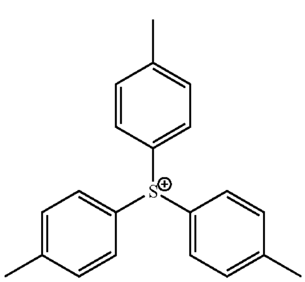

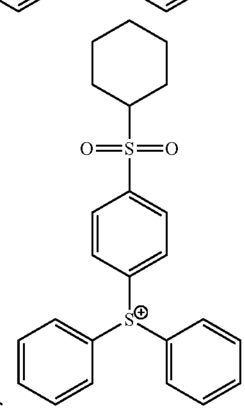

-continued

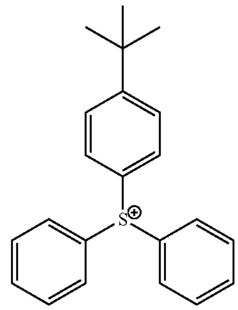

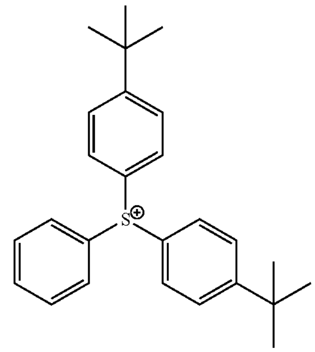

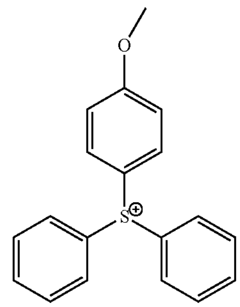

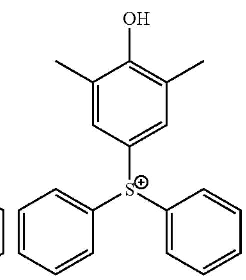

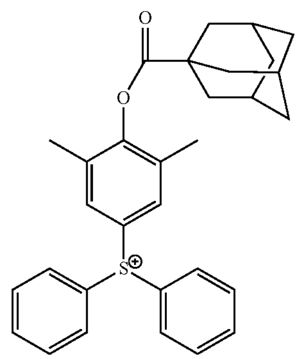

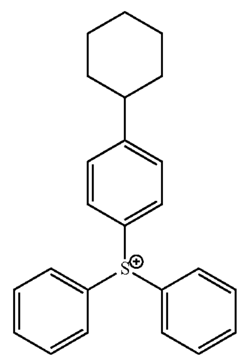

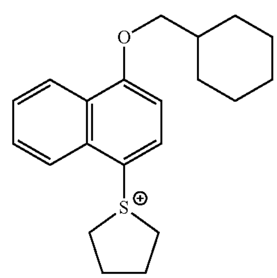

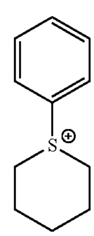

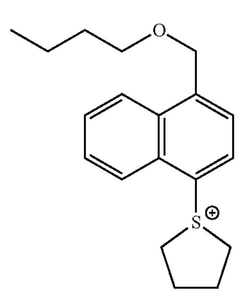

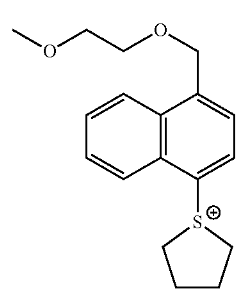

-continued
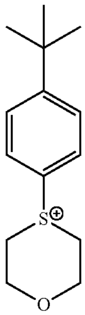
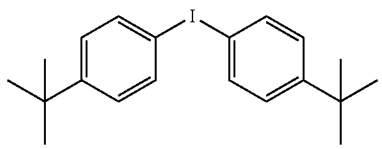
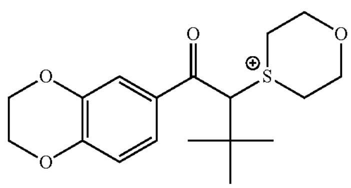
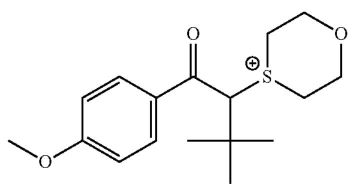
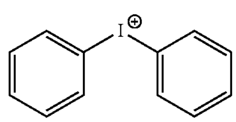
Preferred examples of the anion Z⁻ in Formula ZI and Formula ZII, Zc⁻ in Formula ZI-3, and Z⁻ in Formula ZI-4 are shown below.
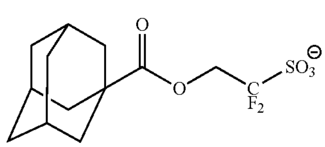
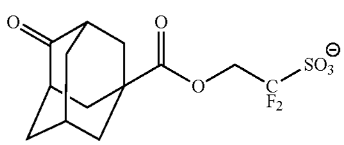
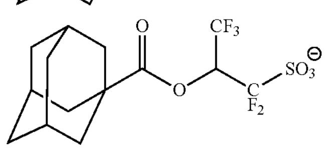
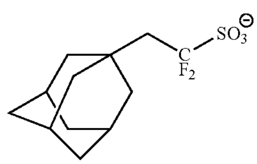
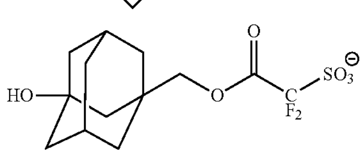
-continued
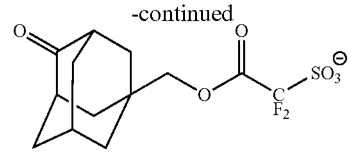
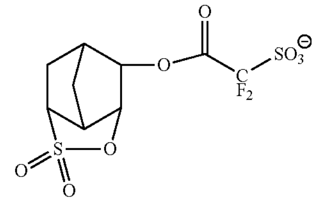
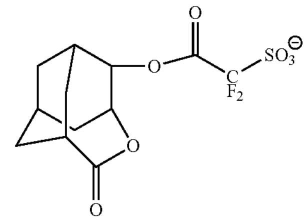
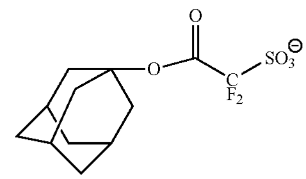
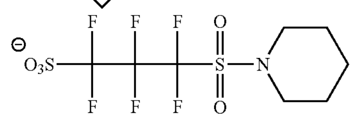
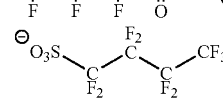
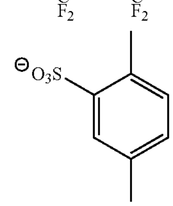
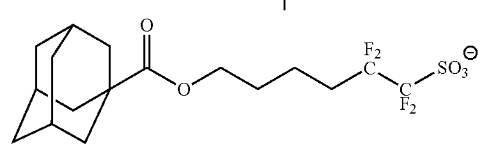
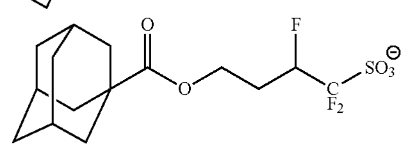
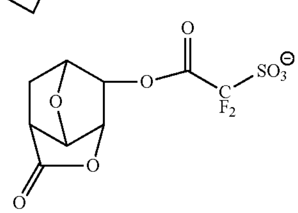
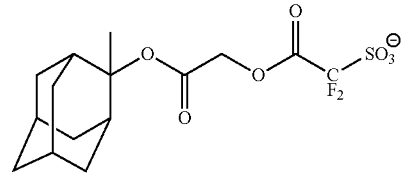

-continued

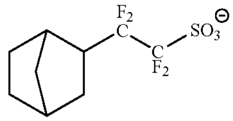

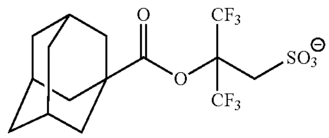

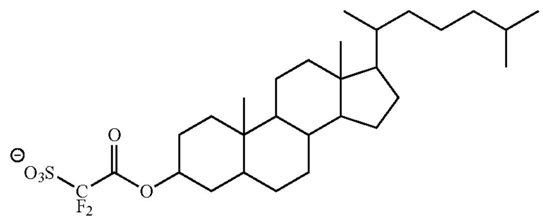

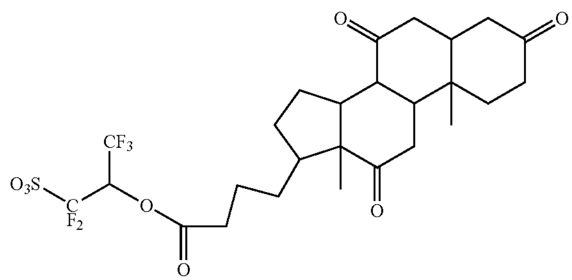

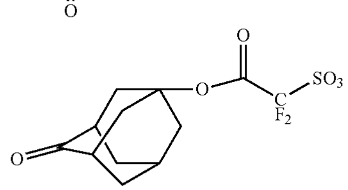

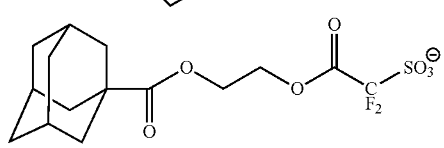

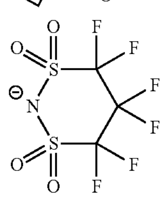

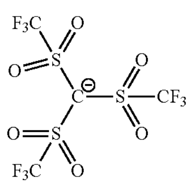

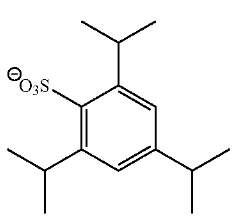

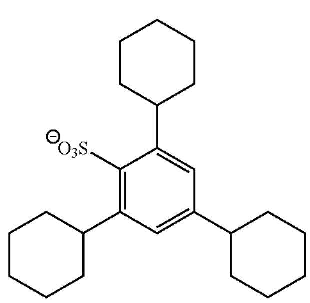

The cation and the anion can be optionally combined and used as a photoacid generator.

Among those, it is preferable that the photoacid generator is an ionic compound including a cation and an anion, and the anion includes an ion represented by any one of Formula An-1. Formula An-2. and Formula An-3.

Formula An-2

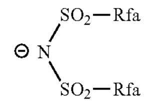

Formula An-3

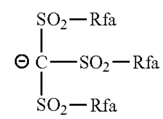

In Formula An-2 and Formula An-3, Rfa's each independently represent a monovalent organic group having a fluorine atom, and a plurality of Rfa's may be bonded to each other to form a ring.

Rfa is preferably an alkyl group substituted with at least one fluorine atom. The number of carbon atoms of the alkyl group is preferably 1 to 10, and more preferably 1 to 4. Further, the alkyl group substituted with at least one fluorine atom is preferably a perfluoroalkyl group.

In addition, it is preferable that a plurality of Rfa's are bonded to each other to form a ring.

The photoacid generator may be in a form of a low-molecular-weight compound or in a form incorporated into a part of a polymer. Further, the form of a low-molecular-weight compound and the form incorporated into a part of a polymer may also be used in combination.

The photoacid generator is preferably in the form of the low-molecular-weight compound.

In a case where the photoacid generator is in the form of the low-molecular-weight compound, the molecular weight is preferably 3,000 or less, more preferably 2,000 or less, and still more preferably 1,000 or less.

In a case where the photoacid generator is in the form incorporated into a part of a polymer, it may be incorporated into the above-mentioned resin (A) or into a resin other than the resin (A).

The photoacid generators may be used singly or in combination of two or more kinds thereof.

The content of the photoacid generator (the total content in a case where a plurality of the photoacid generators are present) in the composition is preferably 0.1% by mass to 35% by mass, more preferably 0.5% by mass to 25% by mass, still more preferably 3% by mass to 20% by mass, and particularly preferably 3% by mass to 15% by mass, with respect to the total solid content of the composition.

In a case where the compound represented by Formula ZI-3 or Formula ZI-4 is included as the photoacid generator, the content of the photoacid generator (the total content in a case where a plurality of the photoacid generators are present) included in the composition is preferably 5% by mass to 35% by mass, and more preferably 7% by mass to 30% by mass, with respect to the total solid content of the composition.

<Acid Diffusion Control Agent>

The photosensitive resin composition according to the present disclosure preferably contains an acid diffusion control agent (also referred to as an "acid diffusion control agent (D)").

The acid diffusion control agent (D) acts as a quencher that suppresses a reaction of the acid-decomposable resin in the unexposed area by excessive generated acids by trapping the acids generated from an acid generator or the like upon exposure. For example, a basic compound (DA), a basic compound (DB) having a basicity that is reduced or lost upon irradiation with actinic rays or radiation, an onium salt (DC) which becomes a relatively weak acid with respect to the acid generator, a low-molecular-weight compound (DD) which has a nitrogen atom and a group that leaves by the action of an acid, an onium salt compound (DE) having a nitrogen atom in a cationic moiety, or the like can be used as the acid diffusion control agent.

Among those, from the viewpoint of the linearity of a pattern thus obtained after the lapse of time, the photosensitive resin composition according to the present disclosure preferably includes a nitrogen-containing compound, and more preferably includes a nitrogen-containing basic compound, as the acid diffusion control agent.

In the photosensitive resin composition according to the present disclosure, a known acid diffusion control agent can be appropriately used. For example, the known compounds disclosed in paragraphs 0627 to 0664 of US2016/0070167A1, paragraphs 0095 to 0187 of US2015/0004544A1, paragraphs 0403 to 0423 of US2016/0237190A1, and paragraphs 0259 to 0328 of US2016/0274458A1 can be suitably used as the acid diffusion control agent (D).

[Basic Compound (DA)]

Preferred examples of the basic compound (DA) include compounds having structures represented by Formula A to Formula E.

(A)

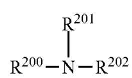

(B)

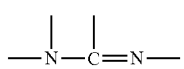

(C)

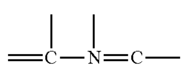

(D)

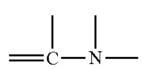

(E)

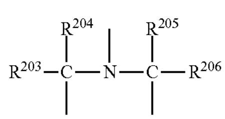

In Formula A to Formula E, $R^{200}$, $R^{201}$, and $R^{202}$ may be the same as or different from each other and each independently represent a hydrogen atom, an alkyl group (preferably having 1 to 20 carbon atoms), a cycloalkyl group (preferably having 3 to 20 carbon atoms), or an aryl group (having 6 to 20 carbon atoms). $R^{201}$ and $R^{202}$ may be bonded to each other to form a ring.

$R^{203}$, $R^{204}$, $R^{205}$, and $R^{206}$ may be the same as or different from each other and each independently represent an alkyl group having 1 to 20 carbon atoms.

The alkyl group in each of Formula A and Formula E may have a substituent or may be unsubstituted.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in each of Formula A and Formula E are more preferably unsubstituted.

As the basic compound (DA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

[Basic Compound (DB) Having Basicity that is Reduced or Lost Upon Irradiation with Actinic Rays or Radiation]

The basic compound (DB) having a basicity that is reduced or lost upon irradiation with actinic rays or radiation (hereinafter also referred to as a "compound (DB)") is a compound which has a proton-accepting functional group, and decomposes under irradiation with actinic rays or radiation to exhibit deterioration in proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following formula.

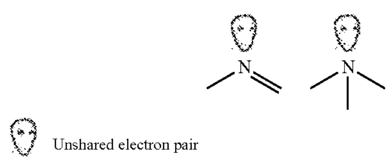

Preferred examples of the partial structure of the proton-accepting functional group include a crown ether structure, an azacrown ether structure, primary to tertiary amine structures, a pyridine structure, an imidazole structure, and a pyrazine structure.

The compound (DB) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (DB) having the proton-accepting functional group and the proton.

The proton-accepting properties can be confirmed by performing pH measurement.

The acid dissociation constant pKa of a compound generated by the decomposition of the compound (DB) upon irradiation with actinic rays or radiation preferably satisfies $pKa<-1$, more preferably $-13<pKa<-1$, and still more preferably $-13<pKa<-3$.

The acid dissociation constant pKa indicates an acid dissociation constant pKa in an aqueous solution, and is defined, for example, in Chemical Handbook (II) (Revised 4th Edition, 1993, compiled by the Chemical Society of Japan, Maruzen Company, Ltd.). A lower value of the acid dissociation constant pKa indicates higher acid strength. Specifically, the acid dissociation constant pKa in an aqueous solution may be measured by using an infinite-dilution aqueous solution and measuring the acid dissociation constant at 25° C. Alternatively, the acid dissociation constant pKa can also be determined using the following software package 1, by computation from a value based on a Hammett substituent constant and database of publicly known literature values. Any of the values of a pKa described in the present specification represent values determined by calculation using the software package.

Software package 1: Advanced Chemistry Development (ACD/Labs) Software V 8.14 for Solaris (1994-2007 ACD/Labs).

[Onium Salt (DC) which Becomes Relatively Weak Acid with Respect to Photoacid Generator]

In the photosensitive resin composition according to the present disclosure, an onium salt (DC) which becomes a relatively weak acid with respect to the photoacid generator can be used as the other acid diffusion control agent.

In a case of mixing a photoacid generator and an onium salt capable of generating an acid which is a relatively weak acid with respect to an acid generated from the photoacid generator, and then using the mixture, in a case where the acid generated from the photoacid generator upon irradiation with actinic rays or radiation collides with an onium salt having an unreacted weak acid anion, a weak acid is jetted by salt exchange, thereby generating an onium salt having a strong acid anion. In this process, since the strong acid is exchanged with a weak acid having a lower catalytic ability, the acid is deactivated in appearance, and it is thus possible to perform the control of acid diffusion.

From the viewpoint of tolerance of a focal depth and pattern linearity, it is preferable that the photosensitive resin composition according to the present disclosure further includes at least one compound selected from the group consisting of compounds represented by Formula d1-1 to Formula d1-3.

Formula d1-1

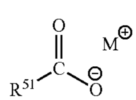

Formula d1-2

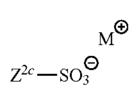

Formula d1-3

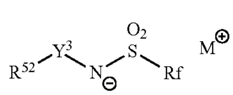

In Formula d1-1 to Formula d1-3, $R^{51}$ represents a hydrocarbon group which may have a substituent, $Z^{2c}$ represents a hydrocarbon group having 1 to 30 carbon atoms, which may have a substituent, in which a fluorine atom is not bonded to the carbon atom adjacent to the S atom, $R^{52}$ represents an organic group, $Y^3$ represents a linear, branched, or cyclic alkylene group or an arylene group, Rf represents a hydrocarbon group including a fluorine atom, and $M^+$'s each independently represent an ammonium cation, a sulfonium cation, or an iodonium cation.

Preferred examples of the sulfonium cation or iodonium cation represented by $M^+$ include the sulfonium cations exemplified for Formula ZI and the iodonium cations exemplified for Formula ZII.

The onium salt (DC) which becomes a relatively weak acid with respect to the photoacid generator may be a compound (hereinafter also referred to as a "compound (DCA)") having a cationic site and an anionic site in the same molecule, in which the cationic site and the anionic site are linked to each other through a covalent bond.

As the compound (DCA), a compound represented by any one of Formulae (C-1), . . . , or (C-3) is preferable.

Formula C-1

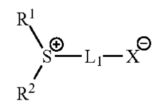

Formula C-2

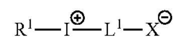

Formula C-3

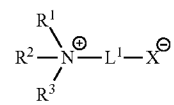

In Formulae C-1 to C-3, $R^1$, $R^2$, and $R^3$ each independently represent a substituent having 1 or more carbon atoms.

$L^1$ represents a divalent linking group that links a cationic site with an anionic site, or a single bond.

—$X^-$ represents an anionic site selected from —$COO^-$, —$SO_3^-$, —$SO_2^-$, and —N—$R^4$. $R^4$ represents a monovalent substituent having at least one of a carbonyl group: —C(═O)—, a sulfonyl group: —S(═O)$_2$—, or a sulfinyl group: —S(═O)— at a site for linking to an adjacent N atom.

$R^1$, $R^2$, $R^3$, $R^4$, and $L^1$ may be bonded to one another to form a ring structure. Further, in Formula C-3, two of $R^1$ to $R^3$ may be combined to represent a divalent substituent or $R^1$ to $R^3$ may be bonded to an N atom through a double bond.

Examples of the substituent having 1 or more carbon atoms in each of $R^1$ to $R^3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. The substituent is preferably an alkyl group, a cycloalkyl group, or an aryl group.

Examples of $L^1$ as the divalent linking group include a linear or branched alkylene group, a cycloalkylene group, an arylene group, a carbonyl group, an ether bond, ester bond, amide bond, a urethane bond, a urea bond, and a group formed by a combination of two or more kinds of these groups. $L^1$ is preferably an alkylene group, an arylene group, an ether bond, ester bond, and a group formed by a combination of two or more kinds of these groups.

[Low-Molecular-Weight Compound (DD) Having Nitrogen Atom and Group that Leaves by Action of Acid]

The low-molecular-weight compound (DD) (hereinafter referred to as a "compound (DD)") having a nitrogen atom and a group that leaves by the action of an acid is preferably an amine derivative having a group that leaves by the action of an acid on a nitrogen atom.

As the group that leaves by the action of an acid, an acetal group, a carbonate group, a carbamate group, a tertiary ester group, a tertiary hydroxyl group, or a hemiaminal ether group is preferable, and the carbamate group or the hemiaminal ether group is more preferable.

The molecular weight of the compound (DD) is preferably 100 to 1,000, more preferably 100 to 700, and still more preferably 100 to 500.

The compound (DD) may have a carbamate group having a protecting group on a nitrogen atom. The protecting group constituting the carbamate group is represented by Formula d-1.

Formula d-1

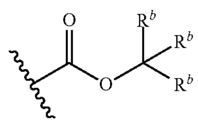

In Formula d-1, $R^b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R^b$'s may be linked to each other to form a ring.

The alkyl group, the cycloalkyl group, the aryl group, and the aralkyl group represented by $R^b$ may be each independently substituted with a functional group such as a hydroxy group, a cyano group, an amino group, a pyrrolidino group, a piperidino group, a morpholino group, and an oxo group, an alkoxy group, or a halogen atom. This shall apply to the alkoxyalkyl group represented by $R^b$.

As $R^b$, a linear or branched alkyl group, a cycloalkyl group, or an aryl group is preferable, and the linear or branched alkyl group or the cycloalkyl group is more preferable.

Examples of a ring formed by the mutual linking of two $R^b$'s include an alicyclic hydrocarbon, an aromatic hydrocarbon, a heterocyclic hydrocarbon, and derivatives thereof.

Examples of the specific structure of the group represented by Formula d-1 include the structures disclosed in paragraph 0466 in US2012/0135348A, but are not particularly limited thereto.

It is preferable that the compound (DD) has a structure represented by Formula 6.

Formula 6

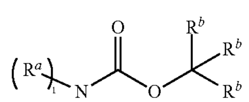

In Formula 6, 1 represents an integer of 0 to 2, and m represents an integer of 1 to 3, satisfying 1+m=3.

$R^a$ represents a hydrogen atom, an alkyl group, a cycloalkyl group, an aryl group, or an aralkyl group. In a case where 1 is 2, two $R^a$'s may be the same as or different from each other and two $R^a$'s may be linked to each other to form a heterocycle, together with the nitrogen atom in the formula. The heterocycle may include a heteroatom other than the nitrogen atom in the formula.

$R^b$ has the same definition as $R^b$ in Formula d-1, and preferred examples are also the same.

In Formula 6, the alkyl group, the cycloalkyl group, the aryl group, and the aralkyl group as $R^a$ may be each independently substituted with the same groups as the group mentioned above as a group which may be substituted in the alkyl group, the cycloalkyl group, the aryl group, and the aralkyl group as $R^b$.

Specific examples of the alkyl group, the cycloalkyl group, the aryl group, and the aralkyl group (these groups may be substituted with the groups as described above) of $R^a$ include the same groups as the specific examples as described above with respect to $R^b$.

Examples of the specific structure of the particularly preferred compound (DD) in the present disclosure include, but are not limited to, the compounds disclosed in paragraph 0475 in US2012/0135348A.

The onium salt compound (DE) (hereinafter also referred to as a "compound (DE)") having a nitrogen atom in a cationic moiety is preferably a compound having a basic site including a nitrogen atom in a cationic moiety. The basic site is preferably an amino group, and more preferably an aliphatic amino group. It is more preferable that all of the atoms adjacent to the nitrogen atom in the basic site are hydrogen atoms or carbon atoms. Further, from the viewpoint of improving the basicity, it is preferable that an electron-withdrawing functional group (a carbonyl group, a sulfonyl group, a cyano group, a halogen atom, and the like) is not directly linked to the nitrogen atom.

Examples of the specific preferred structure of the compound (DE) include, but are not limited to, the compounds disclosed in paragraph 0203 of US2015/0309408A.

Preferred examples of such the other acid diffusion control agent are shown below.

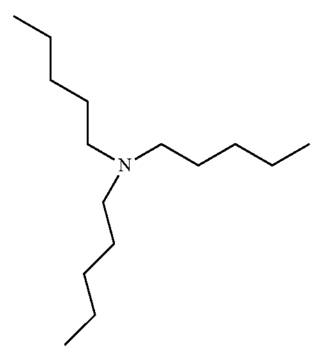

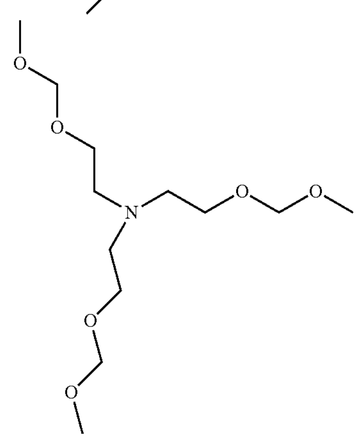

-continued
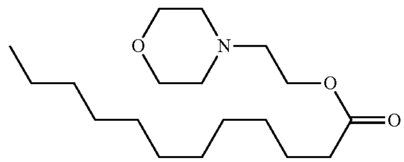
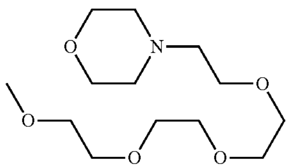
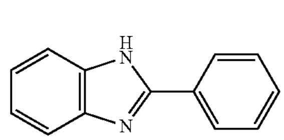
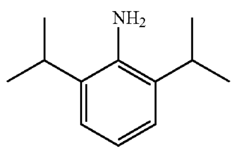
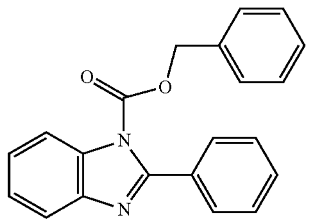
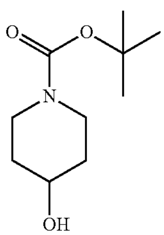
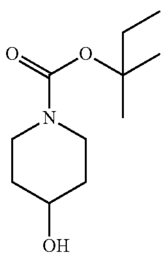
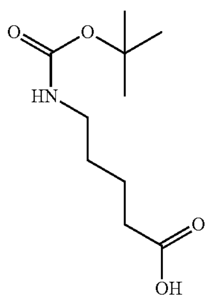
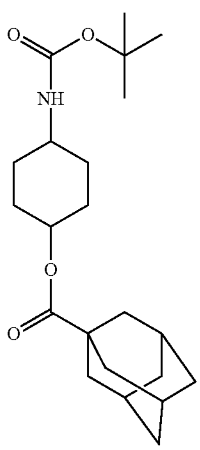
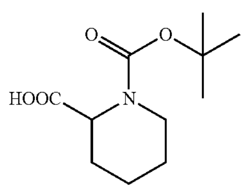
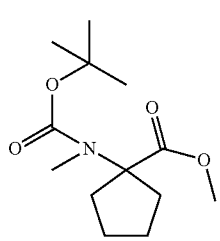
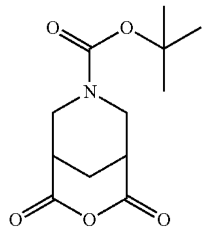
-continued
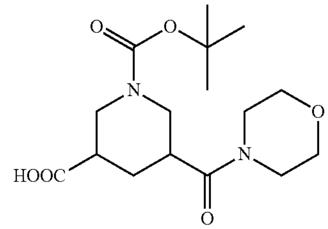
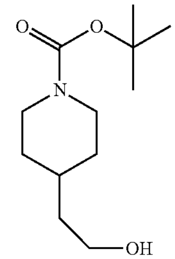
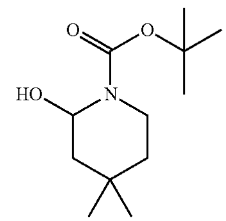
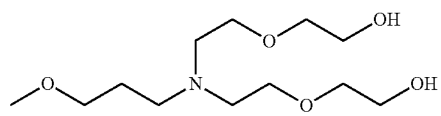
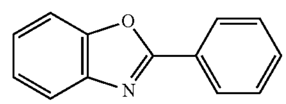
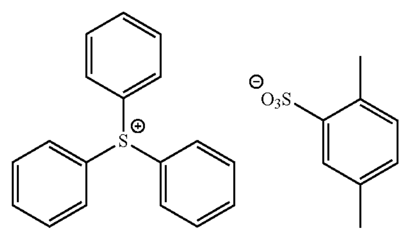
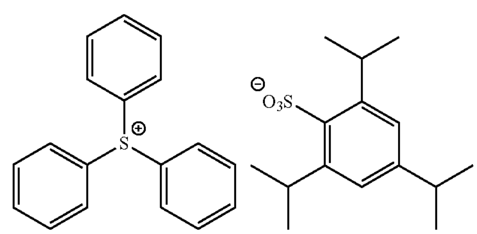
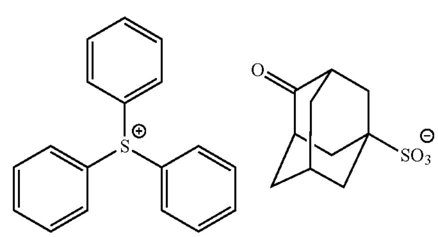
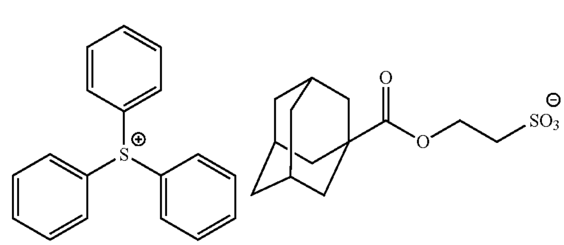

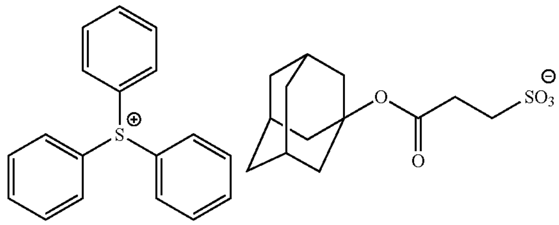
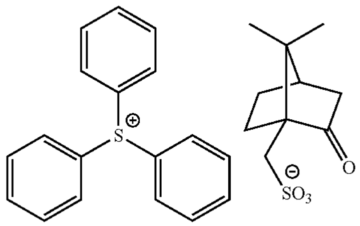
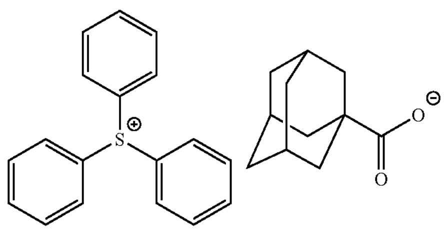
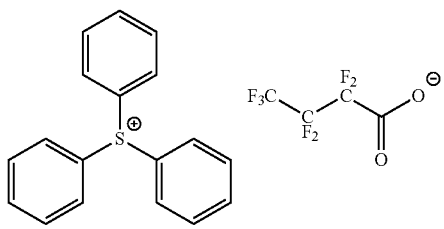
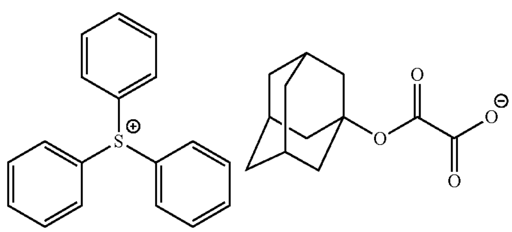
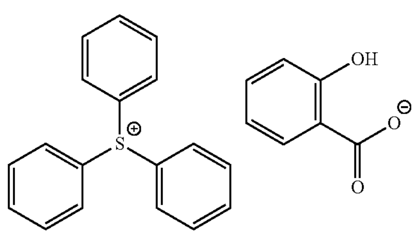
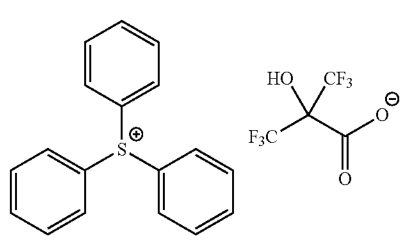
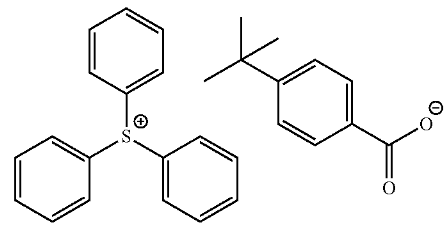
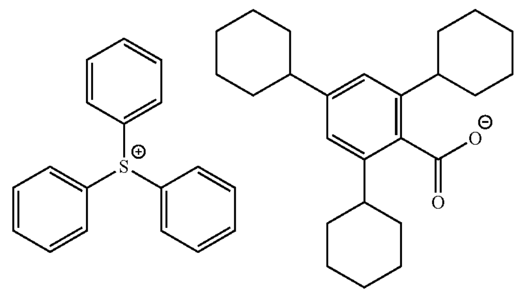
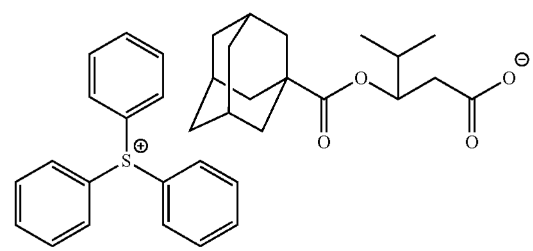
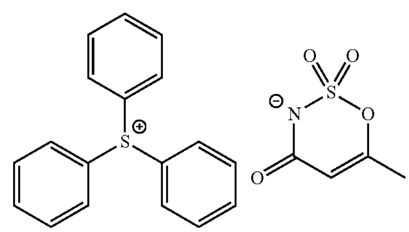
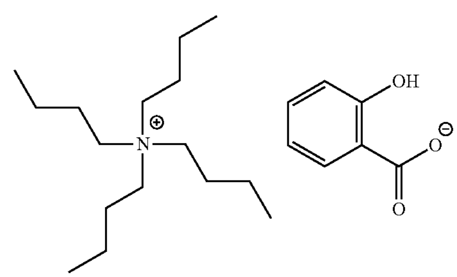
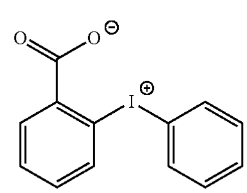
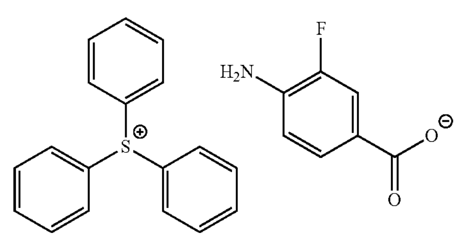

-continued

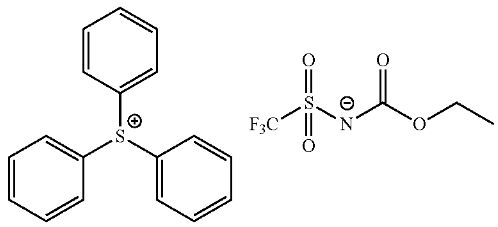

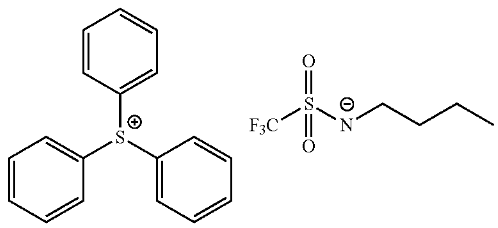

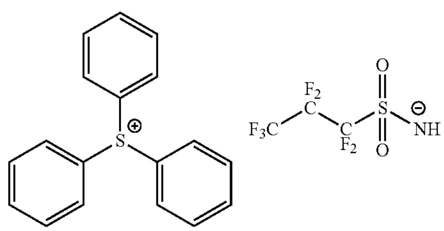

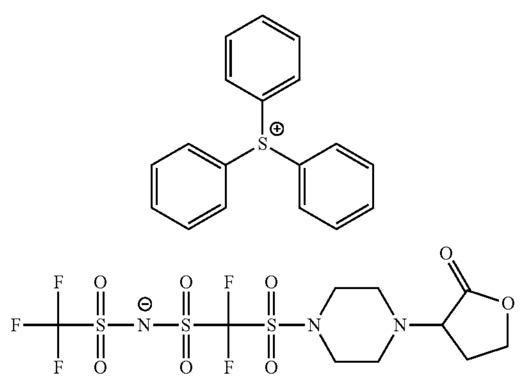

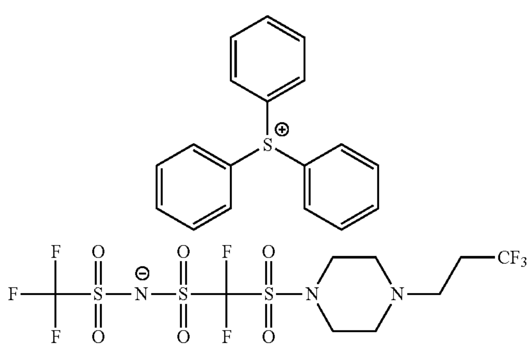

In the photosensitive resin composition according to the present disclosure, such the other acid diffusion control agents may be used singly or in combination of two or more kinds thereof.

The content of the acid diffusion control agent (the total content in a case where a plurality of the acid diffusion control agents are present) in the composition is preferably 0.1% by mass to 10% by mass, and more preferably 0.1% by mass to 5% by mass, with respect to the total solid content of the composition.

<Solvent>

The photosensitive resin composition according to the present disclosure preferably includes a solvent (also referred to as "solvent (F)"), and more preferably includes an organic solvent.

In the photosensitive resin composition according to the present disclosure, a known resist solvent can be appropriately used. For example, the known solvents disclosed in paragraphs 0665 to 0670 of US2016/0070167A, paragraphs 0210 to 0235 of US2015/0004544A, paragraphs 0424 to 0426 of US2016/0237190A, and paragraphs 0357 to 0366 of US2016/0274458A can be suitably used.

Examples of the solvent which can be used in the preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

A mixed solvent obtained by mixing a solvent containing a hydroxyl group in the structure and a solvent containing no hydroxyl group in the structure may be used as the organic solvent.

As the solvent containing a hydroxyl group and the solvent containing no hydroxyl group, the above-mentioned exemplary compounds can be appropriately selected, but as the solvent containing a hydroxyl group, an alkylene glycol monoalkyl ether, alkyl lactate, or the like is preferable, and propylene glycol monomethyl ether (PGME), propylene glycol monoethyl ether (PGEE), methyl 2-hydroxyisobutyrate, or ethyl lactate is more preferable.

Further, as the solvent containing no hydroxyl group, an alkylene glycol monoalkyl ether acetate, alkyl alkoxy propionate, a monoketone compound which may have a ring, cyclic lactone, alkyl acetate, or the like is preferable; among these, propylene glycol monomethyl ether acetate (PGMEA), ethyl ethoxypropionate, 2-heptanone, γ-butyrolactone, cyclohexanone, cyclopentanone, or butyl acetate is more preferable; and propylene glycol monomethyl ether acetate, γ-butyrolactone, ethyl ethoxypropionate, cyclohexanone, cyclopentanone, or 2-heptanone is still more preferable. As the solvent containing no hydroxyl group propylene carbonate is also preferable. Among these, it is particularly preferable that the solvent includes γ-butyrolactone from the viewpoint of uniformity of a layer to be formed.

The mixing ratio (mass ratio) of the solvent containing a hydroxyl group to the solvent containing no hydroxyl group is 1/99 to 99/1, preferably 10/90 to 90/10, and more preferably 20/80 to 60/40. A mixed solvent containing 50% by mass or more of the solvent containing no hydroxyl group is preferable from the viewpoint of coating evenness.

The solvent preferably includes propylene glycol monomethyl ether acetate, and may be a single solvent formed of propylene glycol monomethyl ether acetate or a mixed solvent of two or more kinds of solvents containing propylene glycol monomethyl ether acetate.

The concentration of the solid contents of the photosensitive resin composition according to the present disclosure is not particularly limited, but is preferably 0.5% by mass to 50% by mass, more preferably 1.0% by mass to 20% by mass, and still more preferably 1.0% by mass to 15% by mass.

<Crosslinking Agent>

The photosensitive resin composition according to the present disclosure may contain a compound that crosslinks a resin by the action of an acid (hereinafter also referred to as a crosslinking agent (G)).

As the crosslinking agent (G), a known compound can be appropriately used. For example, the known compounds disclosed in paragraphs 0379 to 0431 of US2016/0147154A and paragraphs 0064 to 0141 of US2016/0282720A can be suitably used as the crosslinking agent (G).

The crosslinking agent (G) is a compound having a crosslinkable group which can crosslink a resin, and examples of the crosslinkable group include a hydroxymethyl group, an alkoxymethyl group, an acyloxymethyl group, an alkoxymethyl ether group, an oxirane ring, and an oxetane ring.

The crosslinkable group is preferably the hydroxymethyl group, the alkoxymethyl group, the oxirane ring, or the oxetane ring.

The crosslinking agent (G) is preferably a compound (which also includes a resin) having two or more crosslinkable groups.

The crosslinking agent (G) is more preferably a phenol derivative, a urea-based compound (compound having a urea structure), or a melamine-based compound (compound having a melamine structure), which has a hydroxymethyl group or an alkoxymethyl group.

The crosslinking agents may be used singly or in combination of two or more kinds thereof.

The content of the crosslinking agent (G) is preferably 1% by mass to 50% by mass, more preferably 3% by mass to 40% by mass, and still more preferably 5% by mass to 30% by mass, with respect to the total solid content of the composition.

<Surfactant>

The photosensitive resin composition according to the present disclosure may or may not contain a surfactant (also referred to as a surfactant (H)). In a case where the composition contains the surfactant, it is preferable that at least one of a fluorine-based surfactant or a silicone-based surfactant (specifically a fluorine-based surfactant, a silicone-based surfactant, or a surfactant having both of a fluorine atom and a silicon atom) is contained.

By incorporating the surfactant into the photosensitive resin composition according to the present disclosure, it is possible to form a resist pattern which has excellent adhesiveness and decreased development defects with good sensitivity and resolution in a case of using an exposure light source at a wavelength of 250 nm or less, and particularly at a wavelength of 220 nm or less.

Examples of the fluorine-based or silicone-based surfactant include the surfactants described in paragraph 0276 of US2008/0248425A.

In addition, other surfactants other than the fluorine-based or silicone-based surfactant, described in paragraph 0280 of US2008/0248425A, can also be used.

These surfactants may be used singly or in combination of two or more kinds thereof.

In a case where the photosensitive resin composition according to the present disclosure contains a surfactant, the content of the surfactant is preferably 0.0001% by mass to 2% by mass, and more preferably 0.0005% by mass to 1% by mass, with respect to the total solid content of the composition.

On the other hand, by setting the content of the surfactant to 0.0001% by mass or more with respect to the total solid content of the composition, the hydrophobic resin is further unevenly distributed on the surface. Thus, a surface of the actinic ray-sensitive or radiation-sensitive film can be made more hydrophobic, which can enhance water tracking properties upon liquid immersion exposure.

<Other Additives>

The photosensitive resin composition according to the present disclosure may further include other known additives.

Examples of such other additives include an acid proliferation agent, a dye, a plasticizer, a light sensitizer, a light absorber, an alkali-soluble resin, a dissolution inhibitor, and a dissolution accelerator.

(Method for Producing Photosensitive Resin Composition)

The method for producing a photosensitive resin composition according to the present disclosure is not particularly limited, but from the viewpoint of easily producing the photosensitive resin composition according to the present disclosure, it is preferable that the method includes a step of mixing a resin having a polarity that increases by the action of an acid, a total content of the metal atoms of the resin is from 1 ppt to 30 ppb with respect to a total mass of the resin, and a content of the ethylenically unsaturated compound included in the resin is from 0.001% by mass to 10% by mass with respect to the total mass of the resin; it is more preferable that the mixing step is a step of mixing a resin having a polarity that increases by the action of an acid with an organic solvent; and it is still more preferable that the mixing step is a step of mixing at least the resin with an organic solvent having a total content of the metal atoms from 1 ppt to 30 ppb.

In addition, from the viewpoint of easily producing the photosensitive resin composition according to the present disclosure, it is preferable that the mixing step is a step of mixing at least the resin and a photoacid generator having a total content of the metal atoms from 1 ppt to 1,000 ppb.

From the viewpoint of easily producing the photosensitive resin composition according to the present disclosure, it is preferable that the mixing step is a step of mixing at least the resin and an acid diffusion control agent having a total content of the metal atoms from 1 ppt to 1,000 ppb.

Among those, from the viewpoint of easily producing the photosensitive resin composition according to the present disclosure, it is more preferable that the mixing step is a step of mixing at least the resin, an organic solvent having a total content of the metal atoms from 1 ppt to 30 ppb, and a photoacid generator having a total content of the metal atoms from 1 ppt to 1,000 ppb, and it is particularly preferable that the mixing step is a step of mixing at least the resin, an organic solvent having a total content of the metal atoms from 1 ppt to 30 ppb, a photoacid generator having a total content of the metal atoms from 1 ppt to 1,000 ppb, and an acid diffusion control agent having a total content of the metal atoms from 1 ppt to 1,000 ppb.

From the viewpoint of the linearity of a pattern thus obtained after the lapse of time, the total content of the metal atoms of the resin used in the mixing step is preferably from 1 ppt to 10 ppb, more preferably from 1 ppt to 5 ppb, still more preferably from 1 ppt to 1,000 ppt, and particularly preferably from 5 ppt to 100 ppt, with respect to the total mass of the resin.

In addition, from the viewpoint of the linearity of a pattern thus obtained after the lapse of time, the total content of the metal atoms of the organic solvent used in the mixing step is preferably from 1 ppt to 10 ppb, more preferably from 1 ppt to 5 ppb, still more preferably from 1 ppt to 1,000 ppt, and particularly preferably from 5 ppt to 100 ppt, with respect to the total mass of the organic solvent.

From the viewpoint of the linearity of a pattern thus obtained after the lapse of time, the total content of the metal atoms of the photoacid generator used in the mixing step is preferably from 1 ppt to 500 ppb, more preferably from 1 ppt to 100 ppb, still more preferably from 1 ppt to 10 ppb, and particularly preferably from 5 ppt to 1,000 ppt, with respect to the total mass of the photoacid generator.

From the viewpoint of the linearity of a pattern thus obtained after the lapse of time, the total content of the metal atoms of the acid diffusion control agent used in the mixing step is preferably from 1 ppt to 500 ppb, more preferably from 1 ppt to 100 ppb, further preferably from 1 ppt to 10 ppb, and particularly preferably from 5 ppt to 1,000 ppt, with respect to the total mass of the acid diffusion control agent.

Examples of a method for removing impurities such as metal atoms from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferable. As the filter, a filter which had been washed with an organic solvent in advance may be used. In the step of filtration using a filter, plural kinds of filters connected in series or in parallel may be used. In a case of using the plural kinds of filters, a combination of filters different in at least one of pore diameters or materials may be used. In addition, various materials may be filtered plural times, and the step of filtering plural times may be a circulating filtration step. As the filter, a filter having a reduced amount of elutes as disclosed in JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used. Examples of the metal adsorbing agent include those disclosed in JP2016-206500A.

In addition, examples of a method for removing the impurities such as metal atoms include a method in which a raw material having a small content of the metal atoms is selected as a raw material constituting various materials, the raw material constituting the various materials is subjected to filtration using a filter or the inside of an apparatus is lined with TEFLON (registered trademark) or the like, and thus distillation may be carried out under conditions that minimize the metal content of the various materials as much as possible. Preferred conditions in the filtration using a filter to be performed on the raw material constituting the various materials are the same as the above-mentioned conditions.

In order to prevent impurities from being incorporated, it is preferable that the above-mentioned various materials are stored in the container described in US2015/0227049A, JP2015-123351A, JP2017-013804A, or the like.

The mixing order in the mixing step is not particularly limited, and the mixing may be performed in any order. For example, two or more kinds may be added together and mixed, or all components may be added at once and mixed.

Incidentally, the entire amount of the respective components to be used may be added at once or may be added dividedly twice or more. Further, for example, the respective components may be prepared as a solution of an organic solvent and the solution may be mixed.

In addition, after the mixing step, a step of filtering the obtained photosensitive resin composition is preferably included, and a step of filtering the obtained photosensitive resin composition with a filter is more preferable.

The photosensitive resin composition according to the present disclosure is preferably, for example, applied on a predetermined support (substrate) and then used after the mixing step or the filtering step.

The pore size (pore diameter) of the filter to be used for filtration using the filter is preferably 0.1 μm or less, more preferably 0.05 μm or less, and still more preferably 0.03 μm or less.

In a case where the concentration of the solid contents of the photosensitive resin composition is high (for example, 25% by mass or more), the pore size of the filter used for filtration using a filter is preferably 3 μm or less, more preferably 0.5 μm or less, and still more preferably 0.3 μm or less.

The filter is preferably a polytetrafluoroethylene-, polyethylene- or nylon-made filter. In the filtration using a filter, circulating filtration may be performed or the filtration may be performed by connecting plural kinds of filters in series or in parallel, as disclosed in JP2002-062667A, for example. In addition, the composition may be filtered in plural times. Furthermore, the composition may be subjected to a deaeration treatment or the like before or after filtration using the filter.

The film thickness of the resist film made of the photosensitive resin composition according to the present disclosure is not particularly limited, but from the viewpoint of improving a resolution, the film thickness is preferably 90 nm or less, and more preferably 85 nm or less. Such a film thickness can be obtained by setting the concentration of the solid contents in the composition to an appropriate range to give an appropriate viscosity and improving the coating properties or the film forming properties.

<Applications>

The photosensitive resin composition according to the present disclosure is a photosensitive resin composition having a change in the properties by undergoing a reaction upon irradiation with light. More specifically, the photosensitive resin composition according to the present disclosure relates to an actinic ray-sensitive or radiation-sensitive resin composition which is used in a step of manufacturing a semiconductor such as an integrated circuit (IC), for the manufacture of a circuit board for a liquid crystal, a thermal head, or the like, the manufacture of a mold structure for imprinting, and other photofabrication steps, or for the production of a planographic printing plate, or an acid-curable composition. A resist pattern formed with the photosensitive resin composition according to the present disclosure can be used in an etching step, an ion implantation step, a bump electrode forming step, a rewiring forming step, microelectromechanical systems (MEMS), or the like.

(Resist Film)

The resist film according to the present disclosure is a solidified product of the photosensitive resin composition according to the present disclosure.

The solidified product in the present disclosure only needs to be a residue obtained by removing at least a part of the solvent from the photosensitive resin composition according to the present disclosure.

Specifically, the resist film according to the present disclosure can be obtained by, for example, applying the photosensitive resin composition according to the present disclosure on a support such as a substrate, followed by drying.

The drying refers to a removal of at least a part of the solvent included in the photosensitive resin composition according to the present disclosure.

The drying method is not particularly limited, known methods can be used, but examples thereof include drying by heating (for example, 70° C. to 130° C., 30 seconds to 300 seconds).

The heating method is not particularly limited, a known heating means is used, but examples thereof include a heater, an oven, a hot plate, an infrared lamp, and an infrared laser.

The components included in the resist film according to the present disclosure are the same as the components excluding a solvent among the components included in the photosensitive resin composition according to the present disclosure, and preferred aspects thereof are also the same.

The content of each component included in the resist film according to the present disclosure corresponds to a content of each component, in which a description of "the total solid content" with regard to the content of each component other than the solvent in the photosensitive resin composition according to the present disclosure is replaced by "the total mass of the resist film".

The thickness of the resist film according to the present disclosure is not particularly limited, and is preferably 50 nm to 150 nm, and more preferably 80 nm to 130 nm.

In addition, in a case where it is intended to form a thick resist film along with a three-dimensional memory device, the thickness is, for example, preferably 2 μm or more, more preferably from 2 μm to 50 μm, and still more preferably from 2 μm to 20 μm.

(Pattern Forming Method)

The pattern forming method according to the present disclosure includes:

a step of exposing the resist film according to the present disclosure with actinic rays (exposing step), and a step of developing the resist film after the exposing step with a developer (developing step).

Furthermore, the pattern forming method according to the present disclosure may be a method including: a step of forming a resist film on a support with the photosensitive resin composition according to the present disclosure (film forming step), a step of exposing the resist film with actinic rays (exposing step), and a step of developing the resist film after the exposing step with a developer (developing step).

<Film Forming Step>

The pattern forming method according to the present disclosure may include a film forming step. Examples of a method for forming a resist film in the film forming step include a method for forming a resist film by the drying as described in the section of the resist film as described above.

[Support]

The support is not particularly limited, and a substrate which is generally used in a process for manufacturing a semiconductor such as an IC, and a process for manufacturing a circuit board for a liquid crystal, a thermal head, or the like, and other lithographic processes of photofabrication can be used. Specific examples of the support include an inorganic substrate such as silicon, $SiO_2$, and SiN.

<Exposing Step>

The exposing step is a step of exposing the resist film with light.

The exposing method may be liquid immersion exposure.

The pattern forming method according to the present disclosure may include the exposing steps plural times.

A type of the light (actinic rays or radiation) used for exposure may be selected in consideration of characteristics of a photoacid generator, a pattern shape to be obtained, and the like, but examples of the light include infrared rays, visible light, ultraviolet rays, far ultraviolet rays, extreme ultraviolet rays (EUV), X-rays, and electron beams, and the far ultraviolet rays are preferable.

For example, actinic rays at a wavelength of 250 nm or less are preferable, actinic rays at a wavelength of 220 nm or less are more preferable, and actinic rays at a wavelength of 1 to 200 nm are still more preferable.

Specific examples of light used include a KrF excimer laser (248 nm), an ArF excimer laser (193 nm), an $F_2$ excimer laser (157 nm), X-rays, EUV (13 nm), and electron beams, and the ArF excimer laser, EUV, or the electron beams are preferable.

Among those, the exposure in the exposing step is preferably performed by liquid immersion exposure with an argon fluoride laser.

The exposure dose is preferably 5 mJ/cm$^2$ to 200 mJ/cm$^2$, and more preferably 10 mJ/cm$^2$ to 100 mJ/cm$^2$.

<Developing Step>

The developer used in the developing step may be an alkali developer or a developer containing an organic solvent (hereinafter also referred to as an organic developer), or is preferably an aqueous alkali solution.

[Alkali Developer]

As the alkali developer, a quaternary ammonium salt typified by tetramethylammonium hydroxide is preferably used, but in addition to the quaternary ammonium salt, an aqueous alkali solution such as an inorganic alkali, primary to tertiary amines, alkanolamine, and cyclic amine can also be used.

In addition, the alkali developer may contain an appropriate amount of at least one of alcohols or a surfactant. The alkali concentration of the alkali developer is preferably 0.1% by mass to 20% by mass. The pH of the alkali developer is preferably 10 to 15.

A period for performing development using the alkali developer is preferably 10 seconds to 300 seconds.

The alkali concentration, the pH, and the developing time using the alkali developer can be appropriately adjusted depending on a pattern formed.

[Organic Developer]

As the organic developer, a developer containing at least one organic solvent selected from the group consisting of a ketone-based solvent, an ester-based solvent, an alcohol-based solvent, an amide-based solvent, an ether-based solvent, and a hydrocarbon-based solvent is preferable.

—Ketone-Based Solvent—

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

—Ester-Based Solvent—

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butyrate, methyl 2-hydroxyisobutyrate, isoamyl acetate, isobutyl isobutyrate, and butyl propionate.

—Other Solvents—

As the alcohol-based solvent, the amide-based solvent, the ether-based solvent, and the hydrocarbon-based solvent, the solvents disclosed in paragraphs 0715 to 0718 of US2016/0070167A1 can be used.

A plurality of the above-mentioned solvents may be mixed or the solvent may be used in admixture with a solvent other than those described above or with water. The moisture content in the entire developer is preferably less than 50% by mass, more preferably less than 20% by mass, and still more preferably less than 10% by mass, and particularly preferably, moisture is not substantially contained.

The content of the organic solvent in the organic developer is preferably from 50% by mass to 100% by mass, more preferably from 80% by mass to 100% by mass, still more preferably from 90% by mass to 100% by mass, and particularly preferably from 95% by mass to 100% by mass, with respect to a total amount of the developer.

—Surfactant—

The organic developer can contain an appropriate amount of a known surfactant, as necessary.

The content of the surfactant is preferably 0.001% by mass to 5% by mass, more preferably 0.005% by mass to 2% by mass, and still more preferably 0.01% by mass to 0.5% by mass, with respect to the total mass of the developer.

—Acid Diffusion Control Agent—

The organic developer may include the above-mentioned acid diffusion control agent.

[Developing Method]

As the developing method, for example, a method in which a substrate is immersed in a tank filled with a developer for a certain period of time (a dip method), a method in which a developer is heaped up onto the surface of a substrate by surface tension, and then left to stand for a certain period of time (a puddle method), a method in which a developer is sprayed on the surface of a substrate (a spray method), and a method in which a developer is continuously jetted onto a substrate spun at a constant rate while scanning a developer jetting nozzle at a constant rate (a dynamic dispense method) can be applied.

A step of performing development using an aqueous alkali solution (an alkali developing step) and a step of performing development using a developer including an organic solvent (an organic solvent developing step) may be combined. Thus, a finer pattern can be formed since a pattern can be formed by keeping only a region with an intermediate exposure intensity from not being dissolved.

<Prebaking Step and Post-Exposure Baking Step>

It is preferable that the pattern forming method according to the present disclosure includes a prebaking (PB) step before the exposing step.

The pattern forming method according to the present disclosure may include the prebaking steps a plurality of times.

It is preferable that the pattern forming method according to the present disclosure includes a post-exposure baking (PEB) step after the exposing step and before the developing step.

The pattern forming method according to the present disclosure may include the post-exposure baking steps a plurality of times.

The heating temperature is preferably 70° C. to 130° C., and more preferably 80° C. to 120° C. in any of the prebaking step and the post-exposure baking step.

The heating time is preferably 30 seconds to 300 seconds, more preferably 30 seconds to 180 seconds, and still more preferably 30 seconds to 90 seconds in any of the prebaking step and the post-exposure baking step.

Heating can be performed using a means comprised in an exposure device and a development device, or may also be performed using a hot plate or the like.

<Step of Forming Resist Underlayer Film>

The pattern forming method according to the present disclosure may further include a step of forming a resist underlayer film (resist underlayer film forming step) before the film forming step.

The resist underlayer film forming step is a step of forming a resist underlayer film (for example, spin on glass (SOG), spin on carbon (SOC), and an antireflection film) between the resist film and the support. For the resist underlayer film, known organic or inorganic materials can be appropriately used.

<Protective Film Forming Step>

The pattern forming method according to the present disclosure may further include a step of forming a protective film (protective film forming step) before the developing step.

The protective film forming step is a step of forming a protective film (topcoat) on the upper layer of the resist film. As the protective film, a known material can be appropriately used. The compositions for forming a protective film disclosed in, for example, US2007/0178407A, US2008/0085466A, US2007/0275326A, US2016/0299432A, US2013/0244438A, or WO2016/157988A can be suitably used. A composition for forming a protective film preferably includes the above-mentioned acid diffusion control agent.

The protective film may also be formed on the upper layer of the resist film containing the above-mentioned hydrophobic resin.

<Rinsing Step>

The pattern forming method according to the present disclosure preferably includes a step of performing washing with a rinsing liquid (rinsing step) after the developing step.

[Case of Developing Step Using Alkali Developer]

As the rinsing liquid used in the rinsing step after the developing step using an alkali developer, for example, pure water can be used. Pure water may contain an appropriate amount of a surfactant. In this case, after the developing step or the rinsing step, a treatment for removing the developer or the rinsing liquid adhering on a pattern by a supercritical fluid may be added. In addition, after the rinsing treatment or the treatment using a supercritical fluid, a heating treatment for removing moisture remaining in the pattern may be performed.

[Case of Developing Step Using Organic Developer]

The rinsing liquid used in the rinsing step after the developing step using a developer including an organic solvent is not particularly limited as long as the rinsing liquid does not dissolve the resist pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent are the same solvents as those described for the developer including an organic solvent.

As the rinsing liquid used in the rinsing step in this case, a rinsing liquid containing a monohydric alcohol is more preferable.

Examples of the monohydric alcohol used in the rinsing step include linear, branched, or cyclic monohydric alcohols. Specific examples thereof include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol. Examples of the monohydric alcohol having 5 or more carbon atoms include 1-hexanol, 2-hexanol, 4-methyl-2-pentanol, 1-pentanol, 3-methyl-1-butanol, and methyl isobutyl carbinol.

The respective components in plural number may be mixed or the components may be used in admixture with an organic solvent other than the above solvents.

The moisture content in the rinsing liquid is preferably 10% by mass or less, more preferably 5% by mass or less, and still more preferably 3% by mass or less. By setting the moisture content to 10% by mass or less, good development characteristics can be obtained.

The rinsing liquid may contain an appropriate amount of a surfactant.

In the rinsing step, the substrate which has been subjected to development using an organic developer is subjected to a washing treatment using a rinsing liquid including an organic solvent. A method for the washing treatment method is not particularly limited, but for example, a method in which a rinsing liquid is continuously jetted on a substrate rotated at a constant rate (a rotation application method), a method in which a substrate is immersed in a tank filled with a rinsing liquid for a certain period of time (a dip method), and a method in which a rinsing liquid is sprayed on a substrate surface (a spray method) can be applied. Among those, it is preferable that a washing treatment is performed using the rotation application method, and a substrate is rotated at a rotation speed of 2,000 rpm to 4,000 rpm (rotations/min) after washing, thereby removing the rinsing liquid from the substrate. Furthermore, it is also preferable that the method includes a baking step after the rinsing step (post-baking). The developer and the rinsing liquid remaining between and inside the patterns are removed by the baking step. In the baking step after the rinsing step, the heating temperature is preferably 40° C. to 160° C., and more preferably 70° C. to 95° C. The heating time is preferably 10 seconds to 3 minutes, and more preferably 30 seconds to 90 seconds.

<Improvement of Surface Roughness>

A method for improving the surface roughness of a pattern may be applied to a pattern formed by the pattern forming method according to the present disclosure. Examples of the method for improving the surface roughness of a pattern include the method of treating a resist pattern by plasma of a hydrogen-containing gas disclosed in US2015/0104957A. In addition, known methods as described in JP2004-235468A, US2010/0020297A, and Proc. of SPIE Vol. 8328 83280N-1 "EUV Resist Curing Technique for LWR Reduction and Etch Selectivity Enhancement" may be applied.

In addition, a resist pattern formed by the method can be used as a core material (core) of the spacer process disclosed in JP1991-270227A (JP-H03-270227A) and US2013/0209941A, for example.

(Method for Manufacturing Electronic Device)

The method for manufacturing an electronic device according to the present disclosure includes the pattern forming method according to the present disclosure. An electronic device manufactured by the method for manufacturing an electronic device according to the present disclosure is suitably mounted on electric or electronic equipment (for example, home electronics, office automation (OA)-related equipment, media-related equipment, optical equipment, and telecommunication equipment).

EXAMPLES

Hereinbelow, embodiments of the present invention will be described in more detail with reference to Examples. The materials, the amounts of materials used, the proportions, the treatment details, the treatment procedure, or the like shown in the following Examples may be appropriately modified as long as the modifications do not depart from the spirit of the embodiments of the present invention. Therefore, the scope of the embodiments of the present invention is not particularly limited to the specific examples shown below. In addition, "parts" and "%" are on a mass basis unless otherwise specified.

Synthesis Example 1: Synthesis of Resin A-1

Under a nitrogen gas stream, 8.6 g of cyclohexanone was put into a three-neck flask and heated at 80° C. Separately, 12.3 g of t-butyl methacrylate, 13.2 g of norbornane lactone methacrylate, and 8% by mole of a polymerization initiator V-601 (manufactured by Wako Pure Chemical Industries, Ltd.) with respect to a total amount of these monomers were dissolved in 79 g of cyclohexanone to obtain a solution. Next, this solution was added dropwise to the three-neck flask over 6 hours. After completion of the dropwise addition, the mixture was further reacted at 80° C. for 2 hours. The reaction solution was cooled and then added dropwise to a mixed solution of 800 mL of hexane/200 mL of ethyl acetate over 20 minutes, and the precipitated powder was collected by filtration and dried to obtain 19 g of a resin (A-1). The obtained resin had a weight-average molecular weight of 11,000 in terms of polystyrene as a standard and a dispersity (Mw/Mn) of 1.5.

Similarly, other resins (A) shown below were synthesized.

The structures of monomers used in the synthesis of the resin (A) used in Examples and Comparative Examples are shown below. Further, the molar ratios, the weight-average molecular weights (Mw), and the dispersities (Mw/Mn) of the structural units in the respective resin are shown in Table 1.

MA-1

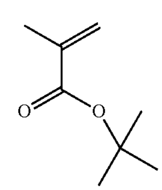

-continued
MA-2
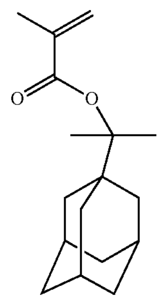
MA-3
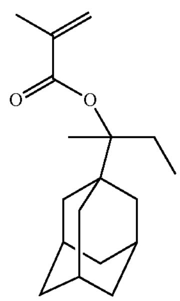
MA-4
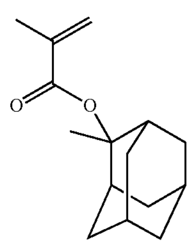
MA-5
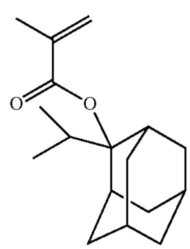
MA-6
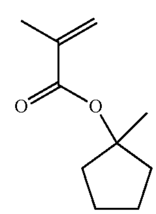
MA-7
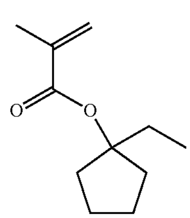
-continued
MA-8
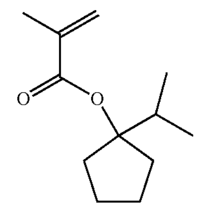
MA-9
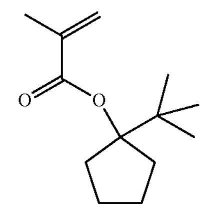
MA-10
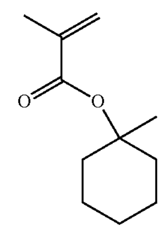
MA-11
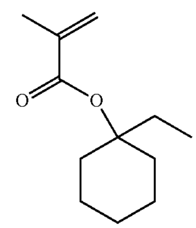
MA-12
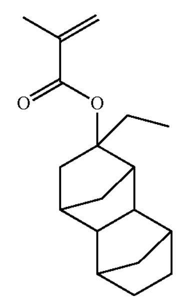
MA-13
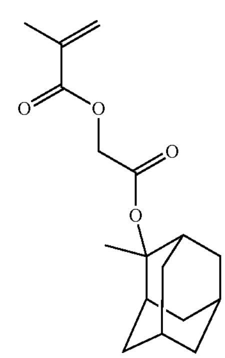

-continued
MB-1
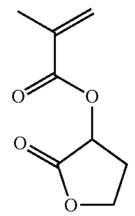
MB-2
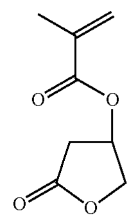
MB-3
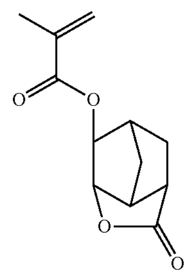
MB-4
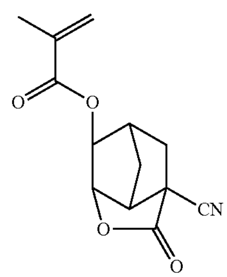
MB-5
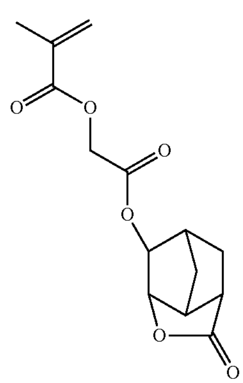
-continued
MB-6
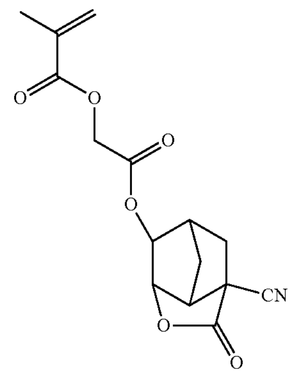
MB-7
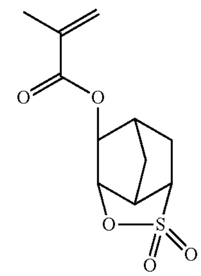
MB-8
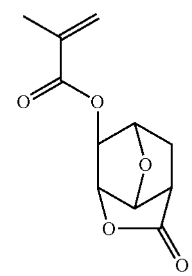
MB-9
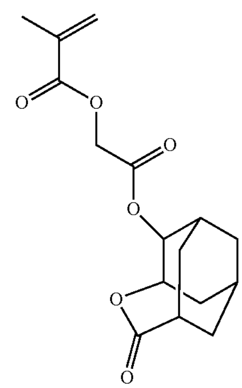
MB-10
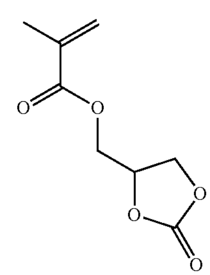

-continued

MB-11

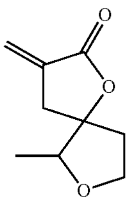

MB-12

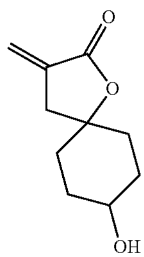

MC-1

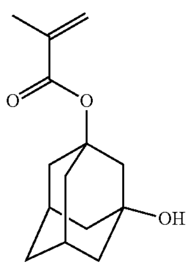

-continued

MC-2

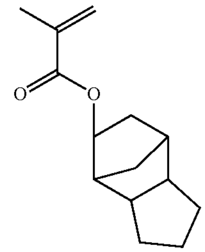

MC-3

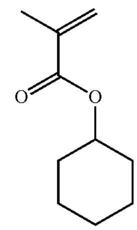

MC-4

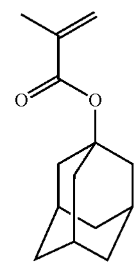

TABLE 1

| | Structural unit 1 | | Structural unit 2 | | Structural unit 3 | | Structural unit 4 | | Structural unit 5 | | | |
|---|---|---|---|---|---|---|---|---|---|---|---|---|
| | Corresponding monomer | Molar ratio (% by mole) | Corresponding monomer | Molar ratio (% by mole) | Corresponding monomer | Molar ratio (% by mole) | Corresponding monomer | Molar ratio (% by mole) | Corresponding monomer | Molar ratio (% by mole) | Mw | Mw/Mn |
| Resin A-1 | MA-1 | 40 | MB-3 | 60 | | | | | | | 11,000 | 1.5 |
| Resin A-2 | MA-2 | 30 | MA-6 | 30 | MB-2 | 40 | | | | | 8,500 | 1.7 |
| Resin A-3 | MA-4 | 20 | MA-7 | 40 | MB-1 | 30 | MC-2 | 10 | | | 9,000 | 1.4 |
| Resin A-4 | MA-10 | 30 | MB-6 | 50 | MC-4 | 20 | | | | | 14,000 | 1.6 |
| Resin A-5 | MA-13 | 40 | MB-5 | 40 | MC-3 | 20 | | | | | 12,000 | 1.5 |
| Resin A-6 | MA-5 | 20 | MA-8 | 40 | MB-4 | 40 | | | | | 10,000 | 1.5 |
| Resin A-7 | MA-3 | 20 | MA-11 | 30 | MB-11 | 40 | MB-12 | 10 | | | 9,500 | 1.7 |
| Resin A-8 | MA-12 | 50 | MB-8 | 40 | MC-1 | 10 | | | | | 7,000 | 1.3 |
| Resin A-9 | MA-9 | 50 | MB-3 | 50 | | | | | | | 12,000 | 1.8 |
| Resin A-10 | MA-7 | 30 | MA-4 | 20 | MB-7 | 30 | MB-5 | 20 | | | 13,000 | 1.6 |
| Resin A-11 | MA-3 | 50 | MB-9 | 50 | | | | | | | 8,000 | 1.5 |
| Resin A-12 | MA-3 | 20 | MA-10 | 40 | MB-10 | 40 | | | | | 9,000 | 1.6 |
| Resin A-13 | MA-2 | 20 | MA-11 | 40 | MB-3 | 40 | | | | | 10,000 | 1.7 |
| Resin A-14 | MA-5 | 20 | MA-13 | 30 | MB-1 | 20 | MB-5 | 20 | MC-4 | 10 | 12,000 | 1.6 |
| Resin A-15 | MA-6 | 40 | MB-1 | 60 | | | | | | | 11,000 | 1.5 |
| Resin A-16 | MA-2 | 20 | MA-9 | 30 | MB-3 | 30 | MB-4 | 20 | | | 9,000 | 1.8 |
| Resin A-17 | MA-1 | 30 | MB-5 | 50 | MC-1 | 20 | | | | | 10,000 | 1.6 |
| Resin A-18 | MA-9 | 60 | MB-7 | 40 | | | | | | | 13,000 | 1.6 |
| Resin A-19 | MA-8 | 50 | MA-4 | 20 | MC-1 | 30 | | | | | 8,000 | 1.5 |
| Resin A-20 | MA-5 | 60 | MB-10 | 30 | MB-11 | 10 | | | | | 15,000 | 1.9 |

Synthesis Example 2: Synthesis of Resin E-1

0.8 g of a compound (ME-3), 0.7 g of a compound (ME-4), and 0.03 g of a polymerization initiator V-601 (manufactured by Wako Pure Chemical Industries, Ltd.) were dissolved in 2.33 g of cyclohexanone to obtain a mixed solution. This mixed solution was added dropwise to 0.44 g of cyclohexanone in the reaction vessel in a system at 85° C. for 4 hours under a nitrogen gas atmosphere. The reaction solution was heated and stirred for 2 hours and then cooled to room temperature (25° C., the same applies below).

The reaction solution was added dropwise to 30 g of methanol/water=9/1 (mass ratio), and the polymer was precipitated and filtered. The filtered solid was spray-washed with 6 g of methanol/water=9/1 (mass ratio). Thereafter, the washed solid was subjected to drying under reduced pressure to obtain 0.89 g of a resin (E-1).

Similarly, hydrophobic resins (E) shown below were synthesized.

The structures of the monomers used in the synthesis of the hydrophobic resin (E) used in Examples and Comparative Examples are shown below. Further, the molar ratios, the weight-average molecular weights (Mw), and the dispersities (Mw/Mn) of the structural units in the respective resin are shown in Table 2.

ME-1

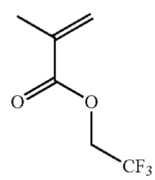

ME-2

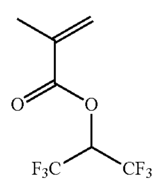

ME-3

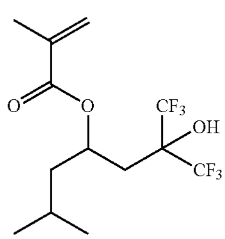

ME-4

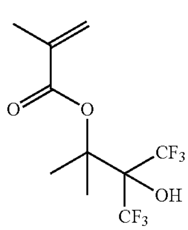

-continued

ME-5

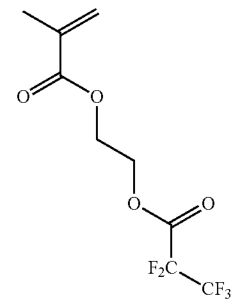

ME-6

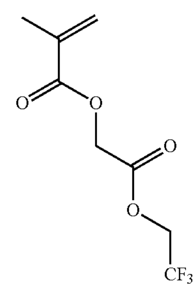

ME-7

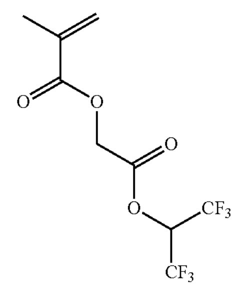

ME-8

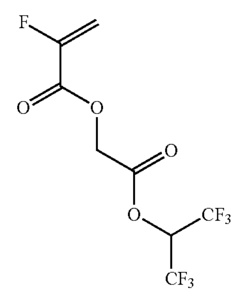

ME-9

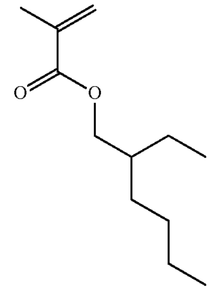

-continued

ME-10

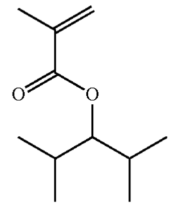

ME-11

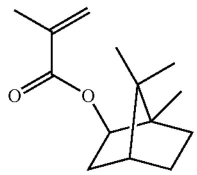

ME-12

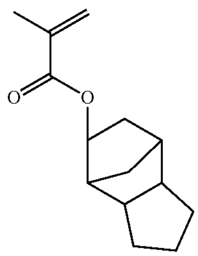

ME-13

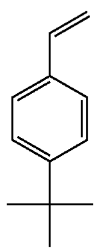

ME-14

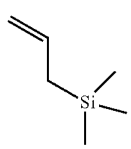

ME-15

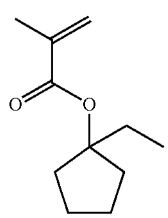

-continued

ME-16

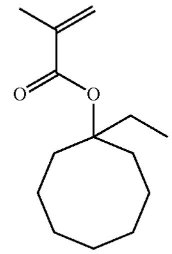

ME-17

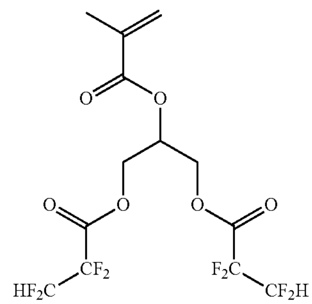

ME-18

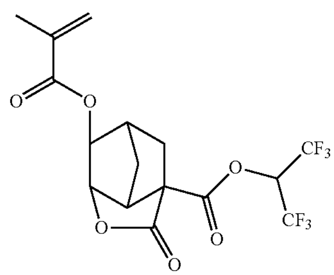

ME-19

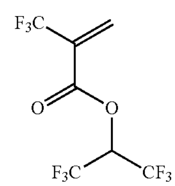

ME-20

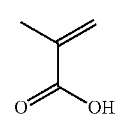

TABLE 2

| | Structural unit 1 | | Structural unit 2 | | Structural unit 3 | | Structural unit 4 | | | |
|---|---|---|---|---|---|---|---|---|---|---|
| | Corresponding monomer | Molar ratio (% by mole) | Corresponding monomer | Molar ratio (% by mole) | Corresponding monomer | Molar ratio (% by mole) | Corresponding monomer | Molar ratio (% by mole) | Mw | Mw/Mn |
| Resin E-1 | ME-3 | 60 | ME-4 | 40 | | | | | 10,000 | 1.4 |
| Resin E-2 | ME-15 | 50 | ME-1 | 50 | | | | | 12,000 | 1.5 |
| Resin E-3 | ME-2 | 40 | ME-13 | 50 | ME-9 | 5 | ME-20 | 5 | 6,000 | 1.3 |
| Resin E-4 | ME-19 | 50 | ME-14 | 50 | | | | | 9,000 | 1.5 |
| Resin E-5 | ME-10 | 50 | ME-2 | 50 | | | | | 15,000 | 1.5 |
| Resin E-6 | ME-17 | 50 | ME-15 | 50 | | | | | 10,000 | 1.5 |
| Resin E-7 | ME-7 | 100 | | | | | | | 23,000 | 1.7 |

TABLE 2-continued

| | Structural unit 1 | | Structural unit 2 | | Structural unit 3 | | Structural unit 4 | | | |
|---|---|---|---|---|---|---|---|---|---|---|
| | Corresponding monomer | Molar ratio (% by mole) | Corresponding monomer | Molar ratio (% by mole) | Corresponding monomer | Molar ratio (% by mole) | Corresponding monomer | Molar ratio (% by mole) | Mw | Mw/Mn |
| Resin E-8 | ME-5 | 100 | | | | | | | 13,000 | 1.5 |
| Resin E-9 | ME-6 | 50 | ME-16 | 50 | | | | | 10,000 | 1.7 |
| Resin E-10 | ME-13 | 10 | ME-18 | 85 | ME-9 | 5 | | | 11,000 | 1.4 |
| Resin E-11 | ME-8 | 80 | ME-11 | 20 | | | | | 13,000 | 1.4 |
| Resin PT-1 | ME-2 | 40 | ME-11 | 30 | ME-9 | 30 | | | 8,000 | 1.6 |
| Resin PT-2 | ME-2 | 50 | ME-12 | 40 | ME-3 | 10 | | | 5,000 | 1.5 |
| Resin PT-3 | ME-3 | 30 | ME-4 | 70 | | | | | 8,500 | 1.7 |

The structures of the photoacid generators (C) used in Examples and Comparative Examples are shown below.

PAG-1

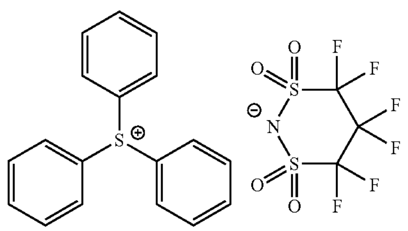

PAG-2

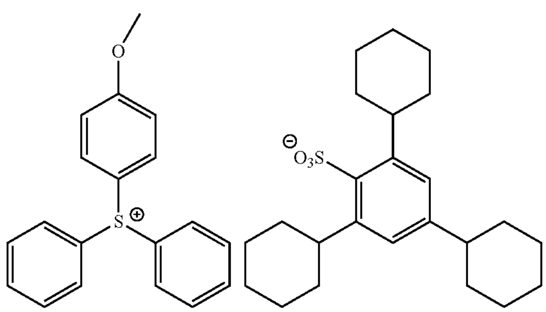

PAG-3

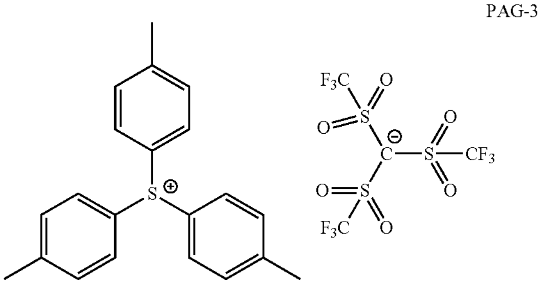

PAG-4

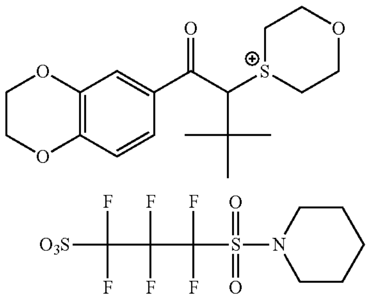

-continued

PAG-5

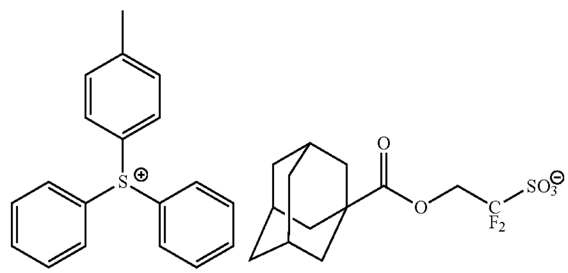

PAG-6

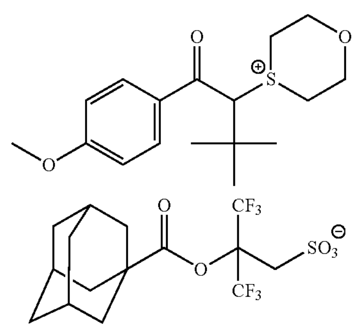

PAG-7

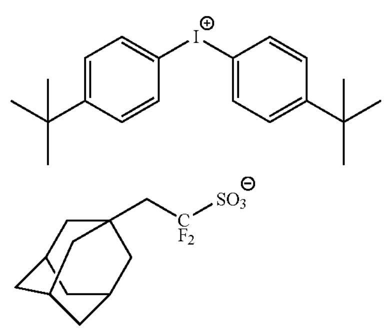

PAG-8

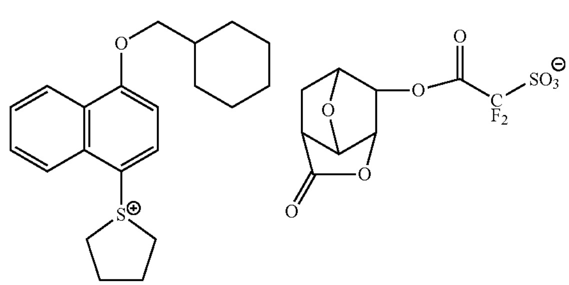

-continued

PAG-9

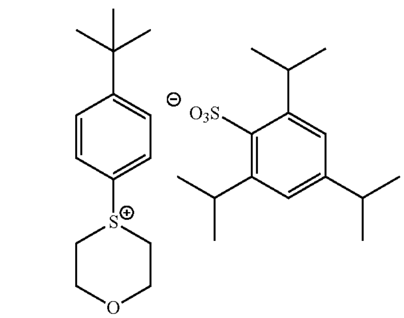

PAG-10

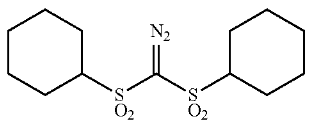

The structures of the acid diffusion control agents (D) used in Examples and Comparative Examples are shown below.

D-1

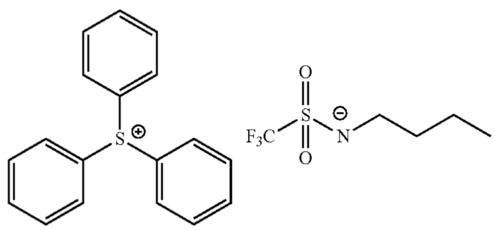

D-2

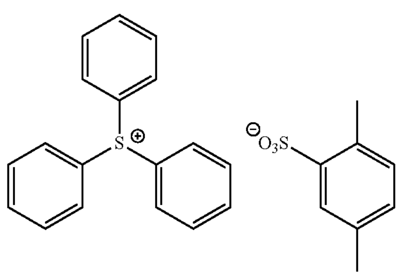

D-3

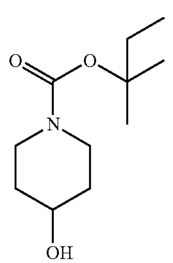

D-4

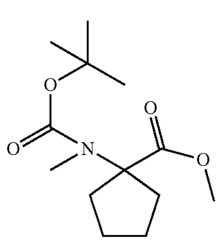

-continued

D-5

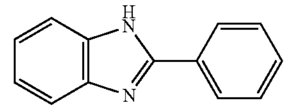

D-6

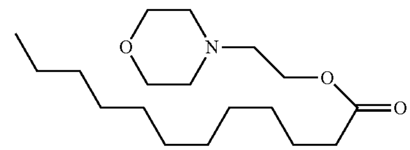

D-7

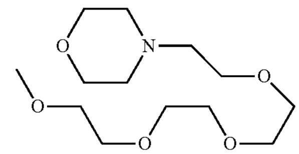

D-8

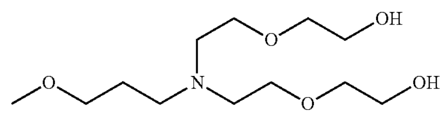

D-9

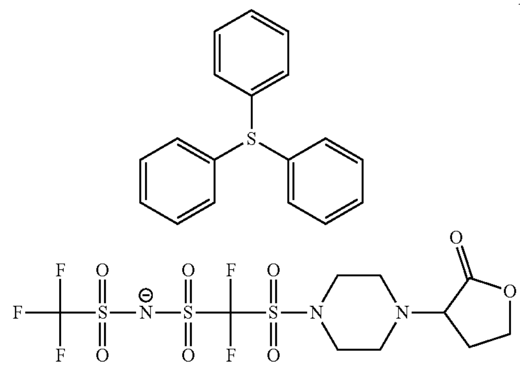

The surfactants (H) used in Examples and Comparative Examples are shown below.

H-1: MEGAFACE F176 (manufactured by DIC Corporation, fluorine-based surfactant)

H-2: MEGAFACE R08 (manufactured by DIC Corporation, fluorine- and silicone-based surfactants)

H-3: PF656 (manufactured by OMNOVA Solutions Inc., fluorine-based surfactant)

H-4: PF6320 (manufactured by OMNOVA Solutions Inc., fluorine-based surfactant)

H-5: FC-4430 (manufactured by Sumitomo 3M, fluorine-based surfactant)

The solvents (F) used in Examples and Comparative Examples are shown below.

F-1: Propylene glycol monomethyl ether (PGME)

F-2: Propylene glycol monomethyl ether acetate (PGMEA)

F-3: Propylene glycol monoethyl ether (PGEE)

F-4: Cyclohexanone

F-5: Cyclopentanone

F-6: 2-Heptanone

F-7: Ethyl lactate

F-8: γ-Butyrolactone

F-9: Propylene carbonate

Examples 1 to 16 and Comparative Examples 1 to 6

<Preparation of Photosensitive Resin Composition>

Each material other than the solvent (F) shown in Table 3 was dissolved in the solvent so that the concentration was 10% by mass. The obtained solution and the solvent (F) were first filtered through a polyethylene filter having a pore diameter of 50 nm and a nylon filter having a pore diameter of 10 nm in this order. Here, the content of the metal atoms (metal content) included in each material was appropriately adjusted by changing the number of times of filtration shown on the left.

Thereafter, the respective components were mixed so that the concentration of the solid contents was 6% by mass, thereby preparing a photosensitive resin composition. The solid content as mentioned herein means all the components other than the solvent (F). The photosensitive resin composition was first filtered through a polyethylene filter having a pore diameter of 50 nm, a nylon filter having a pore diameter of 10 nm, and finally a polyethylene filter having a pore diameter of 5 nm in this order. The obtained photosensitive resin composition was used in Examples and Comparative Examples.

TABLE 3

| Photosensitive resin composition | Resin (A) Type | Resin (A) Parts by mass | Photoacid generator (B) Type | Photoacid generator (B) Parts by mass | Acid diffusion control agent (D) Type | Acid diffusion control agent (D) Parts by mass |
|---|---|---|---|---|---|---|
| Re-1 | A-1 | 1 | PAG-1 | 0.11 | D-1 | 0.025 |
| Re-2 | A-2 | 1 | PAG-1/PAG-2 | 0.08/0.04 | D-2 | 0.028 |
| Re-3 | A-3 | 1 | PAG-3 | 0.13 | D-3 | 0.011 |
| Re-4 | A-4 | 1 | PAG-4 | 0.23 | D-4 | 0.011 |
| Re-5 | A-5 | 1 | PAG-5 | 0.14 | D-5 | 0.011 |
| Re-6 | A-6 | 1 | PAG-5/PAG-6 | 0.07/0.12 | D-6 | 0.022 |
| Re-7 | A-7 | 1 | PAG-6 | 0.2 | D-7 | 0.018 |
| Re-8 | A-8 | 1 | PAG-7 | 0.14 | D-8 | 0.03 |
| Re-9 | A-9 | 1 | PAG-8 | 0.13 | D-9 | 0.042 |
| Re-10 | A-1/A-2 | 0.5/0.5 | PAG-3/PAG-9 | 0.08/0.08 | D-1/D-3 | 0.021/0.011 |
| Re-11 | A-10 | 1 | PAG-4/PAG-10 | 0.09/0.05 | D-3/D-9 | 0.022/0.013 |
| Re-12 | A-11 | 1 | PAG-1 | 0.12 | — | — |
| Re-13 | A-12 | 1 | PAG-3 | 0.13 | D-2 | 0.033 |
| Re-14 | A-13 | 1 | PAG-4 | 0.23 | D-3 | 0.015 |
| Re-15 | A-14 | 1 | PAG-5 | 0.14 | D-4 | 0.012 |
| Re-16 | A-1/A-10 | 0.5/0.5 | PAG-1/PAG-8 | 0.05/0.15 | D-5 | 0.011 |
| Re-A | A-15 | 1 | PAG-1 | 0.11 | D-1 | 0.025 |
| Re-B | A-16 | 1 | PAG-1/PAG-2 | 0.08/0.04 | D-2 | 0.028 |
| Re-C | A-17 | 1 | PAG-3 | 0.13 | D-3 | 0.011 |
| Re-D | A-18 | 1 | PAG-4 | 0.23 | D-4 | 0.011 |
| Re-E | A-19 | 1 | PAG-5 | 0.14 | D-5 | 0.011 |
| Re-F | A-20 | 1 | PAG-5/PAG-6 | 0.07/0.12 | D-6 | 0.022 |

| Photosensitive resin composition | Hydrophobic resin (E) Type | Hydrophobic resin (E) Parts by mass | Surfactant (H) Type | Surfactant (H) Parts by mass | Solvent (F) Type | Solvent (F) Mixing mass ratio |
|---|---|---|---|---|---|---|
| Re-1 | E-1 | 0.008 | H-1 | 0.002 | F-1 | 100 |
| Re-2 | E-2 | 0.012 | H-2 | 0.003 | F-1/F-2 | 50/50 |
| Re-3 | E-3 | 0.006 | H-3 | 0.001 | F-1/F-3 | 80/20 |
| Re-4 | — | — | H-4 | 0.005 | F-1/F-4 | 70/30 |
| Re-5 | E-7 | 0.022 | H-5 | 0.002 | F-1/F-2/F-4 | 1,980/10/10 |
| Re-6 | E-8 | 0.035 | — | — | F-1/F-5 | 60/40 |
| Re-7 | E-9 | 0.021 | — | — | F-1/F-6 | 70/30 |
| Re-8 | E-10 | 0.031 | — | — | F-1/F-7 | 80/20 |
| Re-9 | E-3/E-10 | 0.005/0.023 | — | — | F-1/F-8 | March 1997 |
| Re-10 | E-11 | 0.041 | — | — | F-1/F-9 | October 1990 |
| Re-11 | E-4 | 0.008 | — | — | F-1/F-2/F-9 | 70/25/5 |
| Re-12 | E-5 | 0.011 | — | — | F-1/F-4/F-8 | 70/28/2 |
| Re-13 | E-6 | 0.014 | H-1 | 0.002 | F-2/F-4 | 80/20 |
| Re-14 | — | — | H-2 | 0.006 | F-1/F-2/F-5 | 60/20/20 |
| Re-15 | E-1/E-2 | 0.008/0.043 | — | — | F-1/F-2/F-6 | 70/20/10 |
| Re-16 | E-3/E-11 | 0.004/0.022 | H-3 | 0.004 | F-1/F-4/F-5 | 60/30/10 |
| Re-A | E-1 | 0.008 | H-1 | 0.002 | F-1 | 100 |
| Re-B | E-2 | 0.012 | H-2 | 0.003 | F-1/F-2 | 50/50 |
| Re-C | E-3 | 0.006 | H-3 | 0.001 | F-1/F-3 | 80/20 |
| Re-D | — | — | H-4 | 0.005 | F-1/F-4 | 70/30 |
| Re-E | E-7 | 0.022 | H-5 | 0.002 | F-1/F-2/F-4 | 1,980/10/10 |
| Re-F | E-8 | 0.035 | — | — | F-1/F-5 | 60/40 |

(Evaluation Method)

<Measurement of Content of Each Component and Metal Atoms (Metal Content) of Photosensitive Resin Composition>

The contents of the respective components shown in Table 4 and the content of the metal atoms (metal content) of the photosensitive resin composition were measured as follows.

The content of the metal atoms in the photosensitive resin composition was measured using a triple quadrupole inductively coupled plasma mass spectrometer (8800 manufactured by Agilent).

N-Methylpyrrolidone (NMP, electronic grade) was used as a solvent.

An argon gas was used as a carrier gas, a mixed gas of argon/oxygen was used as a make-up gas, and a mixed gas of helium/ammonia was used as a reaction gas.

The other conditions were set and measured with reference to the description in JP2006-184109A.

<Measurement of Content of Ethylenically Unsaturated Compound in Resin or Photosensitive Resin Composition>

The content of the ethylenically unsaturated compound in the resin and the photosensitive resin composition shown in Table 4 was measured as follows.

The content of the ethylenically unsaturated compound in the resin or the photosensitive resin composition was measured by making a liquid chromatography system Prominence LC-20A manufactured by Shimadzu Corporation, equipped with a reversed-phase octadecyl group-bonded silica (ODS) gel column, under a gradient liquid-feeding condition using a methanol/water-based eluant.

<Pattern Forming Method (1): ArF Liquid Immersion Exposure, Aqueous Alkali Solution Development>

A composition for forming an organic antireflection film, ARC29SR (manufactured by Brewer Science, inc.), was applied onto a silicon wafer and baked at 205° C. for 60 seconds to form an antireflection film having a film thickness of 98 nm. The photosensitive resin composition shown in Table 4 was applied thereonto and baked at 100° C. for 60 seconds to form a photosensitive film having a film thickness of 90 nm. Incidentally, the photosensitive resin composition was stored for 6 months in a constant temperature bath at 35° C. after preparation, and then used.

The photosensitive film was exposed through a 6% halftone mask with a 1:1 line-and-space pattern having a line width of 45 nm, using an ArF excimer laser liquid immersion scanner (manufactured by ASML; XT1950i, NA 1.35, C-Quad, outer sigma 0.930, inner sigma 0.730, and XY deflection). Ultrapure water was used as the immersion liquid.

The exposed photosensitive film was baked at 100° C. for 60 seconds, then developed with an aqueous tetramethylammonium hydroxide solution (TMAH, 2.38% by mass) for 30 seconds, and subsequently rinsed with pure water for 30 seconds. Thereafter, this was spin-dried to obtain a positive tone pattern.

<Pattern Forming Method (2): ArF Liquid Immersion Exposure, Organic Solvent Development>

A composition for forming an organic antireflection film, ARC29SR (manufactured by Brewer Science, inc.), was applied onto a silicon wafer and baked at 205° C. for 60 seconds to form an antireflection film having a film thickness of 98 nm. The photosensitive resin composition shown in Table 4 was applied thereonto and baked at 100° C. for 60 seconds to form a photosensitive film having a film thickness of 90 nm. Incidentally, the photosensitive resin composition was stored for 6 months in a constant temperature bath at 35° C. after preparation, and then used.

The photosensitive film was exposed through a 6% halftone mask with a 1:1 line-and-space pattern having a line width of 45 nm, using an ArF excimer laser liquid immersion scanner (manufactured by ASML; XT1950i, NA 1.35, C-Quad, outer sigma 0.930, inner sigma 0.730, and XY deflection). Ultrapure water was used as the immersion liquid.

The exposed photosensitive film was baked at 100° C. for 60 seconds, then developed with n-butyl acetate for 30 seconds, and subsequently rinsed with 4-methyl-2-pentanol for 30 seconds. Thereafter, this was spin-dried to obtain a negative tone pattern.

<Performance Evaluation>

[Evaluation of Linearity of Pattern Obtained after Lapse of Time (Line Width Roughness (LWR Value), Unit: nm)]

In a case where a 45-nm (1:1) line-and-space resist pattern resolved at the optimum exposure dose was measured from the upper part of the pattern using a critical dimension scanning electron microscope (SEM, CG-4100 manufactured by Hitachi High Technologies Corporation), the line width was observed at any points, and a measurement deviation thereof was evaluated as 3σ. The smaller the value, the better the performance.

The metal contents in the photosensitive resin composition and each material, the content of the ethylenically unsaturated compound, and the LWR value, each measured, are shown in Table 4.

TABLE 4

| | Photosensitive resin composition | | | Resin (A) | | | |
|---|---|---|---|---|---|---|---|
| | Type | Metal content | Content of ethylenically unsaturated compound [% by mass] | Type | Metal content in solid | Content of ethylenically unsaturated compound in solid [% by mass] | Photoacid generator (B) Type |
| Example 1 | Re-1 | 24 ppt | 0.0001% | A-1 | 20 ppt | 0.0020% | PAG-1 |
| Example 2 | Re-2 | 105 ppt | 0.13% | A-2 | 50 ppt | 2.20% | PAG-1/PAG-2 |
| Example 3 | Re-3 | 1 ppt | 0.56% | A-3 | 5 ppt | 9.30% | PAG-3 |
| Example 4 | Re-4 | 2.2 ppb | 0.054% | A-4 | 5 ppb | 0.90% | PAG-4 |
| Example 5 | Re-5 | 5.1 ppb | 0.25% | A-5 | 20 ppb | 4.20% | PAG-5 |
| Example 6 | Re-6 | 8.0 ppb | 0.55% | A-6 | 30 ppb | 9.20% | PAG-5/PAG-6 |
| Example 7 | Re-7 | 10 ppb | 0.0087% | A-7 | 20 ppb | 0.15% | PAG-6 |
| Example 8 | Re-8 | 23 ppb | 0.12% | A-8 | 29 ppb | 2.00% | PAG-7 |
| Example 9 | Re-9 | 28 ppb | 0.58% | A-9 | 10 ppb | 9.70% | PAG-8 |
| Example 10 | Re-10 | 520 ppt | 0.078% | A-1/A-2 | 35 ppt | 1.30% | PAG-3/PAG-9 |
| Example 11 | Re-11 | 980 ppt | 0.15% | A-10 | 400 ppt | 2.50% | PAG-4/PAG-10 |
| Example 12 | Re-12 | 90 ppt | 0.51% | A-11 | 500 ppt | 8.50% | PAG-1 |

TABLE 4-continued

| | | | | | | | |
|---|---|---|---|---|---|---|---|
| Example 13 | Re-13 | 1.1 ppb | 0.06% | A-12 | 6 ppb | 0.95% | PAG-3 |
| Example 14 | Re-14 | 6.1 ppb | 0.33% | A-13 | 10 ppb | 5.50% | PAG-4 |
| Example 15 | Re-15 | 450 ppt | 0.09% | A-14 | 500 ppt | 1.50% | PAG-5 |
| Example 16 | Re-16 | 387 ppt | 0.06% | A-1/A-10 | 800 ppt | 0.90% | PAG-1/PAG-8 |
| Comparative Example 1 | Re-A | 0.5 ppt | 0.63% | A-15 | 4 ppt | 12% | PAG-1 |
| Comparative Example 2 | Re-B | 20 ppb | 0.000041% | A-16 | 11 ppb | 0.0009% | PAG-1/PAG-2 |
| Comparative Example 3 | Re-C | 1.1 ppb | 1.15% | A-17 | 1 ppb | 24% | PAG-3 |
| Comparative Example 4 | Re-D | 41 ppb | 0.00035% | A-18 | 32 ppb | 0.00% | PAG-4 |
| Comparative Example 5 | Re-E | 36 ppb | 0.39% | A-19 | 15 ppb | 8.20% | PAG-5 |
| Comparative Example 6 | Re-F | 206 ppb | 1.41% | A-20 | 105 ppb | 29% | PAG-5/PAG-6 |

| | Photoacid generator (B) | Acid diffusion control agent (D) | | Solvent (F) | | | |
|---|---|---|---|---|---|---|---|
| | Metal content in solid | Type | Metal content in solid | Type | Metal content in solvent | Pattern forming method | LWR value [nm] |
| Example 1 | 100 ppt | D-1 | 200 ppt | F-1 | 30 ppt | (1) | 4.0 |
| Example 2 | 2.0 ppb | D-2 | 3.0 ppb | F-1/F-2 | 110 ppt | (1) | 4.4 |
| Example 3 | 50 ppt | D-3 | 50 ppb | F-1/F-3 | 1 ppt | (1) | 4.5 |
| Example 4 | 10 ppb | D-4 | 200 ppb | F-1/F-4 | 2.0 ppb | (1) | 4.4 |
| Example 5 | 100 ppb | D-5 | 500 ppt | F-1/F-2/F-4 | 3.5 ppb | (1) | 4.6 |
| Example 6 | 200 ppb | D-6 | 800 ppb | F-1/F-5 | 4.8 ppb | (1) | 4.8 |
| Example 7 | 250 ppb | D-7 | 2.0 ppb | F-1/F-6 | 8.0 ppb | (1) | 4.6 |
| Example 8 | 800 ppb | D-8 | 700 ppb | F-1/F-7 | 16 ppb | (1) | 4.9 |
| Example 9 | 10 ppb | D-9 | 900 ppb | F-1/F-8 | 27 ppb | (1) | 5.0 |
| Example 10 | 1 ppb | D-1/D-3 | 8.0 ppb | F-1/F-9 | 600 ppt | (1) | 4.1 |
| Example 11 | 5 ppb | D-3/D-9 | 11 ppb | F-1/F-2/F-9 | 1.0 ppb | (2) | 4.3 |
| Example 12 | 100 ppt | — | — | F-1/F-4/F-8 | 60 ppt | (2) | 4.6 |
| Example 13 | 50 ppt | D-2 | 5.0 ppb | F-2/F-4 | 800 ppt | (2) | 4.3 |
| Example 14 | 10 ppb | D-3 | 50 ppb | F-1/F-2/F-5 | 5.5 ppb | (2) | 4.7 |
| Example 15 | 900 ppt | D-4 | 100 ppb | F-1/F-2/F-6 | 400 ppt | (2) | 4.1 |
| Example 16 | 5.0 ppb | D-5 | 300 ppb | F-1/F-4/F-5 | 200 ppt | (2) | 4.1 |
| Comparative Example 1 | 50 ppt | D-1 | 50 ppt | F-1 | 0.2 ppt | (1) | 7.0 |
| Comparative Example 2 | 800 ppt | D-2 | 700 ppt | F-1/F-2 | 20 ppb | (1) | 7.4 |
| Comparative Example 3 | 500 ppt | D-3 | 300 ppt | F-1/F-3 | 1.0 ppb | (1) | 7.1 |
| Comparative Example 4 | 1050 ppb | D-4 | 1,100 ppb | F-1/F-4 | 33 ppb | (1) | 8.1 |
| Comparative Example 5 | 50 ppb | D-5 | 100 ppb | F-1/F-2/F-4 | 35 ppb | (1) | 7.4 |
| Comparative Example 6 | 230 ppb | D-6 | 4,000 ppb | F-1/F-5 | 184 ppb | (1) | 8.2 |

Furthermore, the metal atoms detected in the photosensitive resin compositions of Examples 1 to 16 were Li, Na, Mg, Al, K, Ca, Cr, Mn, Fe, Co, Ni, Cu, Zn, Mo, Ag, Cd, Sn, W, Au, and Pb.

As shown in Table 4, it can be seen that even with use of the photosensitive resin composition after the lapse of time since the preparation thereof, with regard to the photosensitive films formed in Examples above, the exposed film is subjected to alkali development or organic solvent development to form a pattern with good linearity.

<Synthesis of Resins K-1 and K-2>

Resins K-1 and K-2 were each synthesized in the same manner as the resin A-1, except that the amounts were changed so that the molar ratios of the monomers and the structural units shown in Table 5 were obtained. Further, the molar ratios, the weight-average molecular weights (Mw), and the dispersities (Mw/Mn) of the structural units in the respective resin are shown in Table 5.

TABLE 5

| | Structural unit 1 | | Structural unit 2 | | Structural unit 3 | | | |
|---|---|---|---|---|---|---|---|---|
| | Corresponding monomer | Molar ratio (% by mole) | Corresponding monomer | Molar ratio (% by mole) | Corresponding monomer | Molar ratio (% by mole) | Mw | Mw/Mn |
| Resin K-1 | MK-1 | 60 | MK-2 | 10 | MK-3 | 30 | 15,000 | 1.5 |
| Resin K-2 | MK-1 | 80 | MK-4 | 20 | | | 8,500 | 1.6 |

The structures of the monomers shown in Table 5 are shown below.

MK-1

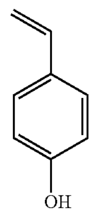

MK-2

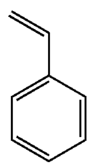

MK-3

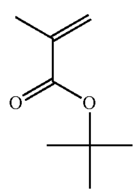

MK-4

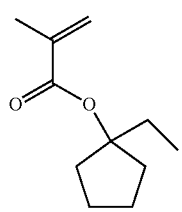

Example 17 and Comparative Example 7: KrF Exposure

<Preparation of Photosensitive Resin Composition>

The components shown in Table 6 below were dissolved in a solvent in the proportions shown in Table 6 below (% by mass in the total mass of the composition) to prepare a resist solution for each, and the resist solution was filtered through an ultra-high-molecular-weight polyethylene (UPE) filter having a pore size of 0.1 μm. Thus, a photosensitive resin composition (resist composition) having a concentration of the solid contents of 7.5% by mass was prepared.

<Pattern Forming Method (3): KrF Exposure, Aqueous Alkali Solution Development>

A composition for forming an organic antireflection film, DUV44 (manufactured by Brewer Science, inc.), was applied onto a silicon wafer and baked at 205° C. for 60 seconds to form an antireflection film having a film thickness of 70 nm. The photosensitive resin composition shown in Table 7 was applied thereonto and baked at 120° C. for 60 seconds to form a photosensitive film having a film thickness of 300 nm. Incidentally, the photosensitive resin composition was stored for 6 months in a constant temperature bath at 35° C. after preparation, and then used.

The photosensitive film was exposed through a 6% halftone mask with a 1:1 line-and-space pattern having a line width of 150 nm, using a KrF excimer laser scanner (NA 0.80, Dipole, outer sigma 0.89, inner sigma 0.65).

The exposed photosensitive film was baked at 120° C. for 60 seconds, developed with an aqueous tetramethylammonium hydroxide solution (TMAH, 2.38% by mass) for 30 seconds, and then rinsed with pure water for 30 seconds. Thereafter, this was spin-dried to obtain a positive tone pattern.

<Evaluation of Linearity of Pattern Obtained after Lapse of Time (Line Width Roughness (LWR Value), Unit: nm)>

In a case where a 150-nm (1:1) line-and-space resist pattern resolved at the optimum exposure dose was measured from the upper part of the pattern using a critical dimension scanning electron microscope (SEM, CG-4100 manufactured by Hitachi High Technologies Corporation), the line width was observed at any points, and a measurement deviation thereof was evaluated as 3σ. The smaller the value, the better the performance.

TABLE 6

| Photosensitive resin composition | Resin (A) | | Photoacid generator (B) | | Acid diffusion control agent (D) | | Surfactant (H) | | Solvent (F) | |
|---|---|---|---|---|---|---|---|---|---|---|
| | Type | Parts by mass | Type | Parts by mass | Type | Parts by mass | Type | Parts by mass | Type | Mixing molar ratio |
| Re-K1 | K-1 | 1 | PAG-5 | 0.04 | D-3 | 0.008 | H-1 | 0.002 | F-1/F-3 | 80/20 |
| Re-K2 | K-2 | 1 | PAG-3 | 0.05 | D-5 | 0.005 | H-2 | 0.003 | F-1/F-4 | 70/30 |

TABLE 7

| | Photosensitive resin composition | | | Resin (A) | | | Photoacid generator (B) | | Acid diffusion inhibitor (D) | | Solvent (F) | | | |
|---|---|---|---|---|---|---|---|---|---|---|---|---|---|---|
| | Type | Metal content | Content of ethylenically unsaturated compound [% by mass] | Type | Metal content in solid | Content of ethylenically unsaturated compound in solid [% by mass] | Type | Metal content in solid | Type | Metal content in solid | Type | Metal content in solvent | Pattern forming method | LWR value [nm] |
| Example 17 | Re-K1 | 1 ppt | 0.0097% | K-1 | 1 ppt | 0.095% | PAG-5 | 50 ppt | D-3 | 20 ppt | F-1/F-3 | 1 ppt | (3) | 7.5 |
| Comparative Example 7 | Re-K2 | 125 ppb | 1.22% | K-2 | 80 ppb | 12% | PAG-3 | 50 ppb | D-5 | 50 ppb | F-1/F-4 | 102 ppb | (3) | 11.3 |

<Synthesis of Resins B-1 and B-2>

Resins B-1 and E B-2 were each synthesized in the same manner as the resin A-1, except that the amounts were changed so that the molar ratios of the monomers and the structural units shown in Table 8 were obtained. Further, the molar ratios, the weight-average molecular weights (Mw), and the dispersities (Mw/Mn) of the structural units in the respective resin are shown in Table 8.

TABLE 8

| | Structural unit 1 | | Structural unit 2 | | | |
|---|---|---|---|---|---|---|
| | Corresponding monomer | Molar ratio (% by mole) | Corresponding monomer | Molar ratio (% by mole) | Mw | Mw/Mn |
| Resin EB-1 | MEB -1 | 90 | MEB-2 | 10 | 3,500 | 1.1 |
| Resin EB-2 | MEB -1 | 85 | MEB-3 | 15 | 8,500 | 1.2 |

The structures of the monomers shown in Table 8 are shown below.

MEB-1

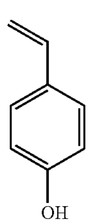

MEB-2

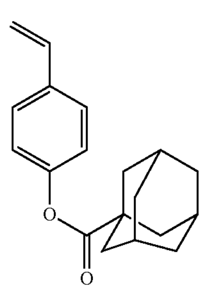

-continued

MEB-3

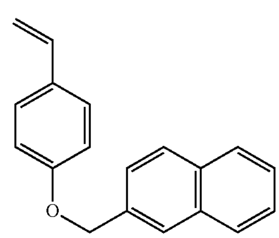

Example 18 and Comparative Example 8: EB Exposure

<Preparation of Photosensitive Resin Composition>

The components shown in Table 9 were dissolved in a solvent to prepare a solution having a concentration of the solid contents of 3.5% by mass for each, and this solution was filtered through a polytetrafluoroethylene filter having a pore size of 0.03 μm to obtain a resist solution.

TABLE 9

| Photosensitive resin composition | Resin (A) Type | Resin (A) Parts by mass | Photoacid generator (B) Type | Photoacid generator (B) Parts by mass | Acid diffusion control agent (D) Type | Acid diffusion control agent (D) Parts by mass | Surfactant (H) Type | Surfactant (H) Parts by mass | Solvent (F) Type | Solvent (F) Mixing ratio | Crosslinking agent (G) Type | Crosslinking agent (G) Parts by mass |
|---|---|---|---|---|---|---|---|---|---|---|---|---|
| Re-EB1 | EB-1 | 1 | PAG-1 | 0.12 | D-3 | 0.012 | H-1 | 0.002 | F-1/F-3 | 80/20 | G-1 | 0.21 |
| Re-EB2 | EB-2 | 1 | PAG-5 | 0.11 | D-5 | 0.014 | H-2 | 0.003 | F-1/F-4 | 70/30 | G-1 | 0.23 |

Furthermore, G-1 described in Table 9 is the following compound.

G-1

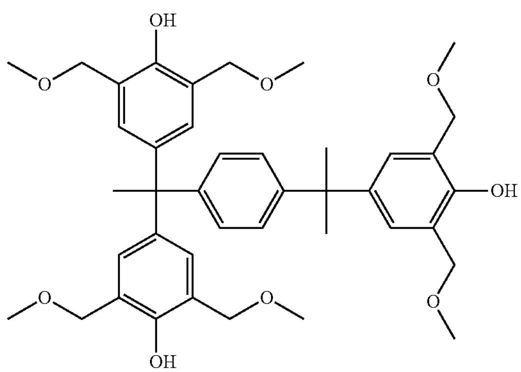

<Pattern Forming Method (4): EB Exposure, Negative Tone Resist Pattern, Aqueous Alkali Solution Development>

The photosensitive resin composition shown in Table 10 was applied onto a 6-inch wafer using a spin coater Mark8 manufactured by Tokyo Electron Ltd., and dried on a hot plate at 110° C. for 90 seconds to obtain a resist film having a film thickness of 80 nm. Incidentally, the photosensitive resin composition was stored for 6 months in a constant temperature bath at 35° C. after preparation, and then used.

[Manufacture of Negative Tone Resist Pattern]

This resist film was subjected to pattern irradiation using an electron beam lithography device (ELS-7500 manufactured by Elionix Co., Ltd., acceleration voltage of 50 KeV). After irradiation, the resist film was heated on a hot plate at 110° C. for 90 seconds, immersed in a 2.38%-by-mass aqueous tetramethylammonium hydroxide solution as a developer for 60 seconds, rinsed with pure water for 30 seconds, and dried.

<Evaluation of Linearity of Pattern Obtained after Lapse of Time (Line Width Roughness (LWR Value), Unit: nm)>

In a case where a 100-nm (1:1) line-and-space resist pattern resolved at the optimum exposure dose was measured from the upper part of the pattern using a critical dimension scanning electron microscope (SEM, S-9220 manufactured by Hitachi High Technologies Corporation), the line width was observed at any points, and a measurement deviation thereof was evaluated as 3σ. The smaller the value, the better the performance.

TABLE 10

| | Photosensitive resin composition Type | Photosensitive resin composition Metal content | Photosensitive resin composition Content of ethylenically unsaturated compound [% by mass] | Resin (A) Type | Resin (A) Metal content in solid | Resin (A) Content of ethylenically unsaturated compound in solid [% by mass] | Photoacid generator (B) Type | Photoacid generator (B) Metal content in solid |
|---|---|---|---|---|---|---|---|---|
| Example 18 | Re-EB1 | 1 ppt | 0.0054% | EB-1 | 1 ppt | 0.12% | PAG-1 | 80 ppt |
| Comparative Example 8 | Re-EB2 | 125 ppb | 1.22% | EB-2 | 80 ppb | 12% | PAG-5 | 100 ppb |

| | Acid diffusion control agent (D) Type | Acid diffusion control agent (D) Metal content in solid | Solvent (F) Type | Solvent (F) Metal content in solvent | Crosslinking agent (G) Type | Crosslinking agent (G) Metal content in solid | Pattern forming method | LWR value [nm] |
|---|---|---|---|---|---|---|---|---|
| Example 18 | D-3 | 20 ppt | F-1/F-3 | 1 ppt | G-1 | 25 ppt | (4) | 4.5 |
| Comparative Example 8 | D-5 | 50 ppb | F-1/F-4 | 102 ppb | G-1 | 25 ppt | (4) | 7.1 |

<Synthesis of Resins V-1 and V-2>

Resins V-1 and V-2 were each synthesized in the same manner as the resin A-1, except that the amounts were changed so that the molar ratios of the monomers and the structural units shown in Table 11 were obtained. Further, the molar ratios, the weight-average molecular weights (Mw), and the dispersities (Mw/Mn) of the structural units in the respective resin are shown in Table 11.

TABLE 11

| | Structural unit 1 | | Structural unit 2 | | Structural unit 3 | | | |
|---|---|---|---|---|---|---|---|---|
| | Corresponding monomer | Molar ratio (% by mole) | Corresponding monomer | Molar ratio (% by mole) | Corresponding monomer | Molar ratio (% by mole) | Mw | Mw/Mn |
| Resin V-1 | MV-1 | 50 | MV-2 | 40 | MV-3 | 10 | 6,000 | 1.3 |
| Resin V-2 | MV-1 | 40 | MV-3 | 20 | MV-4 | 40 | 5,000 | 1.4 |

The structures of the monomers shown in Table 11 are shown below.

MV-1

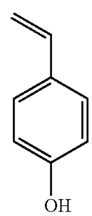

MV-2

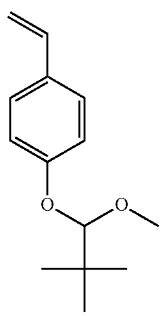

-continued

MV-3

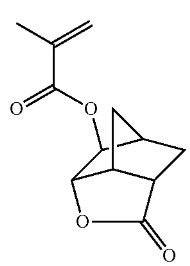

-continued

MV-4

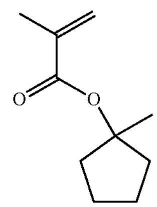

Example 19 and Comparative Example 9: EUV Exposure

<Preparation of Photosensitive Resin Composition>

The components shown in Table 12 were dissolved in a solvent to prepare a solution having a concentration of the solid contents of 1.3% by mass for each component, and this solution was filtered through a polytetrafluoroethylene filter having a pore size of 0.03 μm to obtain a photosensitive resin composition.

TABLE 12

| Photosensitive | Resin (A) | | Photoacid generator (B) | | Acid diffusion control agent (D) | | Surfactant (H) | | Solvent (F) | |
|---|---|---|---|---|---|---|---|---|---|---|
| resin composition | Type | Parts by mass | Type | Parts by mass | Type | Parts by mass | Type | Parts by mass | Type | Mixing mass ratio |
| Re-V1 | V-1 | 1 | PAG-5 | 0.15 | D-1 | 0.015 | H-1 | 0.002 | F-1/F-3 | 80/20 |
| Re-V2 | V-2 | 1 | PAG-2 | 0.18 | D-5 | 0.011 | H-2 | 0.001 | F-1/F-4 | 70/30 |

<Pattern Forming Method (5): Exposure, Aqueous Alkali Solution Development>

AL412 (manufactured by Brewer Science, inc.) was applied onto a silicon wafer and baked at 205° C. for 60 seconds to form an underlayer film having a film thickness of 30 nm. The photosensitive resin composition shown in Table 13 was applied thereonto and baked at 120° C. for 60 seconds to form a photosensitive film having a film thickness of 30 nm. Incidentally, the photosensitive resin composition was stored for 6 months in a constant temperature bath at 35° C. after preparation, and then used.

With regard to the photosensitive film, a silicon wafer having the obtained resist film was subjected to pattern irradiation using an EUV exposure device (manufactured by Exitech Ltd., Micro Exposure Tool, NA 0.3, Quadrupol, outer sigma 0.68, inner sigma 0.36). Further, as the reticle, a mask having a line size=20 nm and a line:space=1:1 was used.

After the photosensitive film after exposure was baked at 120° C. for 60 seconds (Post Exposure Bake; PEB), it is developed with an aqueous tetramethylammonium hydroxide solution (TMAH, 2.38% by mass) for 30 seconds, and then rinsed with pure water for 30 seconds. The line-and-space pattern having a pitch of 40 nm and a line width of 20 nm (space width: 20 nm) was obtained by rotating the silicon wafer at a rotation speed of 4,000 rpm for 30 seconds and baking at 90° C. for 60 seconds.

<Evaluation of Linearity of Pattern Obtained after Lapse of Time (Line Width Roughness (LWR Value), Unit: nm)>

In a case where a 20-nm (1:1) line-and-space resist pattern resolved at the optimum exposure dose was measured from the upper part of the pattern using a critical dimension scanning electron microscope (SEM, CG-4100 manufactured by Hitachi High Technologies Corporation), the line width was observed at any points, and a measurement deviation thereof was evaluated as 3σ. The smaller the value, the better the performance.

MA-14

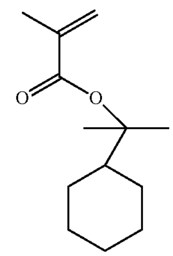

MC-5

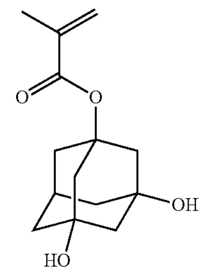

TABLE 13

| | Photosensitive resin composition | | | Resin (A) | | | Photoacid generator (B) | | Acid diffusion control agent (D) | | Solvent (F) | | | |
|---|---|---|---|---|---|---|---|---|---|---|---|---|---|---|
| | Type | Metal content | Content of ethylenically unsaturated compound [% by mass] | Type | Metal content in solid | Content of ethylenically unsaturated compound in solid [% by mass] | Type | Metal content in solid | Type | Metal content in solid | Type | Metal content in solvent | Pattern forming method | LWR value [nm] |
| Example 19 | Re-V1 | 1 ppt | 0.0007% | V-1 | 2 ppt | 0.038% | PAG-5 | 40 ppt | D-1 | 20 ppt | F-1/F-3 | 1 ppt | (5) | 3.2 |
| Comparative Example 9 | Re-V2 | 181 ppb | 1.05% | V-2 | 80 ppb | 30% | PAG-2 | 58 ppb | D-5 | 61 ppb | F-1/F-4 | 172 ppb | (5) | 5.1 |

Synthesis Example 3: Synthesis of Resins A-21 to A-43

Resins A-21 to A-43 were synthesized in the same manner as in the synthesis of A-1, except that the monomers and amounts thereof to be used were changed to the monomers and the molar ratios thereof shown in Table 14 were obtained.

The structures of the monomers used for the synthesis of the resins A-21 to A-43 other than those mentioned above are shown below. Further, the molar ratios, the weight-average molecular weights (Mw), and the dispersities (Mw/Mn) of the structural units in the respective resin are shown in Table 14.

-continued

MB-13

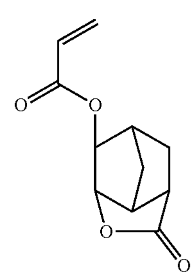

TABLE 14

| | Structural unit 1 | | Structural unit 2 | | Structural unit 3 | | Structural unit 4 | | Structural unit 5 | | | |
|---|---|---|---|---|---|---|---|---|---|---|---|---|
| | Corresponding monomer | Molar ratio (% by mole) | Corresponding monomer | Molar ratio (% by mole) | Corresponding monomer | Molar ratio (% by mole) | Corresponding monomer | Molar ratio (% by mole) | Corresponding monomer | Molar ratio (% by mole) | Mw | Mw/Mn |
| Resin A-21 | MB-3 | 35 | MA-8 | 45 | MA-2 | 20 | | | | | 11,000 | 1.6 |
| Resin A-22 | MB-4 | 40 | MC-5 | 15 | MA-14 | 30 | MC-3 | 5 | ME-20 | 10 | 12,000 | 1.7 |
| Resin A-23 | MB-3 | 50 | MA-11 | 35 | MA-2 | 15 | | | | | 11,000 | 1.6 |
| Resin A-24 | MB-3 | 55 | MA-11 | 35 | MA-2 | 10 | | | | | 9,000 | 1.7 |
| Resin A-25 | MB-3 | 35 | MA-11 | 30 | MA-2 | 25 | MC-3 | 10 | | | 12,000 | 1.7 |
| Resin A-26 | MB-3 | 30 | MC-1 | 20 | MA-7 | 30 | MA-2 | 20 | | | 9,000 | 1.7 |
| Resin A-27 | MB-3 | 50 | MA-11 | 20 | MA-2 | 20 | MC-3 | 10 | | | 12,000 | 1.6 |
| Resin A-28 | MB-3 | 30 | MA-8 | 40 | MA-2 | 30 | | | | | 9,000 | 1.7 |
| Resin A-29 | MB-3 | 50 | MA-11 | 30 | MA-2 | 20 | | | | | 11,000 | 1.7 |
| Resin A-30 | MB-3 | 50 | MA-8 | 35 | MA-2 | 15 | | | | | 10,000 | 1.6 |
| Resin A-31 | MB-4 | 30 | MC-5 | 20 | MA-14 | 30 | MC-3 | 20 | | | 10,000 | 1.6 |
| Resin A-32 | MB-4 | 30 | MB-6 | 10 | MC-1 | 30 | MA-7 | 15 | MA-2 | 15 | 9,000 | 1.7 |
| Resin A-33 | MB-4 | 25 | MB-6 | 25 | MC-1 | 30 | MA-7 | 15 | MA-2 | 5 | 11,000 | 1.6 |
| Resin A-34 | MB-3 | 40 | MB-6 | 15 | MA-7 | 15 | MA-2 | 30 | | | 10,000 | 1.7 |
| Resin A-35 | MB-4 | 25 | MC-5 | 30 | MA-14 | 30 | MC-3 | 15 | | | 11,000 | 1.7 |
| Resin A-36 | MB-6 | 30 | MC-1 | 20 | MA-7 | 20 | MA-2 | 30 | | | 10,000 | 1.7 |
| Resin A-37 | MB-6 | 35 | MC-1 | 30 | MA-7 | 30 | MA-2 | 5 | | | 11,000 | 1.6 |
| Resin A-38 | MB-6 | 25 | MC-5 | 25 | MA-7 | 25 | MA-2 | 25 | | | 10,000 | 1.7 |
| Resin A-39 | MB-3 | 60 | MA-7 | 40 | | | | | | | 12,000 | 1.7 |
| Resin A-40 | MB-3 | 40 | MA-11 | 60 | | | | | | | 9,000 | 1.6 |
| Resin A-41 | MB-6 | 30 | MC-5 | 20 | MA-7 | 20 | MA-2 | 30 | | | 11,000 | 1.7 |
| Resin A-42 | MB-13 | 30 | MC-5 | 30 | MA-2 | 20 | ME-20 | 20 | | | 10,000 | 1.7 |
| Resin A-43 | MB-6 | 40 | MA-7 | 35 | MA-2 | 25 | | | | | 11,000 | 1.6 |

Synthesis Example 4: Synthesis of Resins E-12 to E-23

Resins E-12 to E-23 were synthesized in the same manner as in the synthesis of E-1, except that the monomers and amounts thereof to be used were changed to the monomers and the molar ratios thereof shown in Table 15 were obtained.

The structures of the monomers used for the synthesis of the resins E-12 to E-23 other than those mentioned above are shown below. Further, the molar ratios, the weight-average molecular weights (Mw), and the dispersities (Mw/Mn) of the structural units in the respective resin are shown in Table 15.

ME-21

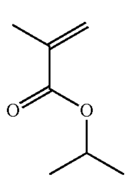

-continued

ME-22

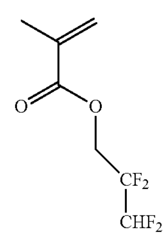

ME-23

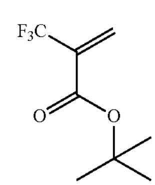

TABLE 15

| | Structural unit 1 | | Structural unit 2 | | Structural unit 3 | | Structural unit 4 | | | |
|---|---|---|---|---|---|---|---|---|---|---|
| | Corre-sponding monomer | Molar ratio (% by mole) | Corre-sponding monomer | Molar ratio (% by mole) | Corre-sponding monomer | Molar ratio (% by mole) | Corre-sponding monomer | Molar ratio (% by mole) | Mw | Mw/Mn |
| Resin E-12 | ME-21 | 50 | ME-10 | 40 | ME-22 | 10 | | | 10,000 | 1.7 |
| Resin E-13 | ME-2 | 30 | ME-13 | 50 | ME-20 | 10 | ME-9 | 10 | 10,000 | 1.6 |
| Resin E-14 | ME-3 | 50 | ME-4 | 50 | | | | | 9,000 | 1.6 |
| Resin E-15 | ME-15 | 60 | ME-1 | 40 | | | | | 11,000 | 1.6 |
| Resin E-16 | ME-2 | 35 | ME-13 | 45 | ME-9 | 10 | ME-20 | 10 | 7,000 | 1.4 |
| Resin E-17 | ME-19 | 60 | ME-14 | 40 | | | | | 10,000 | 1.6 |
| Resin E-18 | ME-10 | 55 | ME-2 | 45 | | | | | 14,000 | 1.7 |
| Resin E-19 | ME-17 | 60 | ME-15 | 40 | | | | | 11,000 | 1.6 |
| Resin E-20 | ME-6 | 55 | ME-16 | 45 | | | | | 12,000 | 1.6 |
| Resin E-21 | ME-13 | 20 | ME-18 | 70 | ME-9 | 10 | | | 10,000 | 1.5 |
| Resin E-22 | ME-14 | 40 | ME-23 | 60 | | | | | 10,000 | 1.7 |
| Resin E-23 | ME-18 | 80 | ME-13 | 10 | ME-9 | 10 | | | 10,000 | 1.6 |

Examples 20 to 157

<Preparation of Photosensitive Resin Composition>

A photosensitive resin composition was prepared in the same manner as in Example 1, except that the materials and the contents thereof were each changed to those shown in Tables 16 to 20.

Further, the metal contents in the measured photosensitive resin composition and the respective materials were measured in the same manner as in Example 1, using the obtained photosensitive resin composition. Further, the LWR values were measured in the same manner as in Example 1, except that the pattern forming method was changed to those shown in Tables 21 to 25. The evaluation results are shown in Tables 21 to 25.

TABLE 16

| Photosensitive resin composition | Resin (A) | | Photoacid generator (B) | | Acid diffusion control agent (D) | | Hydrophobic resin (E) | | Surfactant (H) | | Solvent (F) | |
|---|---|---|---|---|---|---|---|---|---|---|---|---|
| | Type | Parts by mass | Type | Parts by mass | Type | Parts by mass | Type | Parts by mass | Type | Parts by mass | Type | Mixing mass ratio |
| Re-20 | A-21 | 1 | PAG-11/PAG-12 | 0.02/0.2 | D-5 | 0.01 | E-21 | 0.01 | H-6 | 0.1 | F-2/F-1 | 90/10 |
| Re-21 | A-21 | 1 | PAG-11/PAG-12 | 0.02/0.2 | D-1 | 0.1 | E-12 | 0.05 | H-6 | 0.1 | F-2/F-1 | 90/10 |
| Re-22 | A-21 | 1 | PAG-1/PAG-2 | 0.02/0.1 | D-5 | 0.01 | E-12 | 0.05 | H-6 | 0.1 | F-2/F-1 | 90/10 |
| Re-23 | A-1 | 1 | PAG-11/PAG-12 | 0.02/0.2 | D-5 | 0.01 | E-12 | 0.05 | H-6 | 0.1 | F-2/F-1 | 90/10 |
| Re-24 | A-11 | 1 | PAG-6 | 0.22 | D-9 | 0.05 | E-8 | 0.04 | H-1 | 0.01 | F-2/F-1 | 90/10 |
| Re-25 | A-12 | 1 | PAG-1 | 0.14 | D-7 | 0.02 | E-10 | 0.03 | — | — | F-2/F-1 | 90/10 |
| Re-26 | A-22 | 1 | PAG-13/PAG-14 | 0.02/0.1 | D-10/D-11 | 0.01/0.01 | E-20 | 0.05 | H-4 | 0.01 | F-2/F-1 | 60/40 |
| Re-27 | A-22 | 1 | PAG-13/PAG-14 | 0.02/0.1 | D-1/D-4 | 0.01/0.02 | E-13 | 0.01 | H-4 | 0.01 | F-2/F-1 | 60/40 |
| Re-28 | A-22 | 1 | PAG-3 | 0.1 | D-10/D-11 | 0.01/0.01 | E-13 | 0.01 | H-4 | 0.01 | F-2/F-1 | 60/40 |
| Re-29 | A-2 | 1 | PAG-13/PAG-14 | 0.02/0.1 | D-10/D-11 | 0.01/0.01 | E-13 | 0.01 | H-4 | 0.01 | F-2/F-1 | 60/40 |
| Re-30 | A-13 | 1 | PAG-8 | 0.12 | D-4 | 0.01 | E-2 | 0.02 | H-2 | 0.01 | F-2/F-1 | 60/40 |
| Re-31 | A-14 | 1 | PAG-7 | 0.13 | D-2 | 0.03 | E-3 | 0.01 | — | — | F-2/F-1 | 60/40 |
| Re-32 | A-23 | 1 | PAG-11 | 0.1 | D-5 | 0.01 | E-19 | 0.05 | — | — | F-2/F-4 | 70/30 |
| Re-33 | A-23 | 1 | PAG-11 | 0.1 | D-2 | 0.02 | E-13 | 0.01 | — | — | F-2/F-4 | 70/30 |
| Re-34 | A-23 | 1 | PAG-4 | 0.05 | D-5 | 0.01 | E-13 | 0.01 | — | — | F-2/F-4 | 70/30 |
| Re-35 | A-3 | 1 | PAG-11 | 0.1 | D-5 | 0.01 | E-13 | 0.01 | — | — | F-2/F-4 | 70/30 |
| Re-36 | A-21 | 1 | PAG-1 | 0.11 | D-7 | 0.02 | E-9 | 0.03 | H-3 | 0.01 | F-2/F-4 | 70/30 |
| Re-37 | A-22 | 1 | PAG-5 | 0.13 | D-6 | 0.01 | E-7 | 0.02 | — | — | F-2/F-4 | 70/30 |
| Re-38 | A-24 | 1 | PAG-15 | 0.05 | D-12 | 0.1 | E-18 | 0.05 | — | — | F-2/F-1/F-4 | 60/20/20 |
| Re-39 | A-24 | 1 | PAG-15 | 0.05 | D-2/D-9 | 0.01/0.05 | E-13 | 0.01 | — | — | F-2/F-1/F-4 | 60/20/20 |
| Re-40 | A-24 | 1 | PAG-5 | 0.1 | D-12 | 0.1 | E-13 | 0.01 | — | — | F-2/F-1/F-4 | 60/20/20 |
| Re-41 | A-4 | 1 | PAG-15 | 0.05 | D-12 | 0.1 | E-13 | 0.01 | — | — | F-2/F-1/F-4 | 60/20/20 |
| Re-42 | A-1 | 1 | PAG-6 | 0.21 | D-1/D-9 | 0.02/0.01 | E-6 | 0.02 | H-4 | 0.01 | F-2/F-1/F-4 | 60/20/20 |
| Re-43 | A-2 | 1 | PAG-8 | 0.14 | D-6 | 0.03 | E-5 | 0.01 | — | — | F-2/F-1/F-4 | 60/20/20 |
| Re-44 | A-25 | 1 | PAG-15 | 0.1 | D-5/D-13 | 0.02/0.02 | E-17 | 0.01 | — | — | F-2/F-4 | 70/30 |
| Re-45 | A-25 | 1 | PAG-15 | 0.1 | D-4 | 0.01 | E-13 | 0.01 | — | — | F-2/F-4 | 70/30 |
| Re-46 | A-25 | 1 | PAG-6 | 0.1 | D-5/D-13 | 0.02/0.02 | E-13 | 0.01 | — | — | F-2/F-4 | 70/30 |
| Re-47 | A-5 | 1 | PAG-15 | 0.1 | D-5/D-13 | 0.02/0.02 | E-13 | 0.01 | — | — | F-2/F-4 | 70/30 |
| Re-48 | A-3 | 1 | PAG-2/PAG-6 | 0.1/0.2 | D-2/D-7 | 0.03/0.02 | E-1 | 0.01 | H-5 | 0.01 | F-2/F-4 | 70/30 |
| Re-49 | A-4 | 1 | PAG-7 | 0.15 | D-9 | 0.04 | E-10 | 0.04 | — | — | F-2/F-4 | 70/30 |
| Re-50 | A-26 | 1 | PAG-16 | 0.1 | D-8 | 0.02 | E-16 | 0.01 | — | — | F-2/F-4 | 70/30 |
| Re-51 | A-26 | 1 | PAG-16 | 0.1 | D-6 | 0.15 | E-13 | 0.01 | — | — | F-2/F-4 | 70/30 |

TABLE 17

| Photosensitive resin composition | Resin (A) Type | Resin (A) Parts by mass | Photoacid generator (B) Type | Photoacid generator (B) Parts by mass | Acid diffusion control agent (D) Type | Acid diffusion control agent (D) Parts by mass | Hydrophobic resin (E) Type | Hydrophobic resin (E) Parts by mass | Surfactant (H) Type | Surfactant (H) Parts by mass | Solvent (F) Type | Solvent (F) Mixing mass ratio |
|---|---|---|---|---|---|---|---|---|---|---|---|---|
| Re-52 | A-26 | 1 | PAG-7 | 0.1 | D-8 | 0.02 | E-13 | 0.01 | — | — | F-2/F-4 | 70/30 |
| Re-53 | A-6 | 1 | PAG-16 | 0.1 | D-8 | 0.02 | E-13 | 0.01 | — | — | F-2/F-4 | 70/30 |
| Re-54 | A-5 | 1 | PAG-9 | 0.1 | D-1 | 0.04 | E-4 | 0.01 | H-1 | 0.01 | F-2/F-4 | 70/30 |
| Re-55 | A-6 | 1 | PAG-10 | 0.1 | D-9 | 0.01 | E-5 | 0.02 | — | — | F-2/F-4 | 70/30 |
| Re-56 | A-27 | 1 | PAG-15 | 0.1 | D-5/D-13 | 0.01/0.05 | E-15 | 0.1 | — | — | F-2/F-4 | 70/30 |
| Re-57 | A-27 | 1 | PAG-15 | 0.1 | D-6 | 0.01 | E-13 | 0.01 | — | — | F-2/F-4 | 70/30 |
| Re-58 | A-27 | 1 | PAG-2/PAG-8 | 0.03/0.3 | D-5/D-13 | 0.01/0.05 | E-13 | 0.01 | — | — | F-2/F-4 | 70/30 |
| Re-59 | A-7 | 1 | PAG-15 | 0.1 | D-5/D-13 | 0.01/0.05 | E-13 | 0.01 | — | — | F-2/F-4 | 70/30 |
| Re-60 | A-7 | 1 | PAG-4 | 0.25 | D-4 | 0.03 | E-10 | 0.04 | H-2 | 0.01 | F-2/F-4 | 70/30 |
| Re-61 | A-8 | 1 | PAG-5 | 0.15 | D-2 | 0.03 | E-1 | 0.03 | — | — | F-2/F-4 | 70/30 |
| Re-62 | A-28 | 1 | PAG-11/PAG-12 | 0.03/0.3 | D-5 | 0.01 | E-14 | 0.1 | — | — | F-2/F-1 | 90/10 |
| Re-63 | A-28 | 1 | PAG-11/PAG-12 | 0.03/0.3 | D-7 | 0.01 | E-13 | 0.01 | — | — | F-2/F-1 | 90/10 |
| Re-64 | A-28 | 1 | PAG-4/PAG-9 | 0.02/0.15 | D-5 | 0.01 | E-13 | 0.01 | — | — | F-2/F-1 | 90/10 |
| Re-65 | A-8 | 1 | PAG-11/PAG-12 | 0.03/0.3 | D-5 | 0.01 | E-13 | 0.01 | — | — | F-2/F-1 | 90/10 |
| Re-66 | A-9 | 1 | PAG-2 | 0.1 | D-9 | 0.01 | E-5 | 0.01 | H-3 | 0.01 | F-2/F-1 | 90/10 |
| Re-67 | A-10 | 1 | PAG-8 | 0.16 | D-6 | 0.02 | E-2 | 0.02 | — | — | F-2/F-1 | 90/10 |
| Re-68 | A-29 | 1 | PAG-11/PAG-17 | 0.02/0.15 | D-13 | 0.13 | E-13 | 0.01 | — | — | F-2/F-4 | 70/30 |
| Re-69 | A-29 | 1 | PAG-11/PAG-17 | 0.02/0.15 | D-1/D-9 | 0.02/0.01 | E-12 | 0.1 | — | — | F-2/F-4 | 70/30 |
| Re-70 | A-29 | 1 | PAG-2/PAG-5 | 0.06/0.07 | D-13 | 0.13 | E-12 | 0.1 | — | — | F-2/F-4 | 70/30 |
| Re-71 | A-9 | 1 | PAG-11/PAG-17 | 0.02/0.15 | D-13 | 0.13 | E-12 | 0.1 | — | — | F-2/F-4 | 70/30 |
| Re-72 | A-11 | 1 | PAG-4 | 0.26 | D-4 | 0.02 | E-3 | 0.02 | H-4 | 0.01 | F-2/F-4 | 70/30 |
| Re-73 | A-12 | 1 | PAG-9 | 0.1 | D-9 | 0.05 | E-8 | 0.04 | — | — | F-2/F-4 | 70/30 |
| Re-74 | A-30 | 1 | PAG-11/PAG-17 | 0.07/0.08 | D-5 | 0.01 | E-12 | 0.01 | — | — | F-2/F-4 | 75/25 |
| Re-75 | A-30 | 1 | PAG-11/PAG-17 | 0.07/0.08 | D-2 | 0.02 | E-13 | 0.01 | — | — | F-2/F-4 | 75/25 |
| Re-76 | A-30 | 1 | PAG-1/PAG-6 | 0.02/0.2 | D-5 | 0.01 | E-13 | 0.01 | — | — | F-2/F-4 | 75/25 |
| Re-77 | A-10 | 1 | PAG-11/PAG-17 | 0.07/0.08 | D-5 | 0.01 | E-13 | 0.01 | — | — | F-2/F-4 | 75/25 |
| Re-78 | A-13 | 1 | PAG-4/PAG-6 | 0.1/0.1 | D-2 | 0.05 | E-1/E-3 | 0.02/0.02 | H-5 | 0.01 | F-2/F-4 | 75/25 |
| Re-79 | A-14 | 1 | PAG-2 | 0.11 | D-4 | 0.02 | E-5 | 0.02 | — | — | F-2/F-4 | 75/25 |
| Re-80 | A-31 | 1 | PAG-13/PAG-14 | 0.02/0.1 | D-11/D-10/D-12 | 0.02/0.02/0.03 | E-5 | 0.02 | H-4 | 0.01 | F-2/F-1 | 60/40 |
| Re-81 | A-31 | 1 | PAG-13/PAG-14 | 0.02/0.1 | D-1/D-2/D-6 | 0.03/0.04/0.01 | E-22 | 0.01 | H-4 | 0.01 | F-2/F-1 | 60/40 |
| Re-82 | A-31 | 1 | PAG-6/PAG-7 | 0.15/0.20 | D-11/D-10/D-12 | 0.02/0.02/0.03 | E-22 | 0.01 | H-4 | 0.01 | F-2/F-1 | 60/40 |
| Re-83 | A-10 | 1 | PAG-13/PAG-14 | 0.02/0.1 | D-11/D-10/D-12 | 0.02/0.02/0.03 | E-22 | 0.01 | H-4 | 0.01 | F-2/F-1 | 60/40 |

TABLE 18

| Photosensitive resin composition | Resin (A) Type | Resin (A) Parts by mass | Photoacid generator (B) Type | Photoacid generator (B) Parts by mass | Acid diffusion control agent (D) Type | Acid diffusion control agent (D) Parts by mass | Hydrophobic resin (E) Type | Hydrophobic resin (E) Parts by mass | Surfactant (H) Type | Surfactant (H) Parts by mass | Solvent (F) Type | Solvent (F) Mixing mass ratio |
|---|---|---|---|---|---|---|---|---|---|---|---|---|
| Re-84 | A-8 | 1 | PAG-1 | 0.2 | D-2/D-7 | 0.03/0.04 | E-5/E-7 | 0.02/0.05 | H-3 | 0.01 | F-2/F-1 | 60/40 |
| Re-85 | A-6 | 1 | PAG-2 | 0.1 | D-4/D-9 | 0.05/0.02 | E-9/E-11 | 0.03/0.05 | — | — | F-2/F-1 | 60/40 |
| Re-86 | A-32 | 1 | PAG-18/PAG-14 | 0.02/0.1 | D-14/D-15 | 0.01/0.01 | E-2/E-10 | 0.02/0.04 | H-4 | 0.01 | F-2/F-1 | 95/5 |

TABLE 18-continued

| Photosensitive resin composition | Resin (A) Type | Resin (A) Parts by mass | Photoacid generator (B) Type | Photoacid generator (B) Parts by mass | Acid diffusion control agent (D) Type | Acid diffusion control agent (D) Parts by mass | Hydrophobic resin (E) Type | Hydrophobic resin (E) Parts by mass | Surfactant (H) Type | Surfactant (H) Parts by mass | Solvent (F) Type | Solvent (F) Mixing mass ratio |
|---|---|---|---|---|---|---|---|---|---|---|---|---|
| Re-87 | A-32 | 1 | PAG-18/ PAG-14 | 0.02/0.1 | D-1/D-4 | 0.02/0.03 | E-13/E-23 | 0.02/0.1 | H-4 | 0.01 | F-2/F-1 | 95/5 |
| Re-88 | A-32 | 1 | PAG-3/ PAG-4 | 0.2/0.3 | D-14/D-15 | 0.01/0.01 | E-13/E-23 | 0.02/0.1 | H-4 | 0.01 | F-2/F-1 | 95/5 |
| Re-89 | A-12 | 1 | PAG-18/ PAG-14 | 0.02/0.1 | D-14/D-15 | 0.01/0.01 | E-13/E-23 | 0.02/0.1 | H-4 | 0.01 | F-2/F-1 | 95/5 |
| Re-90 | A-13 | 1 | PAG-5/ PAG-6 | 0.1/0.2 | D-2 | 0.04 | E-14/E-16 | 0.02/0.02 | H-5 | 0.01 | F-2/F-1 | 95/5 |
| Re-91 | A-12 | 1 | PAG-7 | 0.2 | D-7 | 0.05 | E-15 | 0.12 | — | — | F-2/F-1 | 95/5 |
| Re-92 | A-33 | 1 | PAG-16/ PAG-19 | 0.1/0.2 | D-3 | 0.01 | E-7 | 0.04 | — | — | F-2/F-8 | 96.5/3.5 |
| Re-93 | A-33 | 1 | PAG-16/ PAG-19 | 0.1/0.2 | D-6 | 0.01 | E-23 | 0.1 | — | — | F-2/F-8 | 96.5/3.5 |
| Re-94 | A-33 | 1 | PAG-8 | 0.2 | D-3 | 0.01 | E-23 | 0.1 | — | — | F-2/F-8 | 96.5/3.5 |
| Re-95 | A-14 | 1 | PAG-16/ PAG-19 | 0.1/0.2 | D-3 | 0.01 | E-23 | 0.1 | — | — | F-2/F-8 | 96.5/3.5 |
| Re-96 | A-13 | 1 | PAG-9/ PAG-10 | 0.1/0.1 | D-7 | 0.02 | E-18 | 0.1 | H-1 | 0.002 | F-2/F-8 | 96.5/3.5 |
| Re-97 | A-11 | 1 | PAG-1/ PAG-3 | 0.2/0.2 | D-9 | 0.02 | E-20 | 0.05 | — | — | F-2/F-8 | 96.5/3.5 |
| Re-98 | A-34 | 1 | PAG-11/ PAG-17 | 0.1/0.2 | D-3 | 0.1 | E-8 | 0.05 | — | — | F-2/F-8 | 96.5/3.5 |
| Re-99 | A-34 | 1 | PAG-11/ PAG-17 | 0.1/0.2 | D-6 | 0.05 | E-23 | 0.05 | — | — | F-2/F-8 | 96.5/3.5 |
| Re-100 | A-34 | 1 | PAG-2/ PAG-4 | 0.1/0.3 | D-3 | 0.1 | E-23 | 0.05 | — | — | F-2/F-8 | 96.5/3.5 |
| Re-101 | A-2 | 1 | PAG-11/ PAG-17 | 0.1/0.2 | D-3 | 0.1 | E-23 | 0.05 | — | — | F-2/F-8 | 96.5/3.5 |
| Re-102 | A-1 | 1 | PAG-6 | 0.3 | D-4 | 0.03 | E-21 | 0.012 | H-2 | 0.007 | F-2/F-8 | 96.5/3.5 |
| Re-103 | A-3 | 1 | PAG-8 | 0.15 | D-1 | 0.02 | E-2 | 0.02 | — | — | F-2/F-8 | 96.5/3.5 |
| Re-104 | A-35 | 1 | PAG-13/ PAG-14 | 0.03/0.1 | D-3/D-13 | 0.02/0.02 | E-1/E-4 | 0.02/0.02 | H-4 | 0.01 | F-2/F-1 | 60/40 |
| Re-105 | A-35 | 1 | PAG-13/ PAG-14 | 0.03/0.1 | D-6 | 0.01 | E-13/E-23 | 0.02/0.03 | H-4 | 0.01 | F-2/F-1 | 60/40 |
| Re-106 | A-35 | 1 | PAG-3/ PAG-7 | 0.15/0.15 | D-3/D-13 | 0.02/0.02 | E-13/E-23 | 0.02/0.03 | H-4 | 0.01 | F-2/F-1 | 60/40 |
| Re-107 | A-4 | 1 | PAG-13/ PAG-14 | 0.03/0.1 | D-3/D-13 | 0.02/0.02 | E-13/E-23 | 0.02/0.03 | H-4 | 0.01 | F-2/F-1 | 60/40 |
| Re-108 | A-6 | 1 | PAG-8 | 0.2 | D-7 | 0.02 | E-8/E-10 | 0.02 | H-2 | 0.008 | F-2/F-1 | 60/40 |
| Re-109 | A-8 | 1 | PAG-10 | 0.1 | D-9 | 0.03 | E-14/E-16 | 0.06/0.02 | — | — | F-2/F-1 | 60/40 |
| Re-110 | A-36 | 1 | PAG-19/ PAG-16 | 0.3/0.05 | D-16/D-17 | 0.02/0.1 | E-6/E-7 | 0.03/0.03 | H-4 | 0.01 | F-2/F-4 | 97.5/2.5 |
| Re-111 | A-36 | 1 | PAG-19/ PAG-16 | 0.3/0.05 | D-2 | 0.01 | E-13/E-23 | 0.01/0.04 | H-4 | 0.01 | F-2/F-4 | 97.5/2.5 |
| Re-112 | A-36 | 1 | PAG-4/ PAG-6 | 0.3/0.3 | D-16/D-17 | 0.02/0.1 | E-13/E-23 | 0.01/0.04 | H-4 | 0.01 | F-2/F-4 | 97.5/2.5 |
| Re-113 | A-6 | 1 | PAG-19/ PAG-16 | 0.3/0.05 | D-16/D-17 | 0.02/0.1 | E-13/E-23 | 0.01/0.04 | H-4 | 0.01 | F-2/F-4 | 97.5/2.5 |
| Re-114 | A-2 | 1 | PAG-7 | 0.2 | D-7 | 0.02 | E-5/E-8 | 0.01/0.05 | H-3 | 0.002 | F-2/F-4 | 97.5/2.5 |
| Re-115 | A-7 | 1 | PAG-3 | 0.2 | D-6 | 0.04 | E-6/E-8 | 0.014/ 0.04 | — | — | F-2/F-4 | 97.5/2.5 |

TABLE 19

| Photo-sensitive resin composition | Resin (A) Type | Resin (A) Parts by mass | Photoacid generator (B) Type | Photoacid generator (B) Parts by mass | Acid diffusion control agent (D) Type | Acid diffusion control agent (D) Parts by mass | Hydrophobic resin (E) Type | Hydrophobic resin (E) Parts by mass | Surfactant (H) Type | Surfactant (H) Parts by mass | Solvent (F) Type | Solvent (F) Mixing mass ratio |
|---|---|---|---|---|---|---|---|---|---|---|---|---|
| Re-116 | A-37 | 1 | PAG-20/ PAG-16 | 0.1/0.2 | D-16/D-18 | 0.01/0.1 | E-8/E-9 | 0.05/0.01 | — | — | F-2/F-4 | 97.5/2.5 |
| Re-117 | A-37 | 1 | PAG-20/ PAG-16 | 0.1/0.2 | D-4/D-6 | 0.02/0.03 | E-13/E-23 | 0.02/0.04 | — | — | F-2/F-4 | 97.5/2.5 |
| Re-118 | A-37 | 1 | PAG-1/ PAG-8 | 0.1/0.2 | D-16/D-18 | 0.01/0.1 | E-13/E-23 | 0.02/0.04 | — | — | F-2/F-4 | 97.5/2.5 |
| Re-119 | A-8 | 1 | PAG-20/ PAG-16 | 0.1/0.2 | D-16/D-18 | 0.01/0.1 | E-13/E-23 | 0.02/0.04 | — | — | F-2/F-4 | 97.5/2.5 |

TABLE 19-continued

| Photo-sensitive resin | Resin (A) | | Photoacid generator (B) | | Acid diffusion control agent (D) | | Hydrophobic resin (E) | | Surfactant (H) | | Solvent (F) | |
|---|---|---|---|---|---|---|---|---|---|---|---|---|
| composition | Type | Parts by mass | Type | Parts by mass | Type | Parts by mass | Type | Parts by mass | Type | Parts by mass | Type | Mixing mass ratio |
| Re-120 | A-9 | 1 | PAG-3 | 0.3 | D-7/D-9 | 0.02/0.02 | E-14/E-21 | 0.12/0.01 | H-3 | 0.001 | F-2/F-4 | 97.5/2.5 |
| Re-121 | A-10 | 1 | PAG-5 | 0.4 | D-4/D-7 | 0.04/0.01 | E-15/E-20 | 0.15/0.07 | — | — | F-2/F-4 | 97.5/2.5 |
| Re-122 | A-38 | 1 | PAG-14 | 0.2 | D-14 | 0.01 | E-10 | 0.05 | H-4/H-7 | 0.005/0.005 | F-2/F-1 | 60/40 |
| Re-123 | A-38 | 1 | PAG-14 | 0.2 | D-2 | 0.01 | E-23 | 0.1 | H-4/H-7 | 0.005/0.005 | F-2/F-1 | 60/40 |
| Re-124 | A-38 | 1 | PAG-3 | 0.35 | D-14 | 0.01 | E-23 | 0.1 | H-4/H-7 | 0.005/0.005 | F-2/F-1 | 60/40 |
| Re-125 | A-9 | 1 | PAG-14 | 0.2 | D-14 | 0.01 | E-23 | 0.1 | H-4/H-7 | 0.005/0.005 | F-2/F-1 | 60/40 |
| Re-126 | A-4 | 1 | PAG-5 | 0.25 | D-9 | 0.02 | E-17 | 0.02 | H-4 | 0.005 | F-2/F-1 | 60/40 |
| Re-127 | A-6 | 1 | PAG-7 | 0.15 | D-4 | 0.05 | E-16 | 0.03 | — | — | F-2/F-1 | 60/40 |
| Re-128 | A-39 | 1 | PAG-16/PAG-21 | 0.1/0.2 | D-3 | 0.02 | E-11 | 0.06 | — | — | F-2/F-8 | 96.5/3.5 |
| Re-129 | A-39 | 1 | PAG-16/PAG-21 | 0.1/0.2 | D-4 | 0.01 | E-23 | 0.1 | — | — | F-2/F-8 | 96.5/3.5 |
| Re-130 | A-39 | 1 | PAG-4 | 0.25 | D-3 | 0.02 | E-23 | 0.1 | — | — | F-2/F-8 | 96.5/3.5 |
| Re-131 | A-11 | 1 | PAG-16/PAG-21 | 0.1/0.2 | D-3 | 0.02 | E-23 | 0.1 | — | — | F-2/F-8 | 96.5/3.5 |
| Re-132 | A-5 | 1 | PAG-6/PAG-8 | 0.23/0.16 | D-7 | 0.02 | E-8 | 0.035 | H-5 | 0.003 | F-2/F-8 | 96.5/3.5 |
| Re-133 | A-7 | 1 | PAG-10 | 0.2 | D-6 | 0.03 | E-10 | 0.031 | — | — | F-2/F-8 | 96.5/3.5 |
| Re-134 | A-40 | 1 | PAG-16/PAG-22 | 0.1/0.2 | D-3/D-13 | 0.01/0.02 | E-14 | 0.15 | — | — | F-2/F-8 | 95/5 |
| Re-135 | A-40 | 1 | PAG-16/PAG-22 | 0.1/0.2 | D-2/D-7 | 0.01/0.01 | E-23 | 0.02 | — | — | F-2/F-8 | 95/5 |
| Re-136 | A-40 | 1 | PAG-3/PAG-5 | 0.17/0.16 | D-3/D-13 | 0.01/0.02 | E-23 | 0.02 | — | — | F-2/F-8 | 95/5 |
| Re-137 | A-13 | 1 | PAG-16/PAG-22 | 0.1/0.2 | D-3/D-13 | 0.01/0.02 | E-23 | 0.02 | — | — | F-2/F-8 | 95/5 |
| Re-138 | A-14 | 1 | PAG-6 | 0.28 | D-9 | 0.01 | E-5 | 0.012 | H-5 | 0.002 | F-2/F-8 | 95/5 |
| Re-139 | A-2 | 1 | PAG-7 | 0.26 | D-1 | 0.01 | E-6 | 0.015 | — | — | F-2/F-8 | 95/5 |
| Re-140 | A-41 | 1 | PAG-14 | 0.1 | D-14/D-12 | 0.01/0.02 | — | — | H-4/H-7 | 0.005/0.005 | F-2/F-1 | 60/40 |
| Re-141 | A-41 | 1 | PAG-14 | 0.1 | D-2/D-7 | 0.01/0.01 | — | — | H-4/H-7 | 0.005/0.005 | F-2/F-1 | 60/40 |
| Re-142 | A-41 | 1 | PAG-1 | 0.14 | D-14/D-12 | 0.01/0.02 | — | — | H-4/H-7 | 0.005/0.005 | F-2/F-1 | 60/40 |
| Re-143 | A-1 | 1 | PAG-14 | 0.1 | D-14/D-12 | 0.01/0.02 | — | — | H-4/H-7 | 0.005/0.005 | F-2/F-1 | 60/40 |

TABLE 20

| Photosensitive resin composition | Resin (A) | | Photoacid generator (B) | | Acid diffusion control agent (D) | | Hydrophobic resin (E) | | Surfactant (H) | | Solvent (F) | |
|---|---|---|---|---|---|---|---|---|---|---|---|---|
| | Type | Parts by mass | Type | Parts by mass | Type | Parts by mass | Type | Parts by mass | Type | Parts by mass | Type | Mixing mass ratio |
| Re-144 | A-2 | 1 | PAG-2/PAG-3 | 0.14/0.16 | D-2/D-9 | 0.01/0.02 | — | — | H-5 | 0.002 | F-2/F-1 | 60/40 |
| Re-145 | A-3 | 1 | PAG-7/PAG-8 | 0.17/0.18 | D-2/D-6 | 0.02/0.01 | — | — | — | — | F-2/F-1 | 60/40 |
| Re-146 | A-42 | 1 | PAG-13 | 0.05 | D-14 | 0.01 | — | — | H-4/H-7 | 0.005/0.005 | F-2/F-1 | 60/40 |
| Re-147 | A-42 | 1 | PAG-13 | 0.05 | D-4 | 0.01 | — | — | H-4/H-7 | 0.005/0.005 | F-2/F-1 | 60/40 |
| Re-148 | A-42 | 1 | PAG-3 | 0.12 | D-14 | 0.01 | — | — | H-4/H-7 | 0.005/0.005 | F-2/F-1 | 60/40 |
| Re-149 | A-3 | 1 | PAG-13 | 0.05 | D-14 | 0.01 | — | — | H-4/H-7 | 0.005/0.005 | F-2/F-1 | 60/40 |
| Re-150 | A-11 | 1 | PAG-1/PAG-8 | 0.10/0.10 | D-6 | 0.01 | — | — | H-3 | 0.002 | F-2/F-1 | 60/40 |
| Re-151 | A-14 | 1 | PAG-2/PAG-7 | 0.06/0.16 | D-7 | 0.01 | — | — | — | — | F-2/F-1 | 60/40 |
| Re-152 | A-43 | 1 | PAG-23 | 0.2 | D-3 | 0.02 | E-17 | 0.02 | — | — | F-2/F-4 | 90/10 |
| Re-153 | A-43 | 1 | PAG-23 | 0.2 | D-8 | 0.02 | E-13 | 0.01 | — | — | F-2/F-4 | 90/10 |
| Re-154 | A-43 | 1 | PAG-2/PAG-5 | 0.05/0.16 | D-3 | 0.02 | E-13 | 0.01 | — | — | F-2/F-4 | 90/10 |
| Re-155 | A-5 | 1 | PAG-23 | 0.2 | D-3 | 0.02 | E-13 | 0.01 | — | — | F-2/F-4 | 90/10 |
| Re-156 | A-6 | 1 | PAG-3 | 0.14 | D-6 | 0.01 | E-18 | 0.06 | H-2 | 0.005 | F-2/F-4 | 90/10 |
| Re-157 | A-9 | 1 | PAG-6 | 0.25 | D-9 | 0.03 | E-8 | 0.037 | — | — | F-2/F-4 | 90/10 |

TABLE 21

| | Photosensitive resin composition Type | Photosensitive resin composition Metal content | Content of ethylenically unsaturated compound [% by mass] | Resin (A) Type | Resin (A) Metal content in solid | Content ethylenically unsaturated compound in solid [% by mass] | Photoacid generator (B) Type | Photoacid generator (B) Metal content in solid | Acid diffusion control agent (D) Type | Acid diffusion control agent (D) Metal content in solid | Solvent (F) Type | Solvent (F) Metal content in solvent | Pattern forming method | LWR value [nm] |
|---|---|---|---|---|---|---|---|---|---|---|---|---|---|---|
| Example 20 | Re-20 | 100 ppt | 0.138% | A-21 | 15 ppb | 2.30% | PAG-11/ PAG-12 | 2.0 ppb | D-5 | 500 ppt | F-1/F-2 | 110 ppt | (1) | 4.4 |
| Example 21 | Re-21 | 120 ppt | 0.138% | A-21 | 50 ppt | 2.30% | PAG-11/ PAG-12 | 2.0 ppb | D-1 | 200 ppt | F-1/F-2 | 110 ppt | (1) | 4.5 |
| Example 22 | Re-22 | 115 ppt | 0.138% | A-21 | 30 ppt | 2.30% | PAG-1/ PAG-2 | 2.0 ppb | D-5 | 500 ppt | F-1/F-2 | 110 ppt | (1) | 4.8 |
| Example 23 | Re-23 | 130 ppt | 0.00012% | A-1 | 35 ppt | 0.0020% | PAG-11/ PAG-12 | 2.0 ppb | D-5 | 500 ppt | F-1/F-2 | 110 ppt | (1) | 4.6 |
| Example 24 | Re-24 | 95 ppt | 0.51% | A-11 | 10 ppt | 8.50% | PAG-6 | 250 ppb | D-9 | 900 ppb | F-1/F-2 | 110 ppt | (1) | 4.7 |
| Example 25 | Re-25 | 125 ppt | 0.057% | A-12 | 40 ppt | 0.95% | PAG-1 | 100 ppt | D-7 | 2.0 ppb | F-1/F-2 | 110 ppt | (1) | 4.9 |
| Example 26 | Re-26 | 140 ppt | 0.2700% | A-22 | 70 ppt | 4.50% | PAG-13/ PAG-14 | 800 ppt | D-10/ D-11 | 25 ppb | F-1/F-2 | 150 ppt | (1) | 5.0 |
| Example 27 | Re-27 | 160 ppt | 0.27% | A-22 | 60 ppt | 4.50% | PAG-13/ PAG-14 | 800 ppt | D-1/ D-4 | 30 ppb | F-1/F-2 | 150 ppt | (1) | 4.5 |
| Example 28 | Re-28 | 155 ppt | 0.27% | A-22 | 80 ppt | 4.50% | PAG-3 | 50 ppt | D-10/ D-11 | 5 ppb | F-1/F-2 | 150 ppt | (1) | 4.4 |
| Example 29 | Re-29 | 145 ppt | 0.132% | A-2 | 55 ppt | 2.20% | PAG-13/ PAG-14 | 800 ppt | D-10/ D-11 | 25 ppb | F-1/F-2 | 150 ppt | (1) | 4.8 |
| Example 30 | Re-30 | 170 ppt | 0.33% | A-13 | 70 ppt | 5.50% | PAG-8 | 10 ppb | D-4 | 50 ppb | F-1/F-2 | 150 ppt | (1) | 4.7 |
| Example 31 | Re-31 | 165 ppt | 0.090% | A-14 | 60 ppt | 1.50% | PAG-7 | 800 ppb | D-2 | 3.0 ppb | F-1/F-2 | 150 ppt | (1) | 4.2 |
| Example 32 | Re-32 | 1.0 ppb | 0.21% | A-23 | 20 ppb | 3.50% | PAG-11 | 1.0 ppb | D-5 | 500 ppt | F-2/F-4 | 800 ppt | (1) | 4.3 |
| Example 33 | Re-33 | 1.1 ppb | 0.21% | A-23 | 25 ppb | 3.50% | PAG-11 | 1.0 ppb | D-2 | 3.0 ppb | F-2/F-4 | 800 ppt | (1) | 4.6 |
| Example 34 | Re-34 | 900 ppt | 0.21% | A-23 | 30 ppb | 3.50% | PAG-4 | 10 ppb | D-5 | 500 ppt | F-2/F-4 | 800 ppt | (1) | 4.5 |
| Example 35 | Re-35 | 950 ppt | 0.56% | A-3 | 35 ppb | 9.30% | PAG-11 | 1.0 ppb | D-5 | 500 ppt | F-2/F-4 | 800 ppt | (1) | 4.9 |
| Example 36 | Re-36 | 750 ppt | 0.138% | A-21 | 20 ppb | 2.30% | PAG-1 | 100 ppt | D-7 | 2.0 ppb | F-2/F-4 | 800 ppt | (1) | 4.2 |
| Example 37 | Re-37 | 820 ppt | 0.27% | A-22 | 10 ppb | 4.50% | PAG-5 | 100 ppb | D-6 | 500 ppt | F-2/F-4 | 800 ppt | (1) | 4.3 |
| Example 38 | Re-38 | 2.2 ppb | 0.126% | A-24 | 5 ppb | 2.10% | PAG-15 | 3 ppb | D-12 | 25 ppb | F-1/ F-2/ F-4 | 2.5 ppb | (1) | 4.2 |
| Example 39 | Re-39 | 2.1 ppb | 0.126% | A-24 | 8 ppb | 2.10% | PAG-15 | 3 ppb | D-2/ D-9 | 500 ppb | F-1/ F-2/ F-4 | 2.5 ppb | (1) | 4.3 |
| Example 40 | Re-40 | 2.7 ppb | 0.126% | A-24 | 7 ppb | 2.10% | PAG-5 | 100 ppb | D-12 | 25 ppb | F-1/ F-2/ F-4 | 2.5 ppb | (1) | 4.2 |
| Example 41 | Re-41 | 2.6 ppb | 0.054% | A-4 | 5 ppb | 0.90% | PAG-15 | 3 ppb | D-12 | 25 ppb | F-1/ F-2/ F-4 | 2.5 ppb | (1) | 4.5 |
| Example 42 | Re-42 | 2.4 ppb | 0.00012% | A-1 | 10 ppb | 0.0020% | PAG-6 | 250 ppb | D-1/ D-9 | 480 ppb | F-1/ F-2/ F-4 | 2.5 ppb | (1) | 4.5 |
| Example 43 | Re-43 | 2.3 ppb | 0.13% | A-2 | 3 ppb | 2.20% | PAG-8 | 10 ppb | D-6 | 800 ppb | F-1/ F-2/ F-4 | 2.5 ppb | (1) | 4.4 |
| Example 44 | Re-44 | 850 ppt | 0.29% | A-25 | 1 ppb | 4.80% | PAG-15 | 3 ppb | D-5/ D-13 | 10 ppb | F-2/F-4 | 800 ppt | (1) | 4.6 |
| Example 45 | Re-45 | 880 ppt | 0.29% | A-25 | 3 ppb | 4.80% | PAG-15 | 3 ppb | D-4 | 200 ppb | F-2/F-4 | 800 ppt | (1) | 4.9 |
| Example 46 | Re-46 | 870 ppt | 0.29% | A-25 | 5 ppb | 4.80% | PAG-6 | 250 ppb | D-5/ D-13 | 10 ppb | F-2/F-4 | 800 ppt | (1) | 5.0 |
| Example 47 | Re-47 | 1.0 ppb | 0.25% | A-5 | 10 ppb | 4.20% | PAG-15 | 3 ppb | D-5/ D-13 | 10 ppb | F-2/F-4 | 800 ppt | (1) | 4.7 |
| Example 48 | Re-48 | 1.1 ppb | 0.56% | A-3 | 2 ppb | 9.30% | PAG-2/ PAG-6 | 200 ppb | D-2/ D-7 | 350 ppb | F-2/F-4 | 800 ppt | (1) | 4.8 |
| Example 49 | Re-49 | 890 ppt | 0.054% | A-4 | 3 ppb | 0.90% | PAG-7 | 800 ppb | D-9 | 700 ppb | F-2/F-4 | 800 ppt | (1) | 4.2 |
| Example 50 | Re-50 | 840 ppt | 0.018% | A-26 | 4 ppb | 0.30% | PAG-16 | 1 ppb | D-8 | 15 ppb | F-2/F-4 | 800 ppt | (1) | 4.7 |
| Example 51 | Re-51 | 860 ppt | 0.018% | A-26 | 5 ppb | 0.30% | PAG-16 | 1 ppb | D-6 | 500 ppt | F-2/F-4 | 800 ppt | (1) | 4.6 |

TABLE 22

| | Photosensitive resin composition | | | Resin (A) | | | Photoacid generator (B) | | Acid diffusion control agent (D) | | Solvent (F) | | | |
|---|---|---|---|---|---|---|---|---|---|---|---|---|---|---|
| | Type | Metal content | Content of ethylenically unsaturated compound [% by mass] | Type | Metal content in solid | Content of ethylenically unsaturated compound in solid [% by mass] | Type | Metal content in solid | Type | Metal content in solid | Type | Metal content in solvent | Pattern forming method | LWR value [nm] |
| Example 52 | Re-52 | 855 ppt | 0.018% | A-26 | 6 ppb | 0.30% | PAG-7 | 800 ppb | D-8 | 15 ppb | F-2/F-4 | 800 ppt | (1) | 4.7 |
| Example 53 | Re-53 | 845 ppt | 0.55% | A-6 | 10 ppb | 9.20% | PAG-16 | 1 ppb | D-8 | 15 ppb | F-2/F-4 | 800 ppt | (1) | 4.8 |
| Example 54 | Re-54 | 830 ppt | 0.25% | A-5 | 7 ppb | 4.20% | PAG-9 | 800 ppt | D-1 | 200 ppt | F-2/F-4 | 800 ppt | (1) | 4.6 |
| Example 55 | Re-55 | 700 ppt | 0.55% | A-6 | 5 ppb | 9.20% | PAG-10 | 2.0 ppb | D-9 | 900 ppb | F-2/F-4 | 800 ppt | (1) | 4.5 |
| Example 56 | Re-56 | 760 ppt | 0.45% | A-27 | 1 ppb | 7.50% | PAG-15 | 3 ppb | D-5/ D-13 | 10 ppb | F-2/F-4 | 800 ppt | (1) | 4.6 |
| Example 57 | Re-57 | 900 ppt | 0.45% | A-27 | 1.2 ppb | 7.50% | PAG-15 | 3 ppb | D-6 | 800 ppb | F-2/F-4 | 800 ppt | (1) | 4.5 |
| Example 58 | Re-58 | 950 ppt | 0.45% | A-27 | 2 ppb | 7.50% | PAG-2/ PAG-8 | 1.0 ppb | D-5/ D-13 | 10 ppb | F-2/F-4 | 800 ppt | (1) | 4.4 |
| Example 59 | Re-59 | 920 ppt | 0.0090% | A-7 | 5 ppb | 0.15% | PAG-15 | 3 ppb | D-5/ D-13 | 10 ppb | F-2/F-4 | 800 ppt | (1) | 4.3 |
| Example 60 | Re-60 | 880 ppt | 0.0090% | A-7 | 6 ppb | 0.15% | PAG-4 | 10 ppb | D-4 | 700 ppb | F-2/F-4 | 800 ppt | (1) | 4.8 |
| Example 61 | Re-61 | 850 ppt | 0.12% | A-8 | 3.2 ppb | 2.00% | PAG-5 | 100 ppb | D-2 | 3.0 ppb | F-2/F-4 | 800 ppt | (1) | 4.7 |
| Example 62 | Re-62 | 120 ppt | 0.11% | A-28 | 50 ppt | 1.90% | PAG-11/ PAG-12 | 2.0 ppb | D-5 | 500 ppt | F-1/F-2 | 110 ppt | (1) | 4.5 |
| Example 63 | Re-63 | 115 ppt | 0.11% | A-28 | 50 ppt | 1.90% | PAG-11/ PAG-12 | 2.0 ppb | D-7 | 2.0 ppb | F-1/F-2 | 110 ppt | (1) | 4.7 |
| Example 64 | Re-64 | 105 ppt | 0.11% | A-28 | 45 ppt | 1.90% | PAG-4/ PAG-9 | 5.0 ppb | D-5 | 500 ppt | F-1/F-2 | 110 ppt | (1) | 4.3 |
| Example 65 | Re-65 | 95 ppt | 0.12% | A-8 | 40 ppt | 2.00% | PAG-11/ PAG-12 | 2.0 ppb | D-5 | 500 ppt | F-1/F-2 | 110 ppt | (1) | 4.5 |
| Example 66 | Re-66 | 130 ppt | 0.58% | A-9 | 65 ppt | 9.70% | PAG-2 | 1.1 ppb | D-9 | 500 ppt | F-1/F-2 | 110 ppt | (1) | 4.6 |
| Example 67 | Re-67 | 135 ppt | 0.15% | A-10 | 35 ppt | 2.50% | PAG-8 | 10 ppb | D-6 | 800 ppb | F-1/F-2 | 110 ppt | (1) | 4.8 |
| Example 68 | Re-68 | 1.2 ppb | 0.00060% | A-29 | 2 ppb | 0.010% | PAG-11/ PAG-17 | 3.0 ppb | D-13 | 700 ppt | F-2/F-4 | 800 ppt | (1) | 4.7 |
| Example 69 | Re-69 | 1.1 ppb | 0.00060% | A-29 | 3 ppb | 0.010% | PAG-11/ PAG-17 | 3.0 ppb | D-1/ D-9 | 480 ppb | F-2/F-4 | 800 ppt | (1) | 4.9 |
| Example 70 | Re-70 | 1.2 ppb | 0.00060% | A-29 | 4 ppb | 0.010% | PAG-2/ PAG-5 | 50 ppb | D-13 | 700 ppt | F-2/F-4 | 800 ppt | (1) | 4.5 |
| Example 71 | Re-71 | 1.0 ppb | 0.58% | A-9 | 5 ppb | 9.70% | PAG-11/ PAG-17 | 3.0 ppb | D-13 | 700 ppt | F-2/F-4 | 800 ppt | (1) | 4.3 |
| Example 72 | Re-72 | 980 ppt | 0.51% | A-11 | 1.2 ppb | 8.50% | PAG-4 | 10 ppb | D-4 | 50 ppb | F-2/F-4 | 800 ppt | (1) | 4.6 |
| Example 73 | Re-73 | 970 ppt | 0.057% | A-12 | 1.1 ppb | 0.95% | PAG-9 | 1.0 ppb | D-9 | 900 ppb | F-2/F-4 | 800 ppt | (1) | 4.5 |
| Example 74 | Re-74 | 850 ppt | 0.18% | A-30 | 700 ppt | 3.00% | PAG-11/ PAG-17 | 3.0 ppb | D-5 | 500 ppt | F-2/F-4 | 750 ppt | (1) | 4.6 |
| Example 75 | Re-75 | 780 ppt | 0.18% | A-30 | 680 ppt | 3.00% | PAG-11/ PAG-17 | 3.0 ppb | D-2 | 700 ppb | F-2/F-4 | 750 ppt | (1) | 4.8 |
| Example 76 | Re-76 | 800 ppt | 0.18% | A-30 | 850 ppt | 3.00% | PAG-1/ PAG-6 | 200 ppb | D-5 | 500 ppt | F-2/F-4 | 750 ppt | (1) | 4.3 |
| Example 77 | Re-77 | 745 ppt | 0.15% | A-10 | 800 ppt | 2.50% | PAG-11/ PAG-17 | 3.0 ppb | D-5 | 500 ppt | F-2/F-4 | 750 ppt | (1) | 4.7 |
| Example 78 | Re-78 | 750 ppt | 0.33% | A-13 | 750 ppt | 5.50% | PAG-4/ PAG-6 | 150 ppb | D-2 | 700 ppb | F-2/F-4 | 750 ppt | (1) | 4.4 |
| Example 79 | Re-79 | 760 ppt | 0.090% | A-14 | 600 ppt | 1.50% | PAG-2 | 1.1 ppb | D-4 | 200 ppb | F-2/F-4 | 750 ppt | (1) | 4.5 |
| Example 80 | Re-80 | 105 ppt | 0.49% | A-31 | 30 ppt | 8.20% | PAG-13/ PAG-14 | 800 ppt | D-11/ D-10/ D-12 | 300 ppt | F-1/F-2 | 110 ppt | (1) | 4.2 |
| Example 81 | Re-81 | 125 ppt | 0.49% | A-31 | 25 ppt | 8.20% | PAG-13/ PAG-14 | 800 ppt | D-1/ D-2/ D-6 | 2 ppb | F-1/F-2 | 110 ppt | (1) | 4.7 |
| Example 82 | Re-82 | 130 ppt | 0.49% | A-31 | 20 ppt | 8.20% | PAG-6/ PAG-7 | 500 ppb | D-11/ D-10/ D-12 | 300 ppt | F-1/F-2 | 110 ppt | (1) | 4.6 |
| Example 83 | Re-83 | 140 ppt | 0.15% | A-10 | 50 ppt | 2.50% | PAG-13/ PAG-14 | 800 ppt | D-11/ D-10/ D-12 | 300 ppt | F-1/F-2 | 110 ppt | (1) | 4.8 |

TABLE 23

| | Photosensitive resin composition | | | Resin (A) | | | Photoacid generator (B) | | Acid diffusion control agent (D) | | Solvent (F) | | | |
|---|---|---|---|---|---|---|---|---|---|---|---|---|---|---|
| | Type | Metal content | Content of ethylenically unsaturated compound [% by mass] | Type | Metal content in solid | Content of ethylenically unsaturated compound in solid [% by mass] | Type | Metal content in solid | Type | Metal content in solid | Type | Metal content in solvent | Pattern forming method | LWR value [nm] |
| Example 84 | Re-84 | 150 ppt | 0.12% | A-8 | 65 ppt | 2.00% | PAG-1 | 100 ppt | D-2/ D-7 | 1.5 ppb | F-1/F-2 | 110 ppt | (1) | 4.7 |
| Example 85 | Re-85 | 145 ppt | 0.55% | A-6 | 70 ppt | 9.20% | PAG-2 | 1.1 ppb | D-4/ D-9 | 750 ppb | F-1/F-2 | 110 ppt | (1) | 4.9 |
| Example 86 | Re-86 | 135 ppt | 0.53% | A-32 | 80 ppt | 8.80% | PAG-18/ PAG-14 | 950 ppt | D-14/ D-15 | 60 ppb | F-1/F-2 | 110 ppt | (1) | 4.6 |
| Example 87 | Re-87 | 125 ppt | 0.53% | A-32 | 75 ppt | 8.80% | PAG-18/ PAG-14 | 950 ppt | D-1/ D-4 | 100 ppb | F-1/F-2 | 110 ppt | (1) | 4.7 |
| Example 88 | Re-88 | 115 ppt | 0.53% | A-32 | 85 ppt | 8.80% | PAG-3/ PAG-4 | 5 ppb | D-14/ D-15 | 60 ppb | F-1/F-2 | 110 ppt | (1) | 4.3 |
| Example 89 | Re-89 | 120 ppt | 0.06% | A-12 | 30 ppt | 0.95% | PAG-18/ PAG-14 | 950 ppt | D-14/ D-15 | 60 ppb | F-1/F-2 | 110 ppt | (1) | 4.3 |
| Example 90 | Re-90 | 130 ppt | 0.33% | A-13 | 25 ppt | 5.50% | PAG-5/ PAG-6 | 180 ppb | D-2 | 500 ppt | F-1/F-2 | 110 ppt | (1) | 4.2 |
| Example 91 | Re-91 | 125 ppt | 0.057% | A-12 | 50 ppt | 0.95% | PAG-7 | 800 ppb | D-7 | 2.0 ppb | F-1/F-2 | 110 ppt | (1) | 4.6 |
| Example 92 | Re-92 | 350 ppt | 0.19% | A-33 | 250 ppt | 3.20% | PAG-16/ PAG-19 | 1.2 ppb | D-3 | 10 ppb | F-2/F-8 | 300 ppt | (1) | 4.8 |
| Example 93 | Re-93 | 330 ppt | 0.19% | A-33 | 300 ppt | 3.20% | PAG-16/ PAG-19 | 1.2 ppb | D-6 | 800 ppb | F-2/F-8 | 300 ppt | (1) | 4.7 |
| Example 94 | Re-94 | 325 ppt | 0.19% | A-33 | 450 ppt | 3.20% | PAG-8 | 10 ppb | D-3 | 10 ppb | F-2/F-8 | 300 ppt | (1) | 4.8 |
| Example 95 | Re-95 | 310 ppt | 0.090% | A-14 | 200 ppt | 1.50% | PAG-16/ PAG-19 | 1.2 ppb | D-3 | 10 ppb | F-2/F-8 | 300 ppt | (1) | 4.4 |
| Example 96 | Re-96 | 250 ppt | 0.33% | A-13 | 150 ppt | 5.50% | PAG-9/ PAG-10 | 1.5 ppb | D-7 | 700 ppb | F-2/F-8 | 300 ppt | (1) | 4.5 |
| Example 97 | Re-97 | 280 ppt | 0.51% | A-11 | 170 ppt | 8.50% | PAG-1/ PAG-3 | 80 ppt | D-9 | 900 ppb | F-2/F-8 | 300 ppt | (1) | 4.7 |
| Example 98 | Re-98 | 275 ppt | 0.018% | A-34 | 180 ppt | 0.30% | PAG-11/ PAG-17 | 1.3 ppb | D-3 | 10 ppb | F-2/F-8 | 300 ppt | (1) | 4.3 |
| Example 99 | Re-99 | 325 ppt | 0.018% | A-34 | 190 ppt | 0.30% | PAG-11/ PAG-17 | 1.3 ppb | D-6 | 50 ppb | F-2/F-8 | 300 ppt | (1) | 4.6 |
| Example 100 | Re-100 | 315 ppt | 0.018% | A-34 | 200 ppt | 0.30% | PAG-2/ PAG-4 | 5 ppb | D-3 | 10 ppb | F-2/F-8 | 300 ppt | (1) | 4.6 |
| Example 101 | Re-101 | 310 ppt | 0.132% | A-2 | 250 ppt | 2.20% | PAG-11/ PAG-17 | 1.3 ppb | D-3 | 10 ppb | F-2/F-8 | 300 ppt | (1) | 4.7 |
| Example 102 | Re-102 | 320 ppt | 0.00012% | A-1 | 220 ppt | 0.0020% | PAG-6 | 250 ppb | D-4 | 200 ppb | F-2/F-8 | 300 ppt | (1) | 4.8 |
| Example 103 | Re-103 | 360 ppt | 0.56% | A-3 | 250 ppt | 9.30% | PAG-8 | 10 ppb | D-1 | 500 ppt | F-2/F-8 | 300 ppt | (1) | 4.5 |
| Example 104 | Re-104 | 105 ppt | 0.17% | A-35 | 100 ppt | 2.80% | PAG-13/ PAG-14 | 800 ppt | D-3/ D-13 | 5 ppb | F-1/F-2 | 110 ppt | (1) | 4.9 |
| Example 105 | Re-105 | 120 ppt | 0.17% | A-35 | 20 ppt | 2.80% | PAG-13/ PAG-14 | 800 ppt | D-6 | 800 ppb | F-1/F-2 | 110 ppt | (1) | 4.7 |
| Example 106 | Re-106 | 180 ppt | 0.17% | A-35 | 100 ppt | 2.80% | PAG-3/ PAG-7 | 400 ppb | D-3/ D-13 | 5 ppb | F-1/F-2 | 110 ppt | (1) | 4.5 |
| Example 107 | Re-107 | 130 ppt | 0.05% | A-4 | 80 ppt | 0.90% | PAG-13/ PAG-14 | 800 ppt | D-3/ D-13 | 5 ppb | F-1/F-2 | 110 ppt | (1) | 4.7 |
| Example 108 | Re-108 | 125 ppt | 0.55% | A-6 | 85 ppt | 9.20% | PAG-8 | 10 ppb | D-7 | 2.0 ppb | F-1/F-2 | 110 ppt | (1) | 4.4 |
| Example 109 | Re-109 | 140 ppt | 0.12% | A-8 | 90 ppt | 2.00% | PAG-10 | 1.2 ppb | D-9 | 900 ppb | F-1/F-2 | 110 ppt | (1) | 4.5 |
| Example 110 | Re-110 | 850 ppt | 0.35% | A-36 | 600 ppt | 5.80% | PAG-19/ PAG-16 | 3 ppb | D-16/ D-17 | 15 ppb | F-2/F-4 | 800 ppt | (2) | 4.6 |
| Example 111 | Re-111 | 870 ppt | 0.35% | A-36 | 700 ppt | 5.80% | PAG-19/ PAG-16 | 3 ppb | D-2 | 700 ppb | F-2/F-4 | 800 ppt | (2) | 4.4 |
| Example 112 | Re-112 | 890 ppt | 0.35% | A-36 | 500 ppt | 5.80% | PAG-4/ PAG-6 | 170 ppb | D-16/ D-17 | 15 ppb | F-2/F-4 | 800 ppt | (2) | 4.6 |
| Example 113 | Re-113 | 920 ppt | 0.55% | A-6 | 150 ppt | 9.20% | PAG-19/ PAG-16 | 3 ppb | D-16/ D-17 | 15 ppb | F-2/F-4 | 800 ppt | (2) | 4.3 |
| Example 114 | Re-114 | 930 ppt | 0.13% | A-2 | 200 ppt | 2.20% | PAG-7 | 800 ppb | D-7 | 2.0 ppb | F-2/F-4 | 800 ppt | (2) | 4.6 |
| Example 115 | Re-115 | 1.1 ppb | 0.0090% | A-7 | 250 ppt | 0.15% | PAG-3 | 50 ppt | D-6 | 800 ppb | F-2/F-4 | 800 ppt | (2) | 4.5 |

TABLE 24

| | Photosensitive resin composition Type | Photosensitive resin composition Metal content | Photosensitive resin composition Content of ethylenically unsaturated compound [% by mass] | Resin (A) Type | Resin (A) Metal content in solid | Resin (A) Content of ethylenically unsaturated compound in solid [% by mass] | Photoacid generator (B) Type | Photoacid generator (B) Metal content in solid | Acid diffusion control agent (D) Type | Acid diffusion control agent (D) Metal content in solid | Solvent (F) Type | Solvent (F) Metal content in solvent | Pattern forming method | LWR value [nm] |
|---|---|---|---|---|---|---|---|---|---|---|---|---|---|---|
| Example 116 | Re-116 | 1.2 ppb | 0.37% | A-37 | 1.0 ppb | 6.10% | PAG-20/ PAG-16 | 1.1 ppb | D-16/D-18 | 20 ppb | F-2/F-4 | 800 ppt | (2) | 4.3 |
| Example 117 | Re-117 | 1.3 ppb | 0.37% | A-37 | 1.1 ppb | 6.10% | PAG-20/ PAG-16 | 1.1 ppb | D-4/D-6 | 400 ppb | F-2/F-4 | 800 ppt | (2) | 4.2 |
| Example 118 | Re-118 | 890 ppt | 0.37% | A-37 | 800 ppt | 6.10% | PAG-1/ PAG-8 | 5 ppb | D-16/D-18 | 20 ppb | F-2/F-4 | 800 ppt | (2) | 4.7 |
| Example 119 | Re-119 | 950 ppt | 0.12% | A-8 | 850 ppt | 2.00% | PAG-20/ PAG-16 | 1.1 ppb | D-16/D-18 | 20 ppb | F-2/F-4 | 800 ppt | (2) | 4.5 |
| Example 120 | Re-120 | 970 ppt | 0.58% | A-9 | 700 ppt | 9.70% | PAG-3 | 50 ppt | D-7/D-9 | 300 ppb | F-2/F-4 | 800 ppt | (2) | 4.6 |
| Example 121 | Re-121 | 980 ppt | 0.15% | A-10 | 750 ppt | 2.50% | PAG-5 | 100 ppb | D-4/D-7 | 120 ppb | F-2/F-4 | 800 ppt | (2) | 4.7 |
| Example 122 | Re-122 | 105 ppt | 0.41% | A-38 | 100 ppt | 6.80% | PAG-14 | 10 ppb | D-14 | 30 ppb | F-1/F-2 | 110 ppt | (2) | 4.8 |
| Example 123 | Re-123 | 110 ppt | 0.41% | A-38 | 105 ppt | 6.80% | PAG-14 | 10 ppb | D-2 | 3.0 ppb | F-1/F-2 | 110 ppt | (2) | 4.7 |
| Example 124 | Re-124 | 130 ppt | 0.41% | A-38 | 30 ppt | 6.80% | PAG-3 | 50 ppt | D-14 | 30 ppb | F-1/F-2 | 110 ppt | (2) | 4.5 |
| Example 125 | Re-125 | 180 ppt | 0.58% | A-9 | 80 ppt | 9.70% | PAG-14 | 10 ppb | D-14 | 30 ppb | F-1/F-2 | 110 ppt | (2) | 4.7 |
| Example 126 | Re-126 | 130 ppt | 0.054% | A-4 | 60 ppt | 0.90% | PAG-5 | 100 ppb | D-9 | 50 ppb | F-1/F-2 | 110 ppt | (2) | 4.7 |
| Example 127 | Re-127 | 170 ppt | 0.55% | A-6 | 80 ppt | 9.20% | PAG-7 | 800 ppb | D-4 | 200 ppb | F-1/F-2 | 110 ppt | (2) | 4.8 |
| Example 128 | Re-128 | 325 ppt | 0.46% | A-39 | 300 ppt | 7.70% | PAG-16/ PAG-21 | 3 ppb | D-3 | 10 ppb | F-2/F-8 | 300 ppt | (2) | 4.5 |
| Example 129 | Re-129 | 350 ppt | 0.46% | A-39 | 250 ppt | 7.70% | PAG-16/ PAG-21 | 3 ppb | D-4 | 200 ppb | F-2/F-8 | 300 ppt | (2) | 4.6 |
| Example 130 | Re-130 | 450 ppt | 0.46% | A-39 | 200 ppt | 7.70% | PAG-4 | 10 ppb | D-3 | 10 ppb | F-2/F-8 | 300 ppt | (2) | 4.7 |
| Example 131 | Re-131 | 400 ppt | 0.51% | A-11 | 100 ppt | 8.50% | PAG-16/ PAG-21 | 3 ppb | D-3 | 10 ppb | F-2/F-8 | 300 ppt | (2) | 4.9 |
| Example 132 | Re-132 | 360 ppt | 0.25% | A-5 | 250 ppt | 4.20% | PAG-6/ PAG-8 | 100 ppb | D-7 | 500 ppt | F-2/F-8 | 300 ppt | (2) | 4.6 |
| Example 133 | Re-133 | 340 ppt | 0.01% | A-7 | 260 ppt | 0.15% | PAG-10 | 1.2 ppb | D-6 | 800 ppb | F-2/F-8 | 300 ppt | (2) | 4.3 |
| Example 134 | Re-134 | 320 ppt | 0.23% | A-40 | 270 ppt | 3.80% | PAG-16/ PAG-22 | 20 ppb | D-3/D-13 | 5 ppb | F-2/F-8 | 300 ppt | (2) | 4.5 |
| Example 135 | Re-135 | 330 ppt | 0.23% | A-40 | 250 ppt | 3.80% | PAG-16/ PAG-22 | 20 ppb | D-2/D-7 | 300 ppb | F-2/F-8 | 300 ppt | (2) | 4.5 |
| Example 136 | Re-136 | 350 ppt | 0.23% | A-40 | 250 ppt | 3.80% | PAG-3/ PAG-5 | 50 ppb | D-3/D-13 | 5 ppb | F-2/F-8 | 300 ppt | (2) | 4.7 |
| Example 137 | Re-137 | 355 ppt | 0.33% | A-13 | 255 ppt | 5.50% | PAG-16/ PAG-22 | 20 ppb | D-3/D-13 | 5 ppb | F-2/F-8 | 300 ppt | (2) | 4.3 |
| Example 138 | Re-138 | 310 ppt | 0.090% | A-14 | 260 ppt | 1.50% | PAG-6 | 250 ppb | D-9 | 900 ppb | F-2/F-8 | 300 ppt | (2) | 4.6 |
| Example 139 | Re-139 | 315 ppt | 0.13% | A-2 | 280 ppt | 2.20% | PAG-7 | 800 ppb | D-1 | 200 ppt | F-2/F-8 | 300 ppt | (2) | 4.5 |
| Example 140 | Re-140 | 120 ppt | 0.31% | A-41 | 100 ppt | 5.20% | PAG-14 | 500 ppt | D-14/D-12 | 50 ppb | F-1/F-2 | 110 ppt | (2) | 4.4 |
| Example 141 | Re-141 | 130 ppt | 0.31% | A-41 | 100 ppt | 5.20% | PAG-14 | 500 ppt | D-2/D-7 | 2.2 ppb | F-1/F-2 | 110 ppt | (2) | 4.2 |
| Example 142 | Re-142 | 140 ppt | 0.31% | A-41 | 120 ppt | 5.20% | PAG-1 | 100 ppt | D-14/D-12 | 50 ppb | F-1/F-2 | 110 ppt | (2) | 4.4 |
| Example 143 | Re-143 | 150 ppt | 0.00012% | A-1 | 25 ppt | 0.0020% | PAG-14 | 500 ppt | D-14/D-12 | 50 ppb | F-1/F-2 | 110 ppt | (2) | 4.5 |

TABLE 25

| | Photosensitive resin composition | | | Resin (A) | | | Photoacid generator (B) | | Acid diffusion control agent (D) | | Solvent (F) | | | |
|---|---|---|---|---|---|---|---|---|---|---|---|---|---|---|
| | Type | Metal content | Content of ethylenically unsaturated compound [% by mass] | Type | Metal content in solid | Content of ethylenically unsaturated compound in solid [% by mass] | Type | Metal content in solid | Type | Metal content in solid | Type | Metal content in solvent | Pattern forming method | LWR value [nm] |
| Example 144 | Re-144 | 125 ppt | 0.132% | A-2 | 30 ppt | 2.20% | PAG-2/ PAG-3 | 10 ppb | D-2/D-9 | 400 ppb | F-1/F-2 | 110 ppt | (2) | 4.7 |
| Example 145 | Re-145 | 135 ppt | 0.56% | A-3 | 45 ppt | 9.30% | PAG-7/ PAG-8 | 4.8 ppb | D-2/D-6 | 2 ppb | F-1/F-2 | 110 ppt | (2) | 4.8 |
| Example 146 | Re-146 | 120 ppt | 0.39% | A-42 | 20 ppt | 6.50% | PAG-13 | 1.0 ppb | D-14 | 30 ppb | F-1/F-2 | 110 ppt | (2) | 4.6 |
| Example 147 | Re-147 | 200 ppt | 0.39% | A-42 | 20 ppt | 6.50% | PAG-13 | 1.0 ppb | D-4 | 200 ppb | F-1/F-2 | 110 ppt | (2) | 4.9 |
| Example 148 | Re-148 | 180 ppt | 0.39% | A-42 | 25 ppt | 6.50% | PAG-3 | 50 ppt | D-14 | 30 ppb | F-1/F-2 | 110 ppt | (2) | 4.8 |
| Example 149 | Re-149 | 160 ppt | 0.56% | A-3 | 150 ppt | 9.30% | PAG-13 | 1.0 ppb | D-14 | 30 ppb | F-1/F-2 | 110 ppt | (2) | 4.9 |
| Example 150 | Re-150 | 150 ppt | 0.51% | A-11 | 100 ppt | 8.50% | PAG-1/ PAG-8 | 5 ppb | D-6 | 500 ppt | F-1/F-2 | 110 ppt | (2) | 4.7 |
| Example 151 | Re-151 | 140 ppt | 0.090% | A-14 | 100 ppt | 1.50% | PAG-2/ PAG-7 | 900 ppt | D-7 | 700 ppb | F-1/F-2 | 110 ppt | (2) | 4.5 |
| Example 152 | Re-152 | 1.2 ppb | 0.43% | A-43 | 800 ppt | 7.20% | PAG-23 | 1.1 ppb | D-3 | 10 ppb | F-2/F-4 | 800 ppt | (2) | 4.6 |
| Example 153 | Re-153 | 1.3 ppb | 0.43% | A-43 | 700 ppt | 7.20% | PAG-23 | 1.1 ppb | D-8 | 700 ppb | F-2/F-4 | 800 ppt | (2) | 4.5 |
| Example 154 | Re-154 | 1.5 ppb | 0.43% | A-43 | 1.0 ppb | 7.20% | PAG-2/ PAG-5 | 50 ppb | D-3 | 10 ppb | F-2/F-4 | 800 ppt | (2) | 4.5 |
| Example 155 | Re-155 | 1.2 ppb | 0.25% | A-5 | 1.0 ppb | 4.20% | PAG-23 | 1.1 ppb | D-3 | 10 ppb | F-2/F-4 | 800 ppt | (2) | 4.7 |
| Example 156 | Re-156 | 890 ppt | 0.55% | A-6 | 850 ppt | 9.20% | PAG-3 | 50 ppt | D-6 | 800 ppb | F-2/F-4 | 800 ppt | (2) | 4.5 |
| Example 157 | Re-157 | 880 ppt | 0.58% | A-9 | 700 ppt | 9.70% | PAG-6 | 250 ppb | D-9 | 500 ppt | F-2/F-4 | 800 ppt | (2) | 4.7 |

Furthermore, the metal atoms detected in the photosensitive resin compositions of Examples 20 to 157 were Li, Na, Mg, Al, K, Ca, Cr, Mn, Fe, Co, Ni, Cu, Zn, Mo, Ag, Cd, Sn, W, Au, and Pb.

As shown in Tables 21 to 25, it can be seen that even with use of the photosensitive resin composition after the lapse of time since the preparation thereof, with regard to the photosensitive films formed in Examples above, the exposed film is subjected to alkali development or organic solvent development to form a pattern with good linearity.

The entire disclosure of Japanese Patent Application No. 2018-058907 filed on Mar. 26, 2018 is incorporated herein by reference.

All publications, patent applications, and technical standards described in the present specification are incorporated herein by reference to the same extent as if each publication, patent application, or technical standard was specifically and individually indicated to be incorporated by reference.

What is claimed is:

1. A method for producing a photosensitive resin composition, the composition comprising:

a resin (A) having a polarity that increases by an action of an acid;

an ethylenically unsaturated compound that is an unreacted monomer from production of the resin (A);

a metal atom;

a photoacid generator; and an organic solvent, wherein a total content of the metal atoms is from 1 part per trillion (ppt) to 30 parts per billion (ppb) with respect to a total mass of the photosensitive resin composition, and a content of the ethylenically unsaturated compound is from 0.0001% by mass to 1% by mass with respect to the total mass of the photosensitive resin composition, the method comprising:

mixing the resin (A) and a first part of the organic solvent, followed by a first filtration;

mixing the photoacid generator and a second part of the organic solvent, followed by a second filtration; and mixing the filtered mixture of the resin (A) and the first part of the organic solvent, the filtered mixture of the photoacid generator and the second part of the organic solvent, and a further part of the organic solvent, followed by a third filtration, wherein each of the first filtration and the second filtration are performed using only filters having a pore diameter of from 10 to 50 nm, and wherein the third filtration is performed multiple times using only filters having a pore diameter of from 5 to 50 nm.

2. The method for producing photosensitive resin composition according to claim 1, wherein the total content of the metal atoms is from 1 part per trillion (ppt) to 10 parts per billion (ppb) with respect to the total mass of the photosensitive resin composition.

3. The method for producing photosensitive resin composition according to claim 1, wherein the total content of the metal atoms is from 1 part per trillion (ppt) to 1,000 parts per trillion (ppt) with respect to the total mass of the photosensitive resin composition.

4. The method for producing photosensitive resin composition according to claim 1, wherein the content of the ethylenically unsaturated compound is from 0.0001% by mass to 0.5% by mass with respect to the total mass of the photosensitive resin composition.

5. The method for producing photosensitive resin composition according to claim 1, wherein the content of the ethylenically unsaturated compound is from 0.0001% by mass to 0.1% by mass with respect to the total mass of the photosensitive resin composition.

6. The method of producing photosensitive resin composition according to claim 1, wherein the photosensitive resin composition further comprises an acid diffusion control agent.

7. The method for producing the photosensitive resin composition according to claim 1, the method comprising mixing the photosensitive resin composition containing the resin (A), the ethylenically unsaturated compound, and the metal atom with the photoacid generator and optionally an acid diffusion control agent, wherein a total content of the metal atoms of the resin is from 1 part per trillion (ppt) to 30 parts per billion (ppb) with respect to a total mass of the resin, and a content of the ethylenically unsaturated compound is from 0.001% by mass to 10% by mass with respect to the total mass of the resin.

8. The method for producing the photosensitive resin composition according to claim 7, wherein the mixing is mixing at least the resin and the organic solvent having the total content of the metal atoms from 1 part per trillion (ppt) to 30 parts per billion (ppb).

9. The method for producing the photosensitive resin composition according to claim 7, wherein the mixing is mixing at least the resin and the photoacid generator having the total content of the metal atoms from 1 part per trillion (ppt) to 1,000 parts per billion (ppb).

10. The method for producing the photosensitive resin composition according to claim 7, wherein the mixing is mixing at least the resin and the acid diffusion control agent having the total content of the metal atoms from 1 part per trillion (ppt) to 1,000 parts per billion (ppb).

11. The method for producing a photosensitive resin composition according to claim 1, wherein the third filtration of the mixture of the filtered mixture of the resin (A) and the first part of the organic solvent, the filtered mixture of the photoacid generator and the second part of the organic solvent, and the further part of the organic solvent, comprises multiple filtrations using a filter having a pore diameter of 5 to 10 nm.

12. A pattern forming method comprising:

producing the photosensitive resin composition by the method according to claim 1;

solidifying the photosensitive resin composition to form a resist film;

exposing the resist film; and developing the exposed resist film.

13. A method for manufacturing an electronic device, the method comprising the pattern forming method according to claim 12.

* * * * *